United States Patent

Makita et al.

[11] Patent Number: 5,821,562
[45] Date of Patent: Oct. 13, 1998

[54] SEMICONDUCTOR DEVICE FORMED WITHIN ASYMETRICALLY-SHAPED SEED CRYSTAL REGION

[75] Inventors: Naoki Makita, Nara; Takashi Funai, Tenri; Yoshitaka Yamamoto, Yamatokoriyama; Yasuhiro Mitani, Habikino; Katsumi Nomura, Tenri; Tadayoshi Miyamoto, Tenri; Takamasa Kosai, Tenri, all of Japan

[73] Assignee: Sharp Kabushiki Kaisha, Osaka, Japan

[21] Appl. No.: 452,693

[22] Filed: May 30, 1995

Related U.S. Application Data

[62] Division of Ser. No. 357,648, Dec. 16, 1994, Pat. No. 5,696,003.

[30] Foreign Application Priority Data

| Dec. 20, 1993 | [JP] | Japan | 5-319904 |
| Mar. 31, 1994 | [JP] | Japan | 6-63230 |
| Apr. 27, 1994 | [JP] | Japan | 6-90356 |
| Jun. 21, 1994 | [JP] | Japan | 6-139151 |

[51] Int. Cl.$^6$ .......... H01L 29/786; H01L 29/04; H01L 29/06; H01L 31/036
[52] U.S. Cl. .......... 257/64; 257/66; 257/49; 257/72; 257/75
[58] Field of Search .......... 257/64, 65, 66, 257/49, 70, 71, 72, 74, 75

[56] References Cited

U.S. PATENT DOCUMENTS

| 3,783,049 | 1/1974 | Sandera | 437/158 |
| 4,068,020 | 1/1978 | Reuschel | 437/88 |
| 4,309,224 | 1/1982 | Shibata | 148/1.5 |
| 5,147,826 | 9/1992 | Liu et al. | 437/233 |
| 5,275,851 | 1/1994 | Fonash et al. | 437/578 |
| 5,278,093 | 1/1994 | Yonehara | 437/109 |
| 5,289,030 | 2/1994 | Yamazaki et al. | 257/410 |
| 5,403,772 | 4/1995 | Zhang et al. | 437/101 |
| 5,481,121 | 1/1996 | Zhang et al. | 257/64 |
| 5,619,044 | 4/1997 | Makita et al. | 257/64 |

FOREIGN PATENT DOCUMENTS

| 62-122172 | 6/1987 | Japan . |
| 1-187814 | 7/1989 | Japan . |
| 2-140915 | 5/1990 | Japan . |
| 3-290924 | 12/1991 | Japan . |
| 4-165613 | 6/1992 | Japan . |
| 5-55142 | 3/1993 | Japan . |
| 5-136048 | 6/1993 | Japan . |

OTHER PUBLICATIONS

Choi et al, "The Effects of Grain Boundary on Excimer–Laser–Crystallized Poly–Si TFT Characteristics", Extended Abstract of Applied Physics Society, vol. 2, 1993.

Appl. Phys. Lett., 58(11), 18 Mar. 1991, pp. 1196–1198, J. Stoemenos et al., "Crystallization of amorphous silicon by reconstructive transformation utilizing gold".

(List continued on next page.)

Primary Examiner—Carl W. Whitehead
Assistant Examiner—Alice W. Tang
Attorney, Agent, or Firm—Nixon & Vanderhye, P.C.

[57] ABSTRACT

Into an amorphous silicon film, catalyst elements for accelerating the crystallization are introduced. After patterning the amorphous silicon films in which the catalyst elements have been introduced into an island pattern, a heat treatment for the crystallization is conducted. Thus, the introduced catalyst elements efficiently diffuse only inside the island-patterned amorphous silicon films. As a result, a high-quality crystalline silicon film, having the crystal growth direction aligned in one direction and having no grain boundaries, is obtained. Using the thus formed crystalline silicon film, semiconductor devices having a high performance and stable characteristics are fabricated efficiently over the entire substrate, irrespective of the size of the devices.

59 Claims, 34 Drawing Sheets

OTHER PUBLICATIONS

*App. Phys. Lett.,* 50(87), pp. 507–509, J.J.P. Bruines et al., "Between explosive crystallization and amorphous regrowth: Inhomogeneous solidification upon pulsed–laser annealing of amorphous silicon".

*Solid State Communications,* vol. 85, No. 11, pp. 921–924, 1993, T. Hempel et al., "Needle–Like Crystallization of Ni Doped Amorphous Silicon Thin Fims".

*Appl. Phys. Lett.,* 60, 2(1992), pp. 225–227, C. Hayzelden et al., "In situ transmission electron microscopy studies of silicide–mediated crystallization of amorphous silicon".

*J. Appl. Phys.,* 73(12), 15 Jun. 1993, pp. 8279–8289, C. Hayzelden et al., "Silicide formation and silicide–mediated crystallization of nickel–implanted amorphous silicon thin films".

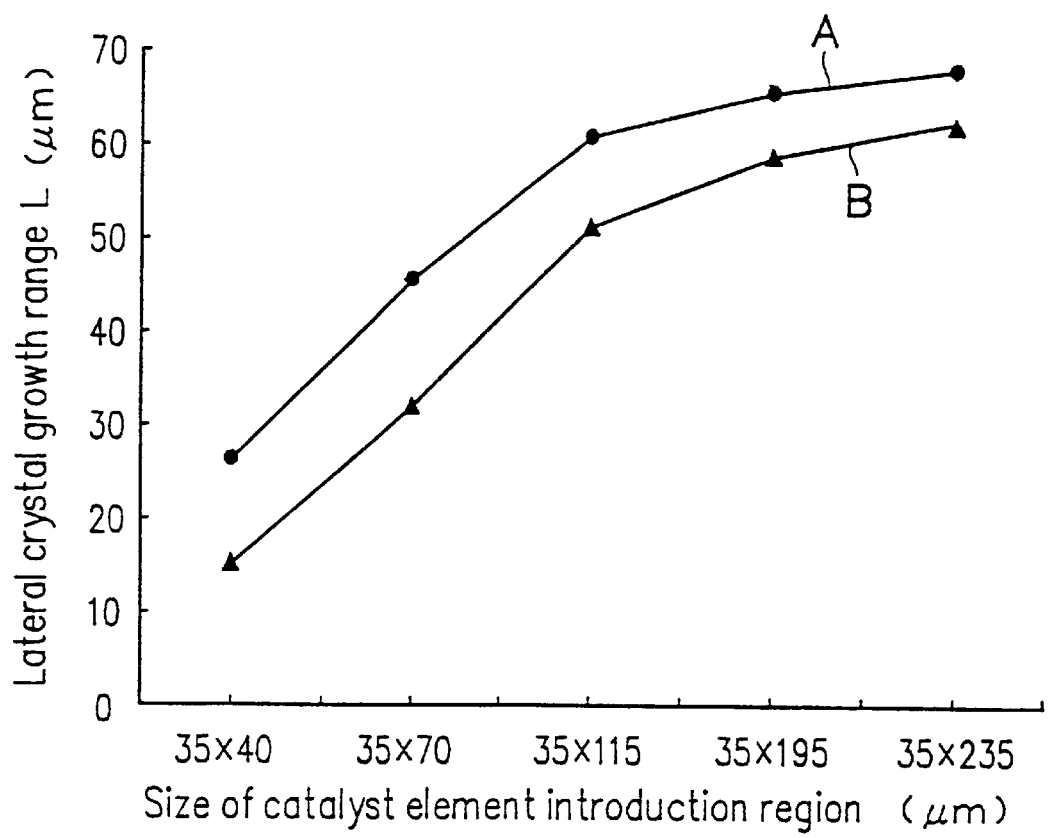

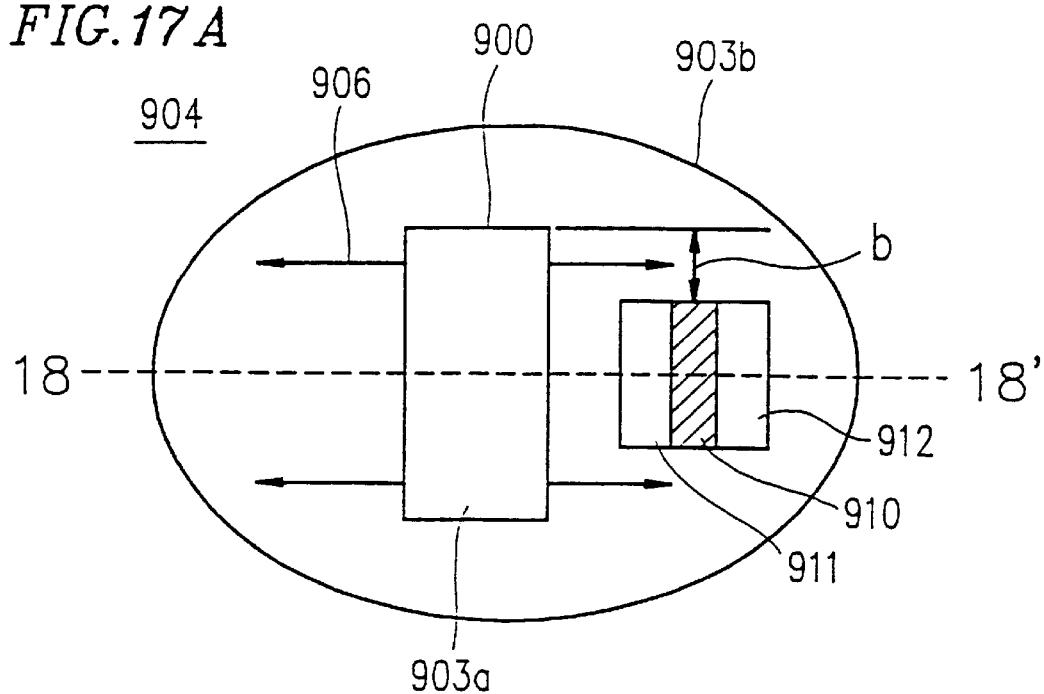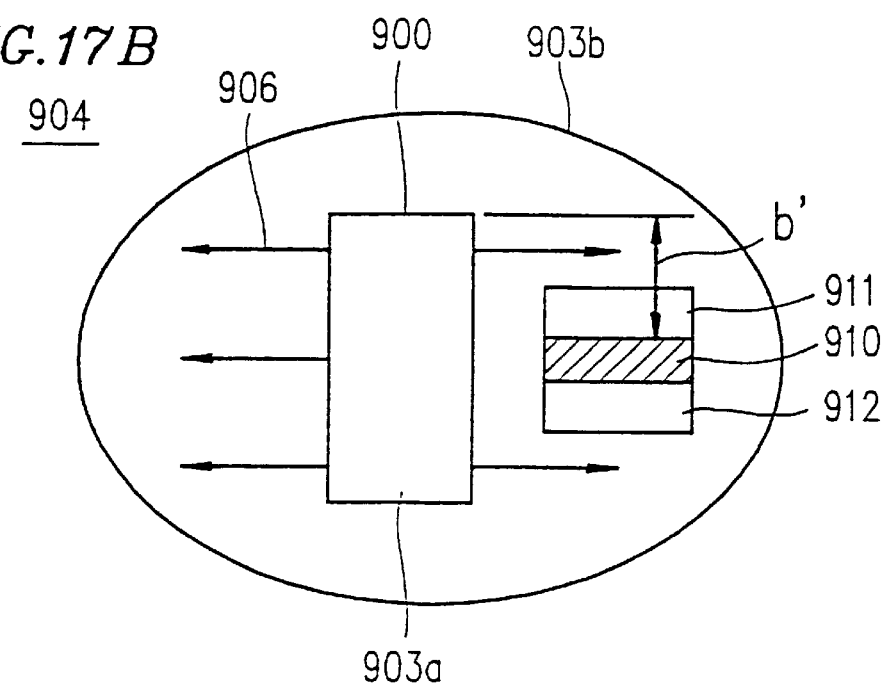

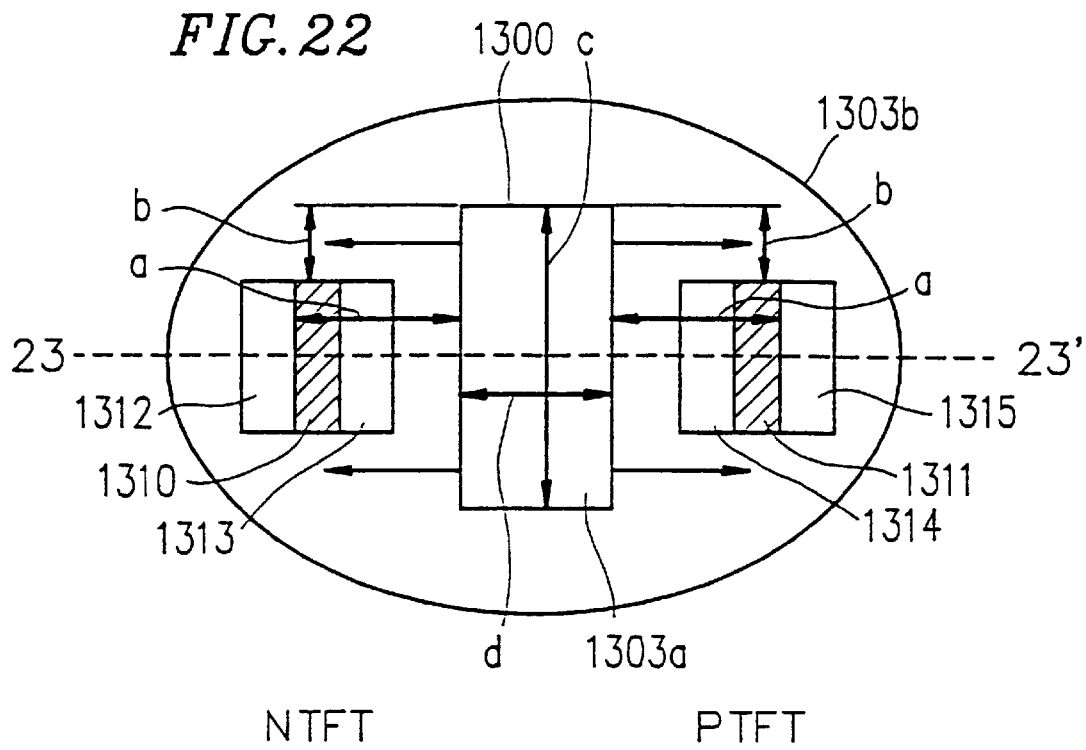

SEMICONDUCTOR DEVICE FORMED WITHIN ASYMETRICALLY-SHAPED SEED CRYSTAL REGION

This is a divisional of application Ser. No. 08/357,648, filed Dec. 16, 1994, now U.S. Pat. No. 5,696,003.

BACKGROUND OF THE INVENTION

1. Field of the Invention

The present invention relates to a method for fabricating a semiconductor device using crystalline silicon films, and in particular, to a semiconductor device having thin-film transistors (TFTs) formed on a glass or other insulating substrate, which may be used for an active-matrix liquid-crystal display device, an image sensor, or the like, and to a method for fabricating such a semiconductor device. More particularly, the invention relates to a semiconductor device having TFTs whose active regions are formed from crystalline silicon films crystallized from amorphous silicon films, and to a method for fabricating such a semiconductor device.

2. Description of the Related Art

Image sensors and active-matrix liquid-crystal display devices using TFTs for driving their pixels are typical semiconductor apparatuses having TFTs formed on a glass or other insulating substrate. Generally, the TFTs used in these apparatuses are formed from thin-film silicon semiconductors.

Such thin-film silicon semiconductors are roughly classified into two types: amorphous silicon semiconductors and crystalline silicon semiconductors.

Of these two types, the amorphous silicon semiconductor is preferred and enjoys general uses because it has a low processing temperature and is easily manufactured using a vapor deposition method, thus lending itself to mass production. Compared to the crystalline silicon semiconductor, however, the amorphous silicon semiconductor is inferior in properties such as electrical conductivity. It is therefore strongly desired to establish an efficient fabrication method for TFTs formed from the crystalline silicon semiconductors to achieve faster response characteristics of the semiconductor devices fabricated from them.

The crystalline silicon semiconductors currently known include polycrystalline silicon, microcrystalline silicon, amorphous silicon containing crystalline components, semi-amorphous silicon having an intermediate state between crystalline and amorphous forms, etc. The following methods are known for the production of these crystalline silicon semiconductors.

(1) A method in which a crystalline film is directly formed in a film deposition step.

(2) A method in which an amorphous semiconductor film is first formed, followed by laser radiation to crystallize the amorphous film by the laser's optical energy.

(3) A method in which an amorphous semiconductor film is first formed, followed by application of heat energy to crystallize the amorphous film.

With the method (1), however, since the crystallization proceeds simultaneously with the formation of the film, a thick silicon film must be formed to obtain a crystalline silicon film with a large grain size. Consequently, it is technically difficult to form a film having good semiconductor characteristics uniformly over the entire surface of the substrate. Furthermore, since the film needs to be deposited at high temperatures of 600° C. or more, this introduces disadvantages in productivity and cost in that inexpensive glass substrates cannot be used since they do not have sufficient heat resistance.

On the other hand, the method (2) utilizes the crystallization phenomenon in the process of melting and solidification, and allows the formation of a high-quality silicon film with a small grain size and yet having properly treated grain boundaries. However, with the lasers commonly used today, such as the excimer lasers for example, the processing throughput is low because the effective laser beam radiation area is small. A further disadvantage is that the stability of lasers is not sufficient to uniformly process over the entire surface of a large substrate. Thus, the general feeling is that the laser using method (2) is a next-generation technology.

The method (3), which crystallizes silicon in solid phase by using heat energy, has an advantage over the methods (1) and (2) in that a thin-film crystalline silicon film can be formed uniformly over a large substrate. Examples of this method are disclosed in Japanese Laid-Open Patent Publication Nos. 62-122172, 3-290924, and 4-165613. According to these example, a thin film of a silicon semiconductor formed on a substrate is first patterned corresponding to device regions where TFT's active regions are to be formed, and after that, the thin film is crystallized. More specifically, in Japanese Laid-Open Patent Publication Nos. 62-122172 and 4-165613, the thin film is amorphized everywhere except a portion of the device regions on the substrate. After that, heat treatment for crystallization is performed in which the amorphized region is crystallized in a single direction by using the unamorphized portion of the device regions as the nucleus. On the other hand, according to Japanese Laid-Open Patent Publication No. 3-290924, the device regions on the substrate are formed into island patterns. At this time, the nucleus density in the regions of the amorphous silicon film that are to be the device regions is controlled to optimize a relationship between a nucleus density and a crystal growth range relative to a size of the island pattern.

However, any of these methods involving solid-phase crystallization of silicon by heat energy requires heat treatment at high temperatures of 600° C. or more for several tens of hours to accomplish crystallization. Therefore, to allow the use of inexpensive glass substrates and to increase the processing throughput, contradicting requirements need to be satisfied simultaneously, i.e, to lower the processing temperature and to accomplish crystallization in a short period of time.

Furthermore, since all of these methods utilizes the solid-phase crystallization phenomenon, crystal grains spread parallel to the substrate surface, and crystals having a grain size of a few micrometers may be formed. However, during this crystal growth process, grain boundaries are formed while the growing crystal grains are colliding with one another. Consequently, the grain boundaries act as carrier traps and, as a result, a carrier mobility in the resultant TFTs decreases.

This disadvantage can be solved in any of the methods disclosed in the above publications in the following manner: first patterning the amorphous silicon film on the substrate so as to correspond to the device regions and then crystallizing the film. According to the above, it is possible to suppress the formation of the grain boundaries in the device regions and to increase the crystal grain size. For crystallization, however, high-temperature and long-hour heat treatment is still required.

Other methods for forming a crystalline silicon film by heat treatment of an amorphous silicon film are disclosed in Japanese Laid-Open Patent Publication Nos. 5-55142 and 5-136048. According to these methods, foreign substances that will act as nuclei for crystal growth is first introduced into the amorphous silicon film and then heat treatment is performed, producing the crystalline silicon film having large-size crystal grains with using the introduced substances as the nuclei.

More specifically, in the method disclosed in Japanese Laid-Open Patent Publication No. 5-55142, impurity ions such as silicon ($Si^+$) are introduced into the amorphous silicon film by ion implantation and, by a subsequent heat treatment, a polycrystalline silicon film having crystal grains having a size of about a few micrometers is formed. In the method disclosed in Japanese Laid-Open Patent Publication No. 5-136048, silicon grains of sizes from 10 to 100 nm are sprayed over the amorphous silicon film with pressurized nitrogen gas, thus forming the crystal nuclei.

In either of these methods, it is possible to control nucleus generation during the crystal growth and also the direction of the crystal growth by controlling the introduction conditions of the foreign substances. However, as with the earlier described methods, the heat treatment is needed for crystallization. For example, in the method disclosed in Japanese Laid-Open Patent Publication No. 5-55142, a heat treatment is performed at 600° C. for 40 hours. In the method disclosed in Japanese Laid-Open Patent Publication No. 5-136048, a heat treatment is performed at 650° C. or higher temperatures.

Therefore, although the techniques using heat treatment are effective for silicon-on-insulator (SOI) or silicon-on-sapphire (SOS) substrates, they cannot be applied to low-cost glass substrates. For example, the distortion temperature for Corning 7059® glass, which is commonly used in active-matrix liquid-crystal display devices, is 593° C. Thus, when this glass is heat-treated at 600° C. or higher temperatures as disclosed in the above methods, the glass substrate has a high probability of becoming deformed or distorted, which poses a particularly problem considering a current trend for enlarging substrate surface areas.

SUMMARY OF THE INVENTION

A method for fabricating a semiconductor device of the invention includes the steps of: (a) forming an amorphous silicon film on a substrate having an insulating surface in such a manner that the amorphous silicon film is patterned so as to form at least one island region and a catalyst element is selectively introduced into at least a predetermined region in the island region; and (b) heat-treating the amorphous silicon film to cause a crystal growth in surrounding areas of the predetermined region of the amorphous silicon film in directions substantially parallel to the surface of the substrate, whereby obtaining a crystalline silicon film, wherein the crystalline silicon film is used as a device region of the semiconductor device.

In one embodiment, the step (a) further includes the steps of: forming the amorphous silicon film on the substrate; patterning the amorphous silicon film to form the at least one island region; and selectively introducing the catalyst element into at least the predetermined region in the island region. Alternatively, the step (a) further includes the steps of: forming the amorphous silicon film on the substrate; selectively introducing the catalyst element into at least the predetermined region; and patterning the amorphous silicon film to form the at least one island region.

In another embodiment, the semiconductor device is fabricated in such a manner that a carrier moving direction in the crystalline silicon film is substantially parallel to a crystal growth direction of the amorphous silicon film.

In still another embodiment, the method further includes the step of forming a mask layer which has an opening for defining the predetermined region in the island region, wherein the catalyst element is introduced through the opening.

In still another embodiment, within the device region, the catalyst element is introduced into at least part of a portion to be a source region or a drain region.

In still another embodiment, the catalyst element is at least one element selected from a group consisting of Ni, Co, Pd, Pt, Cu, Ag, Au, In, Sn, Al, P, As and Sb.

According to another aspect of the invention, a semiconductor device includes an active region formed using a crystalline silicon film, wherein the active region is formed using a lateral crystal growth region of the crystalline silicon film which is obtained by a heat treatment of an amorphous silicon film in which a catalyst element for accelerating crystallization is selectively introduced into a predetermined region, the predetermined region being removed. In one embodiment, the catalyst element is at least one element selected from a group consisting of Ni, Co, Pd, Pt, Cu, Ag, Au, In, Sn, Al, P, As and Sb. In another embodiment, a concentration of the catalyst element in the active region is in a range from $1\times10^{14}$ to $1\times10^{18}$ atoms/cm$^3$.

According to still another aspect of the invention, a method for fabricating a semiconductor device includes the steps of: (a) forming an amorphous silicon film on a substrate having an insulating surface; (b) selectively introducing a catalyst element into at least a predetermined region of the amorphous silicon film for accelerating crystallization thereof; (c) heat-treating the amorphous silicon film to cause a crystal growth in surrounding areas of the predetermined region of the amorphous silicon film in directions substantially parallel to the surface of the substrate, whereby obtaining a crystalline silicon film; (d) removing the predetermined region into which the catalyst element has been introduced; and (e) exposing portions surrounding a position from which the predetermined region has been removed to laser or other intense light for improving crystallinity of the crystalline silicon film.

According to still another aspect of the invention, a semiconductor device includes a thin film transistor formed using a crystalline region which is at least part of a silicon film formed on a substrate having an insulating surface, wherein the crystalline region is obtained by crystal growth of a selective introduction region into which a catalyst element is selectively introduced for accelerating crystallization of an amorphous silicon film, the selective introduction region smaller than the crystalline region, and the thin film transistor is positioned so as not to overlap the selective introduction region. In one embodiment, the thin film transistor is further positioned inside a crystal growth end of the crystalline region.

According to still another aspect of the invention, a method for fabricating a semiconductor device includes the steps of: (a) forming an amorphous silicon film on a substrate having an insulating surface; (b) forming a mask layer on the amorphous silicon film, the mask layer having an opening for selectively introducing a catalyst element to accelerate crystallization of the amorphous silicon film and for forming a first alignment mark; (c) selectively introducing the catalyst element through the opening into the amorphous silicon film to form a selective introduction region; (d) heat-treating the amorphous silicon film to form at least partially a crystalline region; (e) etching the partially crystallized amorphous silicon film using the mask layer to remove at least part of the selective introduction region and to form the first alignment mark in the partially crystallized amorphous silicon film; and (f) patterning the crystalline region into island pattern using the first alignment mark. In one embodiment, the method further includes the step of forming a second alignment mark using the first alignment mark. Alternatively, the method further includes the step of forming a second alignment mark using the mask layer. In another embodiment, the step (e) further includes the step of exposing a portion around the first alignment mark to light energy, whereby making the first alignment mark clearly distinguishable.

In one embodiment, the thin film transistor is arranged in such a manner that a conduction direction of the thin film transistor is substantially parallel to a crystal growth direction of the amorphous silicon film. Alternatively, the thin film transistor is arranged in such a manner that a conduction direction of the thin film transistor is substantially perpendicular to a crystal growth direction of the amorphous silicon film.

In another embodiment, the catalyst element is at least one element selected from a group consisting of Ni, Co, Pd, Pt, Cu, Ag, Au, In, Sn, Al, P, As and Sb.

In still another embodiment, a dose of the catalyst element is in a range from $1 \times 10^{18}$ to $1 \times 10^{20}$ atoms/cm$^3$.

According to still another embodiment, a method for fabricating a semiconductor device includes the steps of: (a) forming an amorphous silicon film on a substrate having an insulating surface; (b) forming a mask layer on the amorphous silicon film, the mask layer having an opening for selectively introducing a catalyst element into the amorphous silicon film to accelerate crystallization thereof and for forming a first alignment mark; (c) selectively introducing the catalyst element through the opening into the amorphous silicon film to form a selective introduction region; (d) heat-treating the amorphous silicon film to form at least partially a crystalline region; (e) patterning the crystalline region into island pattern and removing the selective introduction region using the mask layer, and further forming a second alignment mark in the partially crystallized amorphous silicon film.

According to still another aspect of the invention, a semiconductor device includes a channel region, the device being formed on a substrate having an insulating surface using a silicon film having crystallinity, wherein the channel region is formed using a crystalline silicon film which is obtained by selectively introducing a catalyst element for accelerating crystallization of an amorphous silicon film into a predetermined slit-like introduction region thereof, heat-treating the amorphous silicon film at a predetermined annealing temperature to cause crystal growth in surrounding portions of the introduction region in parallel to the surface of the substrate, and the channel region is arranged within an area in which the crystal growth from the introduction region proceeds at the predetermined annealing temperature.

According to still another aspect of the invention, a method for fabricating a semiconductor device includes the steps of: (a) forming an amorphous silicon film on a substrate having an insulating surface; (b) selectively introducing a catalyst element into a predetermined slit-like introduction region of the amorphous silicon film for accelerating crystallization thereof; (c) heat-treating the amorphous silicon film to cause a crystal growth in surrounding areas of the predetermined region of the amorphous silicon film in directions substantially parallel to the surface of the substrate, whereby obtaining a crystalline silicon film; and (d) forming a thin film transistor using the crystalline silicon film, wherein the thin film transistor is positioned so that a channel region thereof is located in an area in which the crystal growth from the introduction region proceeds at the predetermined annealing temperature.

In one embodiment, the channel region is arranged at a position within 120 µm from the introduction region.

In another embodiment, the channel region is arranged within an area in which the crystalline silicon film has one-directional crystal growth direction and a number of branches and bends of the crystalline film from the one-dimensional crystal growth direction is 2 or less. Preferably, the channel region is arranged at a position within 60 µm from the introduction region. Alternatively, the channel region is arranged within an area in which a number of branches and bends of the crystalline film from the one-dimensional crystal growth direction is 1 or less. Preferably, the channel region is arranged at a position within 30 µm from the introduction region.

In still another embodiment, a distance between the channel region and a side of the introduction region in a direction of a longer side of the introduction region is within an area in which the crystallization from the introduction region proceeds at the predetermined annealing temperature. Preferably, the distance between the channel region and the side of the introduction region in the direction of the longer side of the introduction region is 30 µm or more.

In still another embodiment, a length in a longer side direction of the introduction region is set larger than a value at which a crystal growth range of the crystalline silicon film saturates. Preferably, the length in the longer side direction of the introduction region is 120 µm or more.

In still another embodiment, a width in a shorter side direction of the introduction region is set larger than a value at which a crystal growth range of the crystalline silicon film saturates. Preferably, the width in the shorter side direction of the introduction region is 5 µm or more.

In still another embodiment, a plurality of channel regions are formed, whereby forming a plurality of thin film transistors. Preferably, the plurality of thin film transistors are arranged on both sides of the introduction region.

In still another embodiment, the crystalline silicon film is exposed to laser or other light having a high intensity to improve crystallinity of the crystalline film.

In still another embodiment, the catalyst element is at least one element selected from a group consisting of Ni, Co, Pd, Pt, Cu, Ag, Au, In, Sn, Al, P, As and Sb.

Thus, the invention described herein makes possible the advantages of providing (1) a method for fabricating a semiconductor device in which semiconductor devices having high quality properties, stable reliability and stable electrical characteristics are efficiently formed over an entire substrate by using a lateral crystal growth region, regardless of the sizes of the respective semiconductor devices, (2) a method for fabricating a semiconductor device which enables a reduction of the time period required for crystallization of a silicon film, (3) a method for fabricating a semiconductor device which enables the prevention of contact failure and degradation in TFT characteristics, (4) a method for fabricating a semiconductor device which enables dealing with auto-alignment, and (5) a semiconductor device fabricated in accordance with the above-mentioned methods.

These and other advantages of the present invention will become apparent to those skilled in the art upon reading and understanding the following detailed description with reference to the accompanying figures.

BRIEF DESCRIPTION OF THE DRAWINGS

FIG. 4 is a graph showing a relationship between a size of the catalyst element introduction region and a lateral crystal growth range.

FIGS. 17A and 17B are top plan views illustrating an example of a configuration of a thin film transistor fabricated in accordance with a ninth example of the invention.

FIG. 22 is a top plan view illustrating an example of a configuration of a thin film transistor fabricated in accordance with a thirteenth example of the invention.

DESCRIPTION OF THE PREFERRED EMBODIMENTS

Figure 1:
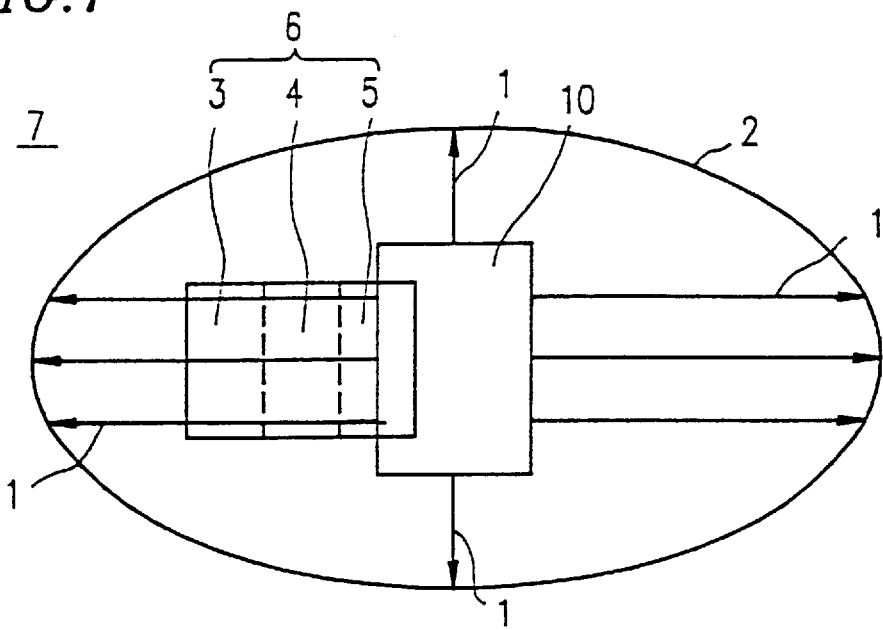
FIG. 1 is a top plan view illustrating an example of a configuration of a thin film transistor fabricated by using a crystalline silicon film obtained by a lateral crystal growth.

Before explaining the preferred embodiments of the present invention, another method proposed by the same inventors as the present invention will be explained for fabricating a crystalline silicon thin film which achieves reductions both in the processing temperature necessary for crystallization and in the treatment time and which minimizes influences of the grain boundaries. It should be noted here that this proposed method is a technique that constitutes the basis for the present invention as the method to solve, to some extent, the aforementioned disadvantages of the conventional techniques, and does not constitute prior art for the present invention.

This proposed method achieves drastic improvements both in a nucleus generation speed in the early stage of crystallization and in a nucleus growth speed in subsequent stages by introducing Ni or other impurity metal elements into an amorphous silicon film as nuclei for crystal growth. With this method, sufficient crystallinity can be obtained by heat treatment for four hours at temperatures not higher than 580° C.; something which has not been possible in the conventional techniques.

The mechanism for the method is as follows. First, crystal nuclei with impurity metal elements as their nuclei are generated in the early stage of the heating process. After that, the impurity metal elements act as catalysts to accelerate the crystallization, and the crystal growth proceeds rapidly. In this sense, such impurity metal elements are hereinafter referred to as the catalyst elements.

While the crystalline silicon films obtained by crystallizing amorphous silicon films using ordinary solid-phase growth methods have a twin crystal structure, the crystalline silicon film obtained by accelerating the crystallization using the catalyst element, as described above, is formed from numerous needle-like or column-like crystals. Furthermore, an internal structure of each of the needle-like or column-like crystals is in an ideal single crystalline state.

Furthermore, by introducing the catalyst elements into selected regions of the substrate, crystalline silicon films and amorphous silicon films can be formed selectively in respectively designated regions on the same substrate. When the heat treatment is further continued, a phenomenon occurs where the crystallized regions laterally grow from the regions in which the catalyst elements are selectively introduced into the surrounding amorphous regions, i.e., in directions parallel to the substrate surface. These crystallized regions grown in the lateral directions are hereinafter referred to as the lateral growth regions.

In the lateral growth regions, the needle-like or column-like crystals extend along the growth direction in parallel to the substrate surface, and no grain boundaries exist in the growth direction. Therefore, by forming TFT channel regions using the lateral growth regions, high-performance TFTs can be formed. More specifically, when the TFTs are fabricated by using such lateral growth regions as their active regions, a field-effect mobility improves by a factor of about two, compared to that of the TFTs that use crystalline silicon films formed by the ordinary solid-phase growth techniques.

Furthermore, by exposure to laser or other intense light after crystallization, the crystallinity further improves, and a higher mobility can be obtained. That is, when the lateral growth regions are exposed to laser or other intense light, the grain boundaries are treated in concentrated manner because of the difference in melting points between the crystalline silicon film and the amorphous silicon film. In the crystalline silicon films formed by the ordinary solid-phase growth methods, since such films have the twin crystal structure, untreated portions will remain as crystal defects in the grain boundaries after the exposure to laser or other intense light. By contrast, the lateral growth regions crystallized by introducing the catalyst elements as described above are formed from the needle-like or column-like crystals, and the internal structure thereof is in the single crystalline state. Therefore, when the grain boundaries are treated by the exposure to laser or other intense light, a crystalline silicon film substantially in a single crystalline state can be obtained.

Figure 2:
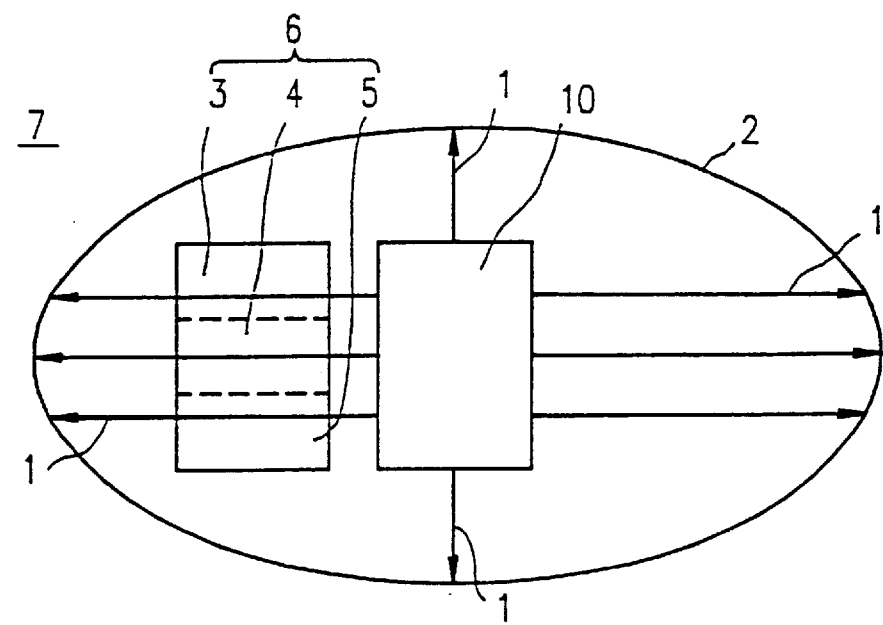
FIG. 2 is a top plan view illustrating another example of a configuration of a thin film transistor fabricated by using a crystalline silicon film obtained by a lateral crystal growth.

FIGS. 1 and 2 are top plan views of a substrate, showing an example of a TFT 6 fabricated using a lateral growth region such as the one described above. A mask 7 made of a silicon dioxide film or the like is deposited on an amorphous silicon film formed over the entire surface of the substrate, and an opening for introducing catalyst elements is formed in the mask 7. After introducing the catalyst elements, a heat treatment is performed for about four hours at a temperature of about 550° C., to crystallize the amorphous silicon film in a region 10 which corresponds to the opening in the amorphous silicon film and where the catalyst elements has been introduced. The other regions of the amorphous silicon film than the region 10 remain in the amorphous state. When the heat treatment is continued for about another eight hours, lateral crystal growth from the region 10 spreads in all directions as shown by arrows 1, forming a lateral crystal growth region 2. Thereafter, using the lateral crystal growth region 2, the TFT 6 is formed by a known method.

For forming the TFT 6 in the lateral crystal growth region 2, arranging a source region 3, a channel region 4 and a drain region 5 of the TFT 6 as shown in FIG. 1 with respect to the crystal growth direction (shown by the arrows 1) makes a carrier moving direction coincide with the crystal growth direction. The TFT thus formed achieves a high mobility, since no crystal grain boundaries exist in the carrier moving direction.

On the other hand, arranging the source region 3, the channel region 4 and the drain region 5 of the TFT 6 as shown in FIG. 2 with respect to the crystal growth direction makes the carrier moving direction intersect the crystal growth direction. In this arrangement, carriers move by crossing a large number of crystal grain boundaries, resulting in an increase in a source-drain resistance. Although this decreases the mobility, the TFT thus formed has a low leakage current which flows during an OFF period. Furthermore, in the structure of FIG. 2, the grain boundaries at edges of the drain region 5, in which an electric field tends to concentrate, are eliminated. This results in a reduction of the trap density of the grain boundaries at the edges of the drain region which may degrade the characteristics during TFT operation. Therefore, it is possible to fabricate a TFT having a large on-off ratio.

As described, by using the above technique, high-performance TFTs can be fabricated, while reducing the heating temperature for crystallization as well as the processing time in the lateral crystal growth process. Furthermore, it is possible to selectively fabricate TFTs for various needs on the same substrate.

In the lateral crystal growth process, however, it is required that the crystal growth range be made sufficiently long to entirely cover the channel region of the semiconductor device to be formed. Any region to which the crystal growth does not reach would remain as an amorphous silicon film even after the treatment. That is, if the crystal growth is insufficient, the channel region would be formed partly from a crystalline silicon film and partly from an amorphous silicon film, which leads to significant degrading of the characteristics of the resulting semiconductor device. Furthermore, even in the case where the whole channel region is formed from a crystalline silicon film formed by crystal growth, if an amorphous silicon film remains in any contact region where the source or drain region is to be formed, resistance in the contact region would increase, making it impossible to obtain good semiconductor device characteristics. To overcome the above problems, a sufficiently large lateral crystal growth must be accomplished, which, however, necessitates a long heat treatment and hence decreases the processing throughput.

Furthermore, according to the above method, after depositing the amorphous silicon film on the substrate, catalyst elements are introduced into the selected region 10 of the amorphous silicon film, followed by the heat treatment whereby the amorphous silicon film is crystallized in lateral directions, thus forming the lateral growth region 2. Thereafter, the silicon film crystallized by the crystal growth is patterned in the island pattern each serving as a device region where an active region of a TFT is to be formed. In this method, the lateral crystal growth proceeds as the catalyst elements, concentrated in the edge portions of the region 10 previously crystallized by the direct introduction of the catalyst elements, diffuse in all directions.

Figure 3:
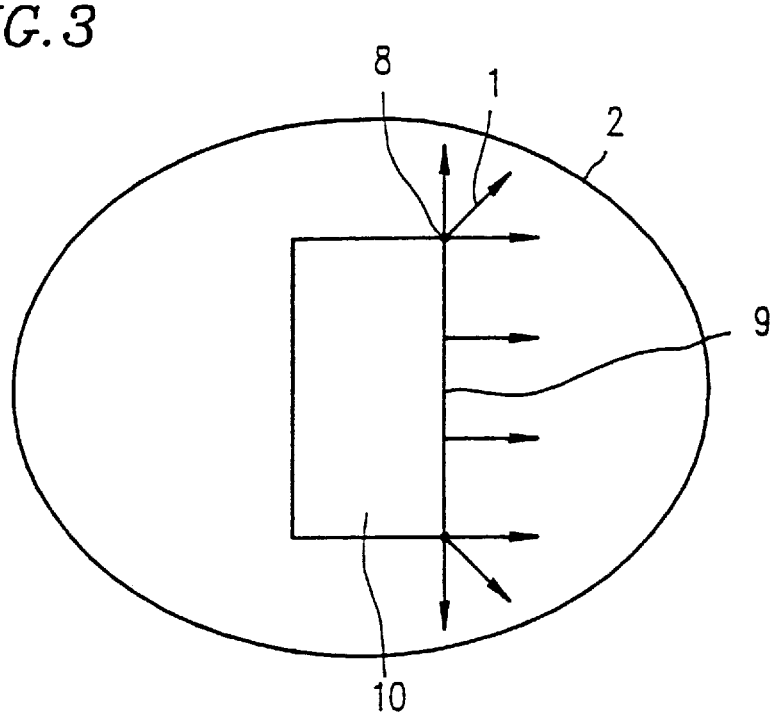
FIG. 3 is a top plan view schematically illustrating a shape of a region in which catalyst elements are introduced to accelerate the crystallization of a silicon film.

For example, if the region 10 into which the catalyst elements are introduced is rectangular in shape as shown in FIG. 3, the degree of freedom of the crystal growth direction 1 around a corner 8 of the region 10 is theoretically 270°, so that the catalyst elements are in an easily movable state. Therefore, the density of the catalyst elements around the corner 8 becomes lower than that along a side portion 9 of the region 10. As a result, a shorter crystal growth range is obtained at the corner 8 compared with that in the other portions, and the catalyst elements are forced to move towards the corner 8 from its surrounding portions. This means that the smaller the region 10 into which the catalyst elements are introduced, the shorter the crystal growth range becomes.

FIG. 4 shows an example of a relationship between sizes of the catalyst element introduction region and lateral crystal growth ranges L, when Ni is used as the catalyst element. In FIG. 4, curve A depicts a graph for a large dose of the catalyst elements, and curve B for a small dose thereof. From this, it is clear that the lateral crystal growth range L depends on the size of the catalyst element introduction region. When the dose of the catalyst elements is increased, the crystal growth range increases as a whole, but this does not improve the above dependence. This particularly poses a problem in fabrication of such small-size TFTs as used for pixel switching elements in active-matrix liquid-crystal display devices, since a sufficiently long crystal growth range cannot be obtained in such cases.

Furthermore, during the lateral crystal growth, there occurs a situation where the crystal growth direction branches due to spontaneous generation of the growth nuclei inside the amorphous silicon film lying in the crystal growth direction, or due to the effects of impurities such as oxygen, carbon, nitrogen, or other metal elements present in the amorphous silicon film. In particular, when the lateral crystal growth range is made long, the needle-like or column-like crystals forming the lateral growth region become susceptible to branching or bending at the end portion of the lateral growth region, making it difficult to obtain a high-quality crystalline silicon film with its crystal growth direction aligned in one dimensional manner.

Furthermore, as shown in FIG. 3, around the corner 8 of the catalyst element introduction region 10, the crystal growth direction is appreciably disordered for the earlier mentioned reason, which greatly affects the characteristics of the crystals grown in other areas. For TFTs using crystalline silicon films, aligning the crystal growth direction is essential to ensure the high performance of the final device, and the above phenomenon can present a major disadvantage.

There are still other problems as described hereinafter. The earlier described selective introduction of the catalyst elements into the amorphous silicon film is performed using a mask formed from silicon dioxide or the like, and the density of the catalyst elements is high in the introduction region, i.e. the region 10. Therefore, the introduction region 10 needs 28 to be formed away from TFT regions in which TFTs are to be formed so that the region 10 does not overlap the channel region 3, the source region 4, or the drain region 5 of the TFT. However, since a certain limit exists on how long the lateral growth range can be made, the catalyst element introduction region 10 is, in practice, formed adjacent to the TFT regions.

When the catalyst element introduction region 10 is exposed to laser or other intense light for accelerating the crystal growth, the catalyst elements precipitate and diffuse through the surface of the region 10, and thus stay in large quantities on the substrate. If a semiconductor apparatus is fabricated from devices such as TFTs formed on such a substrate, the presence of the catalyst elements adversely affect the reliability and electrical stability of the semiconductor device.

Furthermore, in the case where a TFT is formed as its active region contains part of the catalyst element introduction region, when the catalyst introduction region overlaps the channel region of the TFT, an appreciable leakage current occurs depending on the dose of the catalyst elements, and the characteristics of the TFT will be degraded. On the other hand, when the catalyst introduction region overlaps the source or drain region, a surface of the semiconductor film surface may be roughened by laser radiation that is utilized to activate donor or acceptor elements because of insufficient resistance of the film to the laser radiation. Moreover, since the catalyst element introduction region is not resistant to an etchant used to form a through hole for contact in an insulating film on the semiconductor film, it is etched faster than the other regions. This may result in contact failure.

Furthermore, to obtain TFTs with good characteristics by effectively using the lateral crystal growth region, mask alignment after the formation of the island pattern on the semiconductor film needs to be done precisely with respect to the catalyst element introduction region. In the conventional methods, the mask alignment has been performed utilizing a subtle difference in shade between the catalyst element introduced region and the non-introduced region. Thus, a precise alignment has been difficult. Moreover, it has not been possible to conduct an auto-alignment essential for mass production.

Hereinafter, the present invention will be described by way of example with reference to the accompanying drawings.

EXAMPLE 1

A method for fabricating a TFT according to a first example of the invention will be described with reference to FIGS. 5A to 5D. FIGS. 5A to 5D schematically show cross sections of a semiconductor device at each step of the method for fabricating an n-type TFT according to the present example.

First, a base coat film 102 of a 200 nm thick silicon oxide is deposited by sputtering onto an insulating substrate 101 such as glass.

Next, using a plasma CVD process, an intrinsic amorphous silicon film is deposited to a thickness in the range of 50 to 150 nm, for example, to 100 nm. After that, the amorphous silicon film is patterned by a suitable method to remove undesired regions, providing device isolation and thus forming a device region 104. In this device region 104, an active region of a TFT, i.e., a source region 109, a channel region 110, and a drain region 111, is later to be formed. Actually, numerous device regions 104, each in an island pattern, are formed on the same substrate 101. When the fabrication method of this example is applied to fabricate an active-matrix liquid-crystal display device, the device regions 104, that is, the island-patterned regions, are arranged in a matrix pattern.

Next, a mask layer 103, formed from a silicon oxide film, a silicon nitride film, or the like, is deposited over the device region 104. Alternatively, the mask layer 103 may be formed as a metal mask.

Figure 6:
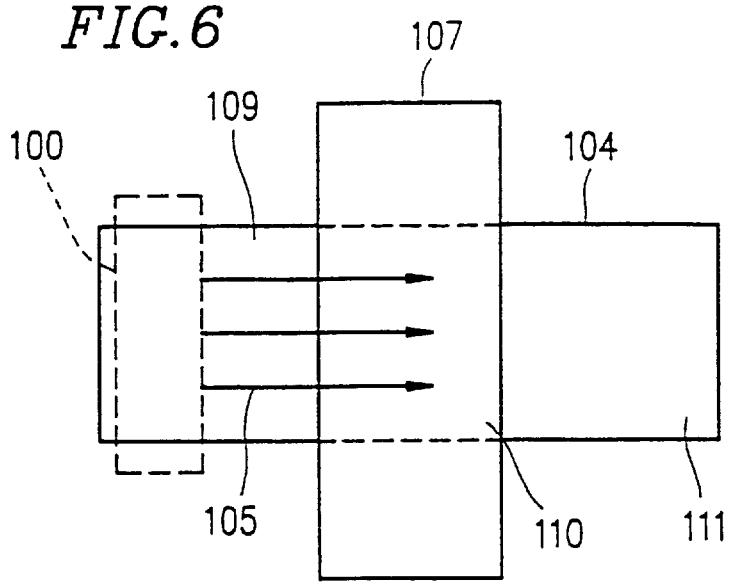
FIG. 6 is a plan view schematically illustrating a fabricating position, on a substrate, of a thin film transistor to be fabricated in accordance with the first example of the invention.

Next, an opening 100 is provided in the mask layer 103 to expose a portion of the device region 104 formed from the amorphous silicon film. The opening 100 is formed in such a way as to bridge the device region 104. FIG. 6 shows a positional relationship between the opening 100 and the device region 104 as viewed from above the substrate 101. In the device region 104, only the portion corresponding to the opening 100 is exposed, and the other portions are covered by the mask layer 103.

Next, a nickel silicide film (not shown) of a thickness of 0.5 to 20 nm, for example, 2 nm, is deposited by sputtering on the mask layer 103. In the region corresponding to the opening 100, the nickel silicide film is formed directly on the portion of the amorphous silicon layer 104 exposed through the opening 100. By subsequently removing the mask layer 103, the nickel silicide film is left selectively on the portion of the device region 104 corresponding to the opening 100. Thus, a minute amount of nickels diffuses selectively into the portion of the device region 104 corresponding to the opening 100.

The above semiconductor device with nickel selectively introduced therein is then subjected to heat treatment in a hydrogen reducing atmosphere at 550° C. for 16 hours. During the heat treatment, crystallization of the amorphous silicon film 104 proceeds in a direction shown by an arrow 105 in FIG. 5B. It is desirable that the heat treatment be performed in a hydrogen reducing atmosphere with a partial pressure of hydrogen of 0.1 to 1 atmosphere. Alternatively, the heat treatment may be performed in an inert gas atmosphere at atmospheric pressure.

When a lateral crystal growth is performed in the above manner, nickel is introduced directly and selectively into the amorphous silicon film 104. Therefore, the selective introduction of nickel can be accomplished efficiently even with a minute nickel dose. Furthermore, in the above method, the heat treatment step for crystallization is performed immediately following the nickel introduction step. If any other step is performed between the two steps, damage may be caused to the nickel introduced region by nickel oxidation or by etching. According to the method of the present example, such a problem does not occur.

Figure 5A:
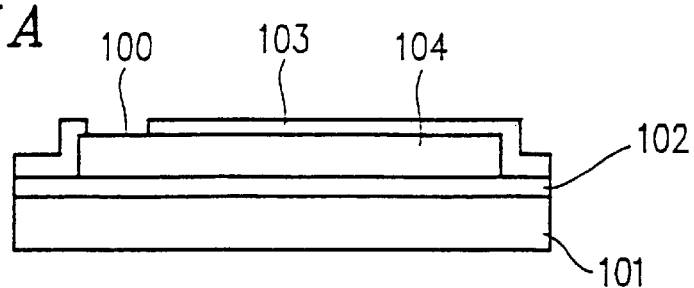
FIGS. 5A to 5D are schematic cross sections illustrating various steps of a method for fabricating a semiconductor device in accordance with a first example of the invention.
Figure 5B:
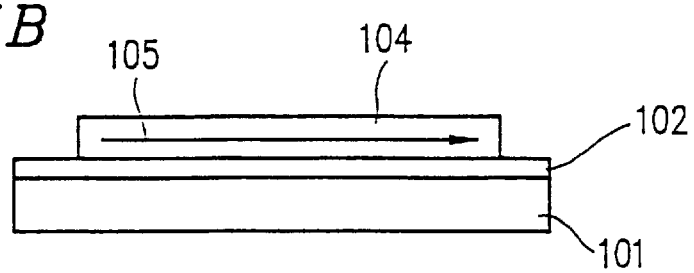
Figure 5C:
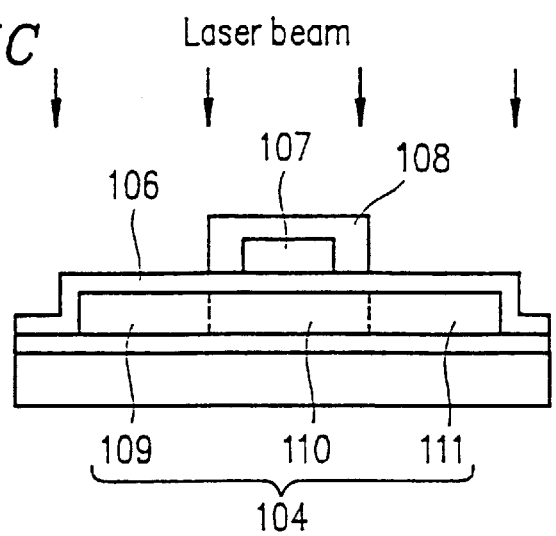

After the heat treatment, a silicon oxide film 106 as a gate oxide film is deposited to a thickness of 100 nm by sputtering in an oxygen atmosphere or a mixed gas atmosphere of oxygen and argon, using silicon oxide as a target material (see FIG. 5C). During the sputtering, the substrate is held at 200° to 400° C., for example, at 350° C. Further, a ratio of argon to oxygen (argon/oxygen) in the sputtering atmosphere is set at 0.5 or less, typically at 0.1 or less.

Thereafter, an aluminum film is deposited by sputtering to a thickness of 400 to 800 nm, for example, to 600 nm. The thus deposited aluminum film is then patterned to form a gate electrode 107 (FIG. 5C). Further, the surface of the gate electrode 107 is anodic-oxidized to form an oxide layer 108 on the surface of the gate electrode 107. This anodic oxidation step is performed by immersing the substrate in an ethylene glycol solution containing 1 to 5% tartaric acid. A thickness of the thus formed oxide layer 108 is typically about 200 nm. This oxide layer 108 is used to form an offset gate region in an ion doping step later performed. A length of the offset gate region can therefore be determined by controlling the thickness of the oxide layer 108 by suitably setting parameters of the anodic oxidation step.

Next, using the gate electrode 107 and the oxide layer 108 on the surface thereof as a mask, impurity ions such as phosphorus or boron are doped into the device region 104 by an ion doping method. More specifically, for doping phosphorus, phosphine ($PH_3$) is used as a doping gas with an acceleration voltage of 60 to 90 kV, for example, of 80 kV, and a dose of $1 \times 10^{15}$ to $8 \times 10^{15}$ $cm^{-2}$, for example, of $2 \times 10^{15}$ $cm^{-2}$. Regions 109 and 111 doped with the impurities by this ion doping step are later used as source and drain regions of a TFT, and a region 110, masked by the gate electrode 107 and the oxide layer 108 so as not to be doped with the impurities, is later used as a channel region of the TFT.

Further, when fabricating a circuit having an n-type TFT and a p-type TFT in complementary configuration, regions where no doping is needed are covered with a suitably patterned photo resist, and elements of respective conductive types are selectively doped to form the corresponding n-type and p-type impurity regions Next, the substrate is annealed by exposure to laser beams, as shown in FIG. 5C, to activate the doped impurities. A KrF excimer laser with a wavelength of 248 nm and a pulse width of 20 ns, for example, is used as the laser source but other type of lasers may also be used. Regarding the laser radiation conditions; energy density is set at 200 to 400 $mJ/cm^2$, for example, at 250 $mJ/cm^2$, and a pulsed radiation is applied for 2 to 10 shots per region, for example, 2 shots per region. Preferably, the substrate is held at 200° to 450° C. during the laser radiation.

In the laser annealing step, recrystallization easily proceeds in the region previously crystallized by the introduction of nickel. In the impurity-doped regions 109 and 111, the impurities are easily activated.

Figure 5D:
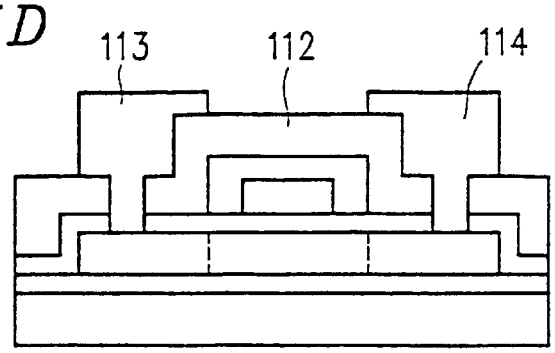

Next, a silicon oxide film 112 of a thickness of 600 nm is formed as an interlayer insulating film by plasma CVD, as shown in FIG. 5D. Further, contact holes are opened in the silicon oxide film 112, and a multilayered film of appropriate metal materials, titanium nitride and aluminum for example, is deposited to form electrodes and metal interconnections 113 and 114 of the TFT. When the TFT is used as a pixel switching element in a liquid-crystal display device or the like, the electrode (pixel electrode) is formed using indium tin oxide (ITO) instead of metal.

Finally, heat treatment is performed in a hydrogen atmosphere of 1 atmosphere at 350° C. for 30 minutes to complete the fabrication of the TFT.

FIG. 6 is a schematic plan view of the completed semiconductor device structure in FIG. 5D as viewed from the top thereof, showing a positional relationship between the TFT and the region 100 where nickel is introduced selectively. In FIG. 6, a minute amount of nickel is introduced selectively into the region 100. By the subsequent heat treatment, the crystal growth proceeds in a direction shown by arrows 105. In the method of the present example, this heat treatment is preceded by a device isolation step in which device isolation is provided by patterning the amorphous silicon in the island pattern. As a result, the nickel introduced into the region 100 does not diffuse into the surrounding areas, and one-dimensional lateral crystal growth proceeds efficiently only in the direction shown by the arrows 105. Accordingly, as compared to the conventional methods, the lateral crystal growth range becomes longer, and a high-quality crystalline silicon film with its crystal direction uniformly aligned in one direction can be obtained.

Furthermore, in the TFT structure shown in FIG. 6, the TFT is formed so that the carrier moving direction in the channel region 110 (that is, the direction leading from the source region 109 to the drain region 111) is substantially aligned in parallel with the direction of the lateral crystal growth shown by the arrows 105. The relationship between the direction of the lateral crystal growth and the direction along which the respective regions of the TFT are arranged is not limited to the one illustrated herein. However, when the active region (the device region) 104 is arranged so that the direction along which the respective regions of the TFT (the carrier moving direction in the channel region 110) is substantially aligned in parallel with the crystal growth direction, as illustrated in FIG. 6, the carriers are allowed to move without crossing grain boundaries. This provides a significant increase in a carrier mobility for the TFT.

EXAMPLE 2

A method for fabricating a TFT according to a second example of the invention will be described with reference to FIGS. 7A to 7D. FIGS. 7A to 7D schematically show cross sections of a semiconductor device at each step of the method for fabricating an n-type TFT according to the present example.

First, a base coat film 202 of a 200 nm thick silicon oxide is deposited by sputtering onto an insulating substrate 201 such as glass. Next, a mask layer 203, formed from a silicon oxide film, a silicon nitride film, or the like, is deposited over the base coat film 202. Alternatively, the mask layer 203 may be formed as a metal mask.

Next, an opening 200 is provided in the mask layer 203 to expose a portion of the base coat film 202. In the base coat film 202, only the portion corresponding to the opening 200 is exposed, and the other portions are covered by the mask layer 203.

Next, a nickel silicide film (not shown) of a thickness of 0.5 to 20 nm, for example, 2 nm, is deposited by sputtering on the mask layer 203. In the region corresponding to the opening 200, the nickel silicide film is formed directly on the portion of the base coat film 202 exposed through the opening 200. By subsequently removing the mask layer 203, the nickel silicide film is left selectively on the portion of the base coat film 202 corresponding to the opening 200. Thus, a minute amount of nickel diffuses selectively into the portion of an amorphous silicon film, to be deposited later, corresponding to the opening 200.

Next, using a plasma CVD process, an intrinsic amorphous silicon film is deposited to a thickness in the range of 50 to 150 nm, for example, to 100 nm. After that, the amorphous silicon film is patterned by a suitable method to remove undesired regions, providing device isolation and thus forming a device region 204. In this device region 204, a source region 209, a channel region 210, and a drain region 211, is later to be formed. Actually, numerous device regions 204, each in an island pattern, are formed on the same substrate 201. When the fabrication method of this example is applied to fabricate an active-matrix liquid-crystal display device, the device regions 204, that is, the island-patterned regions, are arranged in a matrix pattern.

The above semiconductor device with nickel selectively introduced therein is then subjected to heat treatment in a hydrogen reducing atmosphere at 550° C. for 16 hours. During the heat treatment, crystallization of the amorphous silicon film proceeds in a direction shown by an arrow 205 in FIG. 7B. It is desirable that the heat treatment be performed in a hydrogen reducing atmosphere with a partial pressure of hydrogen of 0.1 to 1 atmosphere. Alternatively, the heat treatment may be performed in an inert gas atmosphere at atmospheric pressure.

When lateral crystal growth is performed in the above manner, nickel is introduced directly and selectively into the amorphous silicon film. Therefore, the selective introduction of nickel can be accomplished efficiently even with a minute nickel dose. Furthermore, in the above method, the heat treatment step for crystallization is performed immediately following the nickel introduction step. If any other step is performed between the two steps, damage may be caused to the nickel introduced region by nickel oxidation or by etching. According to the method of the present example, such a problem does not occur.

Figure 7A:
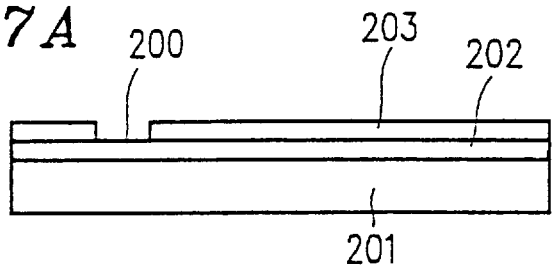
FIGS. 7A to 7D are schematic cross sections illustrating various steps of a method for fabricating a semiconductor device in accordance with a second example of the invention.
Figure 7B:
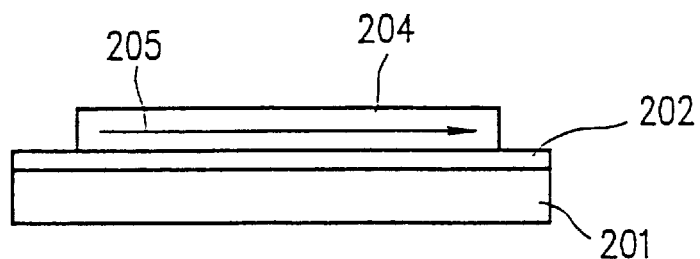
Figure 7C:
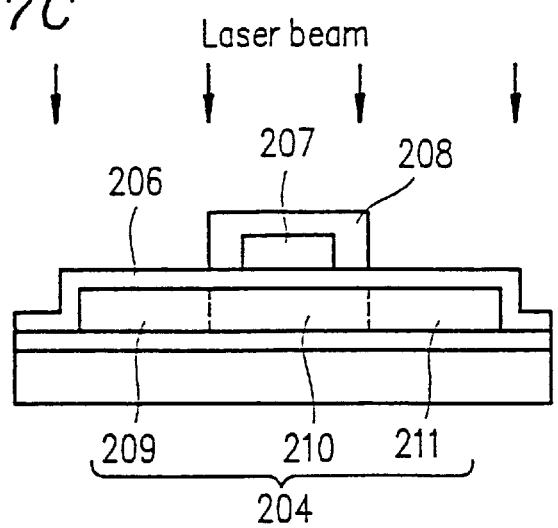

After the heat treatment, a silicon oxide film 206 as a gate oxide film is deposited to a thickness of 100 nm by sputtering in an oxygen atmosphere or a mixed gas atmosphere of oxygen and argon, using silicon oxide as a target material (see FIG. 7C). During the sputtering, the substrate is held at 200° to 400° C., for example, at 350° C. Further, a ratio of argon to oxygen (argon/oxygen) in the sputtering atmosphere is set at 0.5 or less, typically at 0.1 or less.

Thereafter, an aluminum film is deposited by sputtering to a thickness of 400 to 800 nm, for example, to 600 nm. The thus deposited aluminum film is then patterned to form a gate electrode 207 (FIG. 7C). Further, the surface of the gate electrode 207 is anodic-oxidized to form an oxide layer 208 on the surface of the gate electrode 207. This anodic oxidation step is performed by immersing the substrate in an ethylene glycol solution containing 1 to 5% tartaric acid. A thickness of the thus formed oxide layer 208 is typically about 200 nm. This oxide layer 208 is used to form an offset gate region in an ion doping step later performed. A length of the offset gate region can therefore be determined by controlling the thickness of the oxide layer 208 by suitably setting parameters of the anodic oxidation step.

Next, using the gate electrode 207 and the oxide layer 208 on the surface thereof as a mask, impurity ions such as phosphorus or boron are doped into the device region 204 by an ion doping method. More specifically, for doping phosphorus, phosphine ($PH_3$) is used as a doping gas with an acceleration voltage of 60 to 90 kV, for example, of 80 kV, and a dose of $1\times10^{15}$ to $8\times10^{15}$ $cm^{-2}$, for example, of $2\times10^{15}$ $cm^{-2}$. Regions 209 and 211 doped with the impurities by this ion doping step are later used as source and drain regions of a TFT, and a region 210, masked by the gate electrode 207 and the oxide layer 208 so as not to be doped with the impurities, is later used as a channel region of the TFT.

Further, when fabricating a circuit having an n-type TFT and a p-type TFT in complementary configuration, regions where no doping is needed are covered with a suitably patterned photo resist, and elements of respective conductive types are selectively doped to form the corresponding n-type and p-type impurity regions.

Next, the substrate is annealed by exposure to laser beams, as shown in FIG. 7C, to activate the doped impurities. A KrF excimer laser with a wavelength of 248 nm and a pulse width of 20 ns, for example, is used as the laser source but other type of lasers may also be used. Regarding the laser radiation conditions; energy density is set at 200 to 400 $mJ/cm^2$, for example, at 250 $mJ/cm^2$, and a pulsed radiation is applied for 2 to 10 shots per region, for example, 2 shots per region. Preferably, the substrate is held at 200° to 450° C. during the laser radiation.

In the laser annealing step, recrystallization easily proceeds in the region previously crystallized by the introduction of nickel. In the impurity-doped regions 209 and 211, the impurities are easily activated.

Figure 7D:
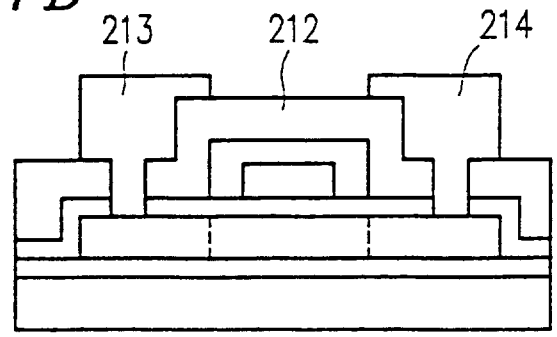

Next, a silicon oxide film 212 of a thickness of 600 nm is formed as an interlayer insulating film by plasma CVD, as shown in FIG. 7D. Further, contact holes are opened in the silicon oxide film 212, and a multilayered film of appropriate metal materials, titanium nitride and aluminum for example, is deposited to form electrodes and metal interconnections 213 and 214 of the TFT. When the TFT is used as a pixel switching element in a liquid-crystal display device or the like, the electrode (pixel electrode) is formed using indium tin oxide (ITO) instead of metal.

Finally, heat treatment is performed in a hydrogen atmosphere of 1 atmosphere at 350° C. for 30 minutes to complete the fabrication of the TFT.

As described above, according to the first and second examples of the invention, the catalyst elements for accelerating the crystallization are introduced into the amorphous silicon film, and the lateral crystal growth is made to proceed in parallel to the substrate surface to produce the crystalline silicon film. Further, using such a crystalline silicon film, the semiconductor device is fabricated.

In the fabrication process, the heat treatment step for the lateral crystal growth is preceded by the device isolation step in which the amorphous silicon film is patterned to form islands of the amorphous silicon film. Accordingly, the catalyst elements diffuse efficiently only within each island of the amorphous silicons, i.e., within the isolated device region. This achieves one-dimensional lateral crystal growth with its growth direction perfectly aligned in a single direction, unlike conventional methods in which the introduced catalyst elements diffuse two-dimensionally in all directions.

Furthermore, variations in the lateral crystal growth range due to variations in the shape and size of the catalyst element introduction region are eliminated. Thus, a constant lateral crystal growth range is ensured regardless of the size of the device region as well as the size of the semiconductor device to be fabricated. Using such crystalline silicon films, high-performance semiconductor devices having stable electrical characteristics can be fabricated over the entire surface of the substrate.

Further, by forming the TFT with its source and drain regions arranged along the crystal growth direction, a semiconductor device having high carrier mobility can be fabricated, since the carrier moving direction coincides with the crystal growth direction and carrier movement is not affected by grain boundaries.

In the above explanation of the first and second examples, for introducing nickels as the catalyst elements, an extremely thin nickel film is formed so as to be in contact with an upper or lower surface of the amorphous silicon film. From such a surface, the crystal growth is made to proceed. Alternatively, after formation of the amorphous silicon film, the amorphous silicon film may be selectively doped with nickel ions by an ion doping method. According to this ion doping method, a concentration of nickel elements to be introduced can be controlled by controlling the doping conditions.

As another alternative method, a liquid-state process may be used to introduce a minute amount of nickel, wherein an aqueous solution of nickel salt such as nickel acetate or nickel nitrate is applied on the surface of the amorphous silicon film. Further, instead of forming a thin nickel film, a plasma electrode constructed from a nickel electrode may be used to introduce a minute amount of nickel.

Furthermore, such elements as cobalt, palladium, platinum, copper, silver, gold, indium, tin, aluminum, phosphorus, arsenic, or antimony may be used as the catalyst elements used to accelerate the crystallization instead of nickel and effects similar to those described above can be obtained.

The first and second examples of the invention have been described assuming application of the invention to an active-matrix substrate for a liquid-crystal display. However, it will be appreciated that the semiconductor device described therein can be used in other applications, such as a close-contact type image sensor, a driver-monolithic thermal head, a driver-monolithic optical write device or display device using organic electroluminescent (EL) elements as light-emitting elements, and a three-dimensional IC. By utilizing the present invention for these applications, high-performance characteristics of the semiconductor devices, such as a fast response, a high resolution, etc., can be achieved.

Furthermore, the invention can be applied to semiconductor processes in general, not only for MOS transistors described in the foregoing examples but also for other semiconductor devices including bipolar transistors and electrostatic induction transistors that use crystalline semiconductors.

EXAMPLE 3

A third example of the invention will be described below with reference to FIGS. 8A to 8H. FIGS. 8A to 8H are schematic cross-sectional diagrams of a semiconductor device at various fabrication steps when the present example is applied to the fabrication of a TFT.

In the previous first and second examples and also in the present example, an amorphous silicon film into which catalyst elements for accelerating the crystallization are selectively introduced is subjected to heat treatment. Thus, lateral crystal growth is caused by diffusion of the catalyst elements, to produce a crystalline silicon film. Thereafter, using the crystalline silicon film thus produced, a semiconductor device such as a TFT is fabricated.

The difference between the present example and the foregoing two examples is that in the present example, the catalyst element introduced region is removed prior to an annealing step in which laser or other intense light is applied to accelerate the crystallization. This serves to prevent precipitation or diffusion of the catalyst elements that may be caused by the radiation of the laser or other intense light in the annealing step. Furthermore, since only the region formed by the lateral crystal growth is used as a device region, reliability and electrical stability of the fabricated semiconductor device can be improved. Moreover, even if there are variations in a dose of the introduced catalyst elements, the TFT characteristics are not affected by such variations.

Figure 8A:
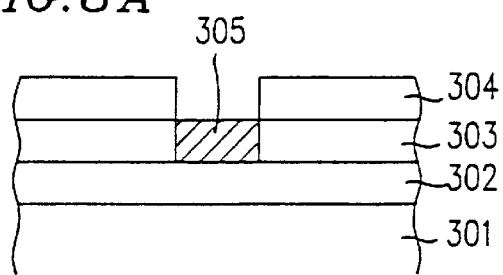
FIGS. 8A to 8H are schematic cross sections illustrating various steps of a method for fabricating a semiconductor device in accordance with a third example of the invention.

First, as shown in FIG. 8A, a base coat film 302 formed from silicon oxide of a thickness of 50 to 200 nm, for example, 100 nm, is deposited by sputtering or other technique onto a cleaned glass substrate 301.

The required thickness of the silicon oxide film that serves as the base coat film 302 varies depending on a surface condition of the glass substrate 301. If the substrate has a sufficiently high degree of surface flatness and a sufficiently low concentration of impurity ions (such as sodium ions) that adversely affect the semiconductor characteristics, the base coat film 302 can be reduced in thickness, or in some cases, can be omitted altogether. On the other hand, in the case of a substrate having a rough surface with scratches, etc., the base coat film 302 needs to be formed so as to have a thickness greater than the above-mentioned dimension.

It will be recognized that a substrate of materials other than glass can also be used as the substrate 301.

Next, by low-pressure CVD, plasma CVD, sputtering, or other techniques, an intrinsic (I-type) amorphous silicon film 303 is deposited to a thickness of 25 to 100 nm, for example, to 50 nm. Then, a mask 304 made of silicon oxide or the like is formed to a thickness of about 100 nm on top of the amorphous silicon film 303. The mask 304 has an opening formed therein through which catalyst elements for accelerating the crystallization are introduced selectively into the amorphous silicon film 303.

Next, in this situation, catalyst elements, for example, nickel, are introduced selectively into an introduction region 305, that is, a portion of the amorphous silicon film 303 that is not covered by the mask 304. Evaporation, sputtering, plasma processing, solution coating, or other suitable techniques may be used to introduce the catalyst elements.

Then, the whole substrate with the catalyst elements selectively introduced therein is subjected to heat treatment. Thus, crystallization occurs first in the catalyst introduced region 305. When the heat treatment is further continued, the crystallization proceeds outwardly from the catalyst introduced region 305, that is, in directions shown by arrows 306 substantially parallel to the surface of the substrate 301, as shown in FIG. 8B. When the heat treatment is sufficiently conducted, crystal growth ends 307 at which crystal growth is actually taking place are formed outward of each of crystallized regions 308 adjacent to the catalyst introduced region 305, as shown in FIG. 8C. The crystal growth ends 307 are tip portions of the crystal growth that has proceeded in the directions substantially parallel to the surface of the substrate 301. Further, the crystal growth ends 307 contain nickel, the introduced catalyst element, at higher concentrations than in the crystallized regions 308. In a specific example, the above heat treatment is performed in a hydrogen reducing atmosphere or an inert atmosphere at temperatures of 520° to 580° C. for several to tens of hours; for example, annealing is performed at 550° C. for eight hours. The actual nickel concentration at the stage shown in FIG. 8C is typically in the range of $1\times10^{19}$ to $1\times10^{20}$ atoms/cm$^3$ in the catalyst introduced region 305 and at the crystal growth ends 307, and $1\times10^{14}$ to $1\times10^{18}$ atoms/cm$^3$ in the crystallized regions 308.

Figure 8E:
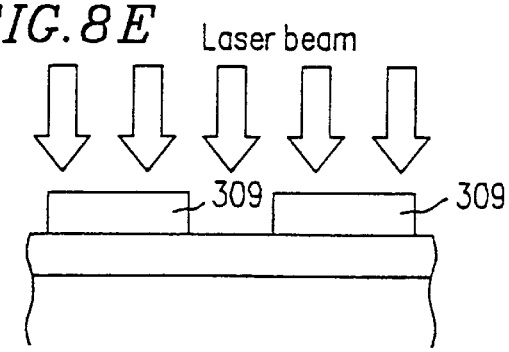
Figure 8B:
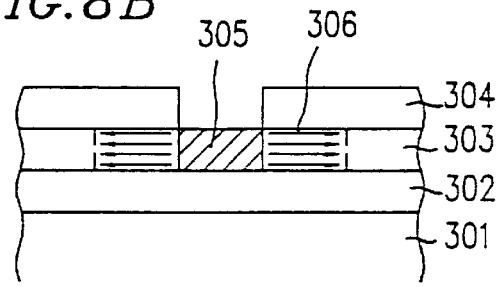
Figure 8F:
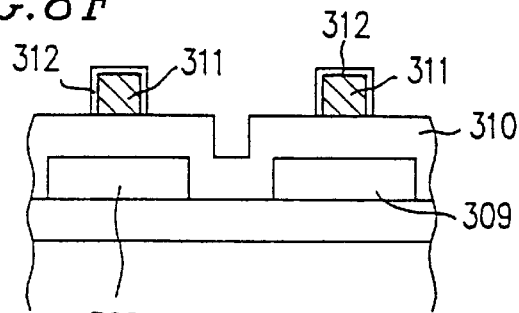
Figure 8C:
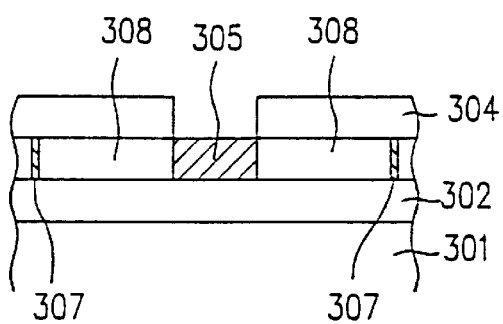
Figure 8G:
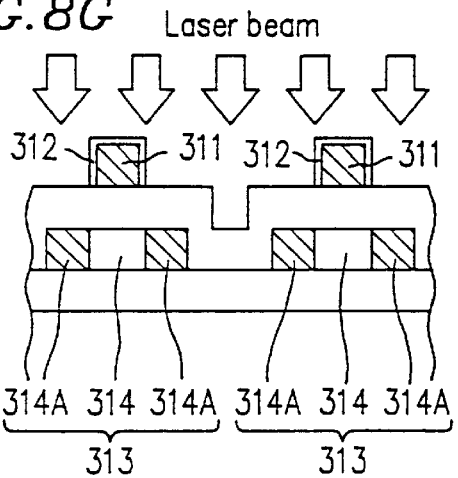
Figure 8D:
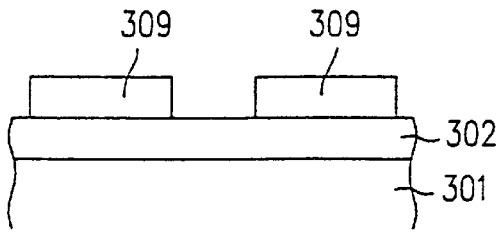

Next, the mask 304 and the catalyst element introduced region 305 of the silicon film are removed, the result of which is shown in FIG. 8D. This provides device isolation for TFTs to be fabricated in subsequent steps, with the formation of an island-like crystalline silicon film 309 to be used as active region (source, drain, and channel regions) of the TFTs.

Next, a laser beam is applied, as shown in FIG. 8E, to improve crystallinity of the crystalline silicon film 309. An XeCl excimer laser (a wavelength of 308 nm), for example, may be used as the laser source. Regarding the laser radiation conditions, the substrate is held at 200° to 450° C., for example, at 400° C., and the energy density of the laser light is set at 200 to 400 mJ/cm$^2$, for example, at 300 mJ/cm$^2$.

After that, a silicon oxide film is deposited to a thickness of 20 to 150 nm, for example, to 100 nm, forming a gate insulating film 310 over the crystalline silicon film 309, as shown in FIG. 8F. This gate insulating film (silicon oxide film) 310 is formed by decomposing and depositing tetraethoxysilane (TEOS) and oxygen in an RF plasma CVD process while holding the substrate at temperatures of 150° to 600° C., preferably at 300° to 450° C. Alternatively, this film may be formed by decomposing and depositing TEOS and ozone gas in a low-pressure CVD or normal-pressure CVD process while holding the substrate at temperatures 350° to 600° C., preferably at 400° to 550° C.

Next, to improve bulk characteristics of the gate insulating film 310 itself as well as interface characteristics between the crystalline silicon film 309 and the gate insulating film 310, annealing is performed in an inert gas atmosphere at temperatures of 400° to 600° C. for 30 to 60 minutes. After that, an aluminum film is deposited by sputtering to a thickness of 400 to 800 nm, for example, to 600 nm. The aluminum film is then patterned to form a gate electrode 311.

Then, the gate electrode 311 is anodic-oxidized to form an oxide layer 312 on the surface thereof. The anodic oxidation is performed, for example, by immersing the substrate in an ethylene glycol solution containing 1 to 5% tartaric acid and raising an applied voltage to 220 V while keeping a current constant, and by holding the substrate in that condition for one hour. A thickness of the thus formed oxide layer 312 is typically 200 nm. This oxide layer 312 is used to form an offset gate region in an ion doping step performed later. A length of the offset gate region can therefore be determined by controlling the thickness of the oxide layer 312 by suitably setting parameters of the anodic oxidation step.

Next, using the gate electrode 311 and the oxide layer 312 on the surface thereof as a mask, as shown in FIG. 8G, impurity ions such as phosphorus or boron are doped into device regions 313 by an ion doping method. More specifically, phosphine (PH$_3$) or diborane (B$_2$H$_6$) is used as a doping gas. When phosphine is used, an acceleration voltage is set at 60 to 90 kV, for example, at 80 kV, and when diborane is used, it is set at 40 to 80 kV, for example, at 65 kV. A dose is set at $1\times10^{15}$ to $8\times10^{15}$ cm$^{-2}$ typically at $2\times10^{15}$ cm$^{-2}$ for phosphorus and at $5\times10^{15}$ cm$^{-2}$ for boron. Regions 314A doped with the impurities by the ion doping step are later used as the source and drain regions of the TFTs. A region 314, masked by the gate electrode 311 and the oxide layer 312 so as not to be doped with the impurities, is later used as the channel region of the TFTs.

Further, when fabricating a circuit consisting of an n-type TFT and a p-type TFT in complementary configuration, regions where no doping is needed are covered with a suitably patterned photo resist, and elements of respective conductive types are selectively doped to form the corresponding n-type and p-type impurity regions.

Next, annealing is performed by laser radiation, to activate the doped impurities and to improve the crystallinity of the portions whose crystallinity has been damaged by the ion doping. An XeCl excimer laser (wavelength of 308 nm) may be used, and the energy density is set at 150 to 400 mJ/cm$^2$, preferably at 250 mJ/cm$^2$, for the radiation. The sheet resistance of the thus formed regions 314A doped with the impurities (phosphorus or boron) is typically 200 to 800 Ω/□.

Figure 8H:
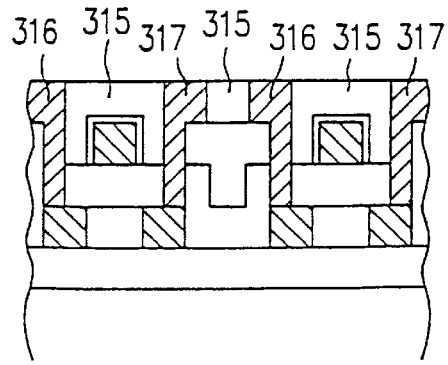

Next, a silicon oxide film or silicon nitride film is deposited as an interlayer insulating film 315 to a thickness of about 600 nm, as shown in FIG. 8H. In the case of a silicon oxide film, it is deposited by plasma CVD using TEOS and oxygen, or by low-pressure CVD or normal-pressure CVD using TEOS and ozone. The interlayer insulating film 315 thus deposited provides excellent step coverage to sufficiently cover steps on the substrate surface. Alternatively, if the interlayer insulating film 315 is formed from a silicon nitride film deposited by plasma CVD using SiH$_4$ and NH$_3$ as material gases, hydrogen atoms can be fed into the interface between the active region and the gate insulating film. This has an effect of reducing unpaired bonds that degrade the TFT characteristics.

Next, contact holes are opened in the interlayer insulating film 315, and a multilayered film of metal materials, for example, of titanium nitride and aluminum, is deposited to form electrodes and metal interconnections 316 and 317 of the TFTs. Finally, annealing is performed in a hydrogen atmosphere of 1 atmosphere at 350° C. for 30 minutes to complete the fabrication of the TFTs.

When using the thus fabricated TFT of the present example as an element for switching a pixel electrode, one of the TFT's electrodes and its associated interconnection 316 or 317 are connected to the pixel electrode formed from a transparent conductive film such as ITO, and a signal is applied to the other electrode of the TFT via its associated interconnection. On the other hand, when using the TFT of the present example in thin-film integrated circuit applications, a contact hole is further opened reaching down to the gate electrode 311, and a necessary interconnection is formed.

The TFT fabricated in the above process, in the case of an n-type TFT, exhibits good characteristics such as a field-effect mobility of 120 to 150 $cm^2/V.s$, an S value of 0.2 to 0.4 V/digit, and a threshold voltage of 2 to 3 V. Variations in the characteristics among the numerous TFTs formed on the same substrate 301 are within ±12% for the field-effect mobility and within ±8% for the threshold voltage.

On the other hand, also in the case of a p-type TFT, the TFT fabricated in the above process exhibits good characteristics such as a field-effect mobility of 100 to 140 $cm^2/V.s$, an S value of 0.3 to 0.5 V/digit, and a threshold voltage of −2 to −3 V. Variations in the characteristics among the numerous TFTs formed on the same substrate 301 are within ±10% for the field-effect mobility and within about ±5% for the threshold voltage.

In the above description of the present example, nickel is used as the catalyst element for accelerating the crystallization but it will be appreciated that other elements such as cobalt, palladium, platinum, copper, silver, gold, indium, tin, phosphorus, arsenic, antimony, or aluminum may be used and effects similar to those described above can be obtained.

In the above description, the heat treatment is performed using an excimer laser, which is a pulsed laser, for improving crystallinity of the crystalline silicon film. Alternatively, the same process can be accomplished by using other lasers (for example, a continuous wave Ar laser). Furthermore, instead of using laser light, other techniques such as RTA (rapid thermal annealing) or RTP (rapid thermal processing) may be employed in which a workpiece is heated to high temperatures of 1000° to 1200° C. (silicon monitor temperatures) in a very short period of time using an infrared or flash lamp that provides strong light equivalent in intensity to lasers.

The TFT of the present example may be used not only in a driver circuit or in a pixel portion of an active-matrix liquid-crystal display device but also as an element having a CPU formed on the same substrate.

The above explanation has been described assuming application of the invention to an active-matrix substrate for a liquid-crystal display. However, it will be appreciated that the semiconductor device described therein can be used in other applications, such as a close-contact type image sensor, a driver-monolithic thermal head, a driver-monolithic optical write device or display device using organic electroluminescent (EL) elements as light-emitting elements, and a three-dimensional IC. By utilizing the present invention for these applications, high-performance characteristics of the semiconductor devices, such as a fast response, a high resolution, etc., can be achieved.

Figure 9:
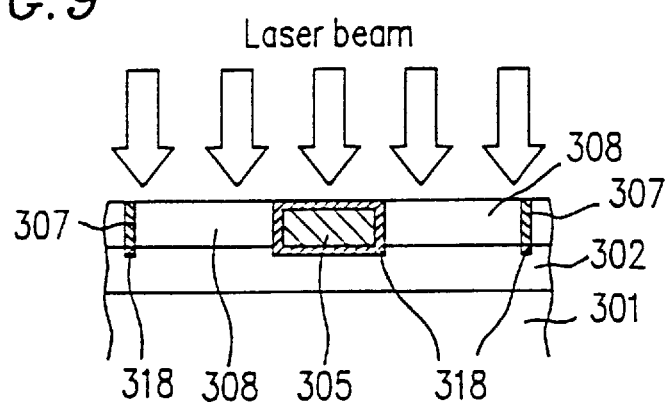
FIG. 9 is a schematic cross section illustrating advantages of the third example of the invention.

When the laser or other intense light is applied with the catalyst element introduced region 305 remaining on the substrate, as shown in FIG. 9, the catalyst elements tend to precipitate on the surface of the introduced region 305, or to diffuse in large quantities into the portions of the base coat film 302 that lie directly below the crystal growth ends 307, resulting in the formation of catalyst element precipitated/diffused regions 318. By contrast, in the method of the present example, as described above, the catalyst element introduced region 305 is removed before the laser or other intense light is applied over the entire surface of the structure. Furthermore, the channel, source, and drain regions of the TFT can be formed using only the regions formed by the lateral crystal growth. This improves reliability and electrical stability of the completed semiconductor device.

When the active regions formed by the method described in the present example are used for fabricating TFTs, a semiconductor device constructed from high-quality TFTs having uniform and stable characteristics can be formed on a large substrate in a simple fabrication process. In particular, when the method of the present example is applied to the fabrication of a liquid-crystal display device, uniformity in the characteristics of pixel switching TFTs required for an active-matrix substrate can be achieved, as well as the high performance characteristics required for TFTs constituting peripheral driver circuitry. As a result, a driver monolithic active-matrix substrate can be realized in which active matrix circuitry and peripheral driver circuitry are formed on the same substrate, leading to reduced module size, increased performance, and reduced cost.

EXAMPLE 4

Figure 10A:
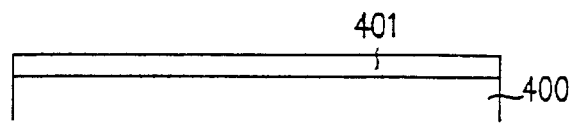
FIGS. 10A to 10O are schematic cross sections illustrating various steps of a method for fabricating a semiconductor device in accordance with a fourth example of the invention.

A fourth example of the invention will be described below with reference to FIGS. 10A to 10O. FIGS. 10A to 10O are schematic cross-sectional diagrams of a semiconductor device at various fabrication steps.

First, as shown in FIG. 10A, a silicon dioxide film as a base coat film 401 is deposited to a thickness of around 100 nm by using a sputtering apparatus onto a cleaned insulating substrate 400 such as glass. The required thickness of the base coat film 401 varies depending on a surface condition of the substrate 400. If the substrate 400 has a sufficiently high degree of surface flatness and a sufficiently low concentration of impurity ions (such as sodium ions) that adversely affect the semiconductor characteristics, the base coat film 401 can be reduced in thickness, or if conditions permitted, can be omitted altogether. On the other hand, in the case of the substrate 400 having a rough surface with scratches, etc., the base coat film 401 needs to be formed so as to have a thickness greater than the above-mentioned dimension.

Figure 10B:
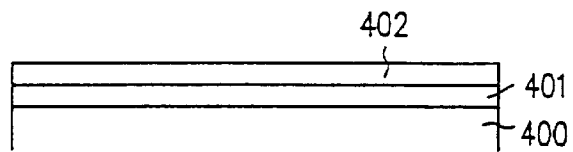

Next, as shown in FIG. 10B, an amorphous silicon film 402 is deposited to a thickness of around 100 nm on the base coat film 401 by using, for example, a chemical vapor deposition (CVD) method or a sputtering method.

Figure 10C:
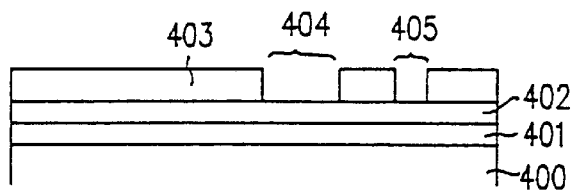
Figure 10D:
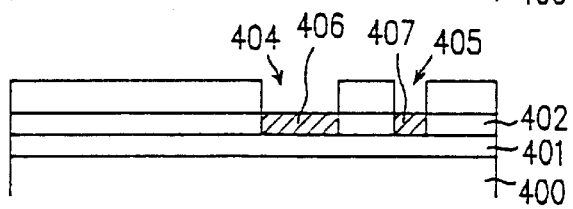

Then, as shown in FIG. 10C, a mask 403 made of silicon oxide or the like is formed on top of the amorphous silicon film 402. The mask 403 has openings 404 and 405 formed therein which are used for selectively introducing catalyst elements to accelerate the crystallization of the amorphous silicon film 402 as well as for forming an alignment mark. Then, catalyst elements are introduced selectively into the amorphous silicon film 402 by using evaporation, sputtering, plasma processing, solution coating, or other techniques. Thus, catalyst element introduced regions 406 and 407 are formed in the portions of the amorphous silicon film 402 which correspond to the openings 404 and 405, as shown in FIG. 10D.

Figure 10E:
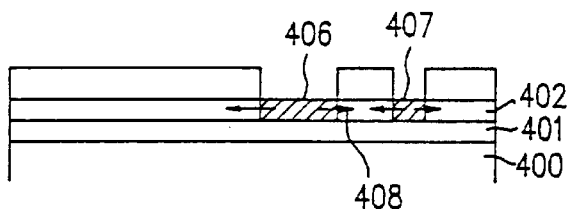
Figure 10F:
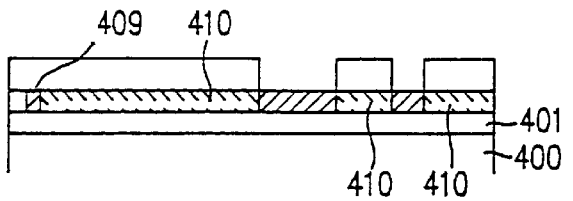

Then, in this state, the whole substrate is subjected to heat treatment. Thus, polycrystallization of the amorphous silicon film 402 occurs first in the catalyst element introduced regions 406 and 407. When the heat treatment is further continued, the polycrystallization proceeds outwardly from the catalyst element introduced regions 406 and 407, that is, in directions substantially parallel to the surface of the substrate 400, as shown in FIG. 10E by arrows 408. When the heat treatment is sufficiently conducted, formed are polycrystallized region 410 in which the polycrystallization has proceeded in the directions substantially parallel to the surface of the substrate 400 as well as crystal growth ends 409 which exist in periphery of the polycrystallized region 410 and contain the introduced catalyst elements at higher concentrations than in the polycrystallized region 410. Typical concentrations of the catalyst elements in the respective regions are; in the range of $1 \times 10^{19}$ to $1 \times 10^{20}$ atoms/cm$^3$ at the crystal growth ends 409, and at around $1 \times 10^{18}$ atoms/cm$^3$ in the polycrystallized regions 410.

Figure 10G:
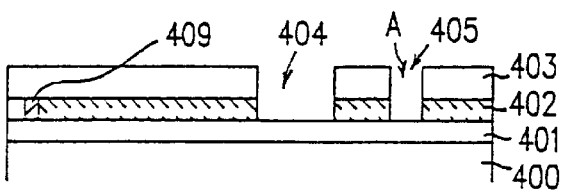

After the heat treatment, the crystallized silicon film 402 is etched by dry etching, as shown in FIG. 10G. Thus, the portions of the silicon film 402 corresponding to the openings 404 and 405, that is, the regions 406 and 407 into which the catalyst elements have been directly introduced are removed. Specifically, removing the portion corresponding to the opening 405 provides an alignment mark A in the silicon film 402. By conducting mask alignment in the subsequent steps with using the alignment mark A, the mask 403 formed for the selective introduction of the catalyst elements can be a first mask. Moreover, although in the present example, the regions 406 and 407 of the silicon film 402 are completely removed, a further etching treatment is not necessarily needed beyond the extent sufficient for easily conducting the mask alignment in the subsequent steps.

Figure 10H:
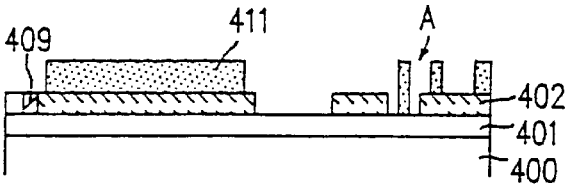

Next, as shown in FIG. 10H, the mask 403 is removed, and a resist pattern 411 is formed by using the alignment mark A as previously formed on the surface of the exposed silicon film 402. The resist pattern 411 is used for the island-like patterning of the silicon film 402 and the formation of an alignment mark to be used for a mask alignment in steps following a gate electrode formation.

Figure 10I:
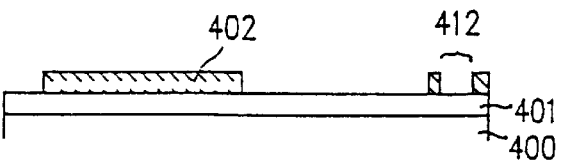

Then, as shown in FIG. 10I, an etching step is conducted to form an island-like silicon film 402 as well as an alignment mark 412 used for a mask alignment in steps following a gate electrode formation. The island-like silicon film 402 is formed in such a manner as to avoid the already-etched regions 406 and 407, the crystal growth ends 409 having a high concentration of the catalyst elements and non-crystallized regions. Although the alignment mark 412 is formed by using the previously formed alignment mark A in the present example, it may be alternatively formed by using the pattern of the mask 403.

Figure 10J:
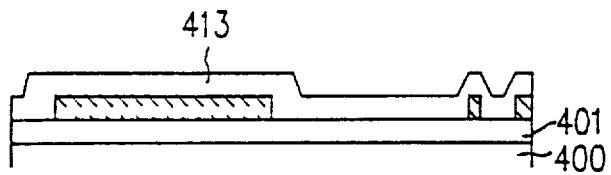
Figure 10K:
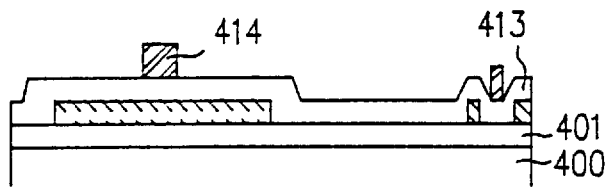
Figure 10L:
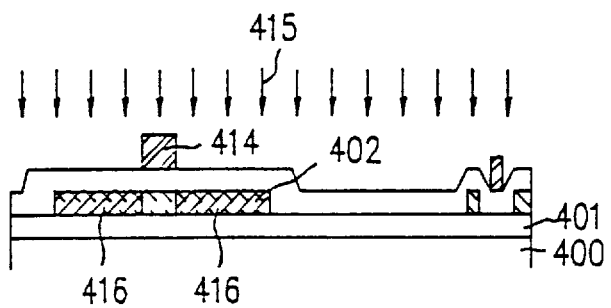

After that, a film 413 is deposited to cover the entire top surface of the substrate 400, as shown in FIG. 10J. The film 413 is used as a gate insulating film. Further, as shown in FIG. 10K, a gate electrode 414 for a TFT is formed at a predetermined position on the film 413.

Next, impurity elements 415 are doped into the island-like silicon film 402 in such a self-aligning manner as using the gate electrode 415 as a mask. As the impurities elements 415, one selected from a V-group element such as phosphorus and a III-group element such as boron is used. By using the gate electrode 414 as a mask, the elements 415 are doped into regions 416 of the silicon film 402 which do not overlap the gate electrode 414. The regions 416 are given p-type or n-type conductivity by the doping of the impurity elements 415 and are to be source and drain regions of TFTs in the subsequent steps.

Figure 10M:
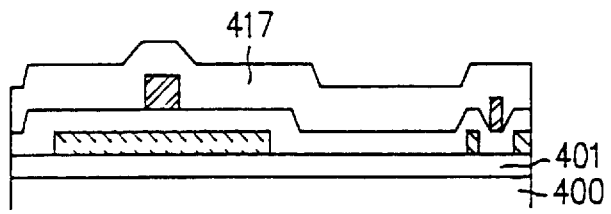
Figure 10N:
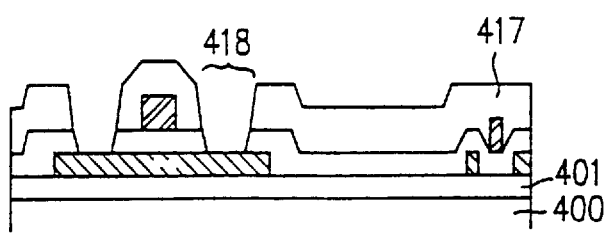
Figure 10O:
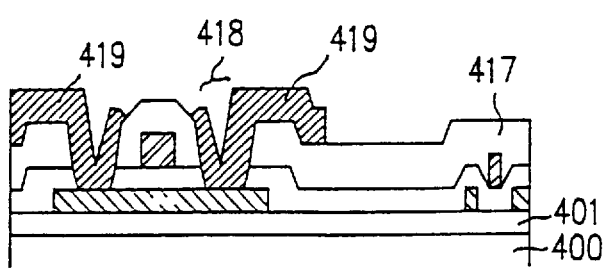

Next, an interlayer insulating film 417 is deposited to cover the entire top surface of the substrate 400, as shown in FIG. 10M. Further, through holes 418 are formed in the interlayer insulating film 417 over the source and drain regions of the TFTs as shown in FIG. 10N. Finally, as shown in FIG. 10O, source and drain electrodes 419 are formed over the interlayer insulating film 417, to complete the fabrication of the TFTs. The source and drain electrodes 419 are formed so that a part thereof fills the through hole 418.

Thus, according to the present example, the catalyst element introduced regions 406 and 407 are entirely etched away. Consequently, the active region of the TFTs fabricated using the silicon film 402 does not overlap the catalyst element introduced regions 406 and 407.

It is not necessary to entirely remove the catalyst element introduced regions 406 and 407. Alternatively, only a portion thereof may be etched away, as long as the active region of the TFTs does not overlap the catalyst element introduced regions 406 and 407. For example, it may be possible that a portion of the regions 406 and 407, which is located nearer to regions in which the TFTs are to be formed later, is etched away, while the other portions which are nearer to the alignment mark 412 remain unetched.

In addition, the crystal growth ends 409 can be removed from the TFT forming region by using the alignment mark A. Furthermore, the new alignment mark 412 is to be formed by using the alignment mark A, and the TFTs are to be formed by using the new alignment mark 412, the TFT forming region does not overlap the catalyst element introduced regions 406 and 407.

EXAMPLE 5

Figure 11A:
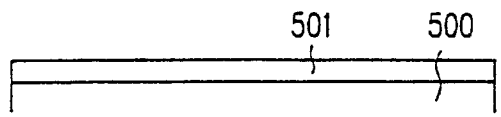
FIGS. 11A to 11O are schematic cross sections illustrating various steps of a method for fabricating a semiconductor device in accordance with a fifth example of the invention.

A fifth example of the invention will be described below with reference to FIGS. 11A to 11O. FIGS. 11A to 11O are schematic cross-sectional diagrams of a semiconductor device at various fabrication steps.

First, as shown in FIG. 11A, a silicon dioxide film as a base coat film 501 is deposited to a thickness of around 100 nm by using a sputtering apparatus onto a cleaned insulating substrate 500 such as glass. The required thickness of the base coat film 501 varies depending on a surface condition of the substrate 500. If the substrate 500 has a sufficiently high degree of surface flatness and a sufficiently low concentration of impurity ions (such as sodium ions) that adversely affect the semiconductor characteristics, the base coat film 501 can be reduced in thickness, or if conditions permitted, can be omitted altogether. On the other hand, in the case of the substrate 500 having a rough surface with scratches, etc., the base coat film 501 needs to be formed so as to have a thickness greater than the above-mentioned dimension.

Figure 11B:
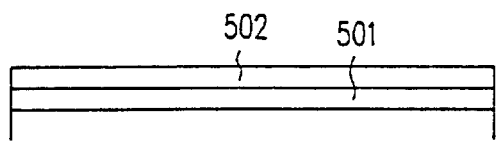

Next, as shown in FIG. 11B, an amorphous silicon film 502 is deposited to a thickness of around 100 nm on the base coat film 501 by using, for example, a chemical vapor deposition (CVD) method or a sputtering method.

Figure 11C:
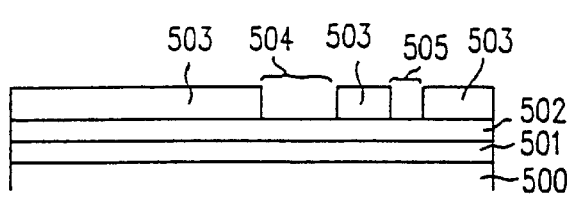
Figure 11D:
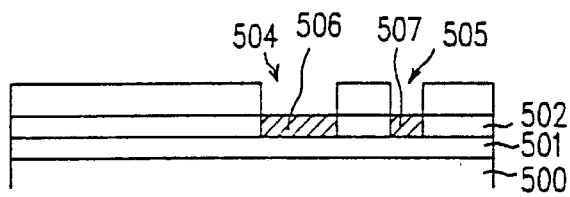

Then, as shown in FIG. 11C, a mask 503 made of silicon oxide or the like is formed on top of the amorphous silicon film 502. The mask 503 has openings 504 and 505 formed therein which are used for selectively introducing catalyst elements to accelerate the crystallization of the amorphous silicon film 502 as well as for forming an alignment mark. Then, catalyst elements are introduced selectively into the amorphous silicon film 502 by using evaporation, sputtering, plasma processing, solution coating, or other techniques. Thus, catalyst element introduced regions 506 and 507 are formed in the portions of the amorphous silicon film 502 which correspond to the openings 504 and 505, as shown in FIG. 11D.

Figure 11E:
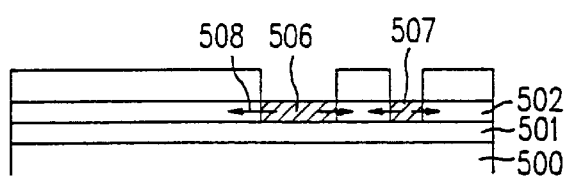
Figure 11F:
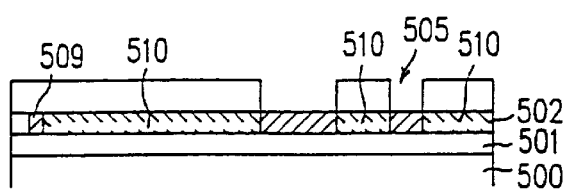

Then, in this state, the whole substrate is subjected to heat treatment. Thus, polycrystallization of the amorphous silicon film 502 occurs first in the catalyst element introduced regions 506 and 507. When the heat treatment is further continued, the polycrystallization proceeds outwardly from the catalyst element introduced regions 506 and 507, that is, in directions substantially parallel to the surface of the substrate 500, as shown in FIG. 11E by arrows 508. When the heat treatment is sufficiently conducted, formed are polycrystallized region 510 in which the polycrystallization has proceeded in the directions substantially parallel to the surface of the substrate 500 as well as crystal growth ends 509 which exist in periphery of the polycrystallized region 510 and contain the introduced catalyst elements at higher concentrations than in the polycrystallized region 510. Typical concentrations of the catalyst elements in the respective regions are; in the range of $1 \times 10^{19}$ to $1 \times 10^{20}$ atoms/cm$^3$ at the crystal growth ends 509, and at around $1 \times 10^{18}$ atoms/cm$^3$ in the polycrystallized regions 510.

Figure 11G:
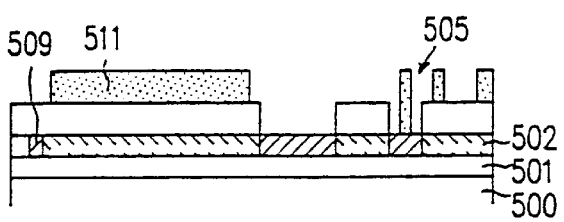

After the heat treatment, a resist pattern 511 is formed by using the opening 505, as shown in FIG. 11G. The resist pattern 511 is used for the island-like patterning of the silicon film 502 and the formation of an alignment mark to be used for a mask alignment in steps following a gate electrode formation.

Figure 11H:
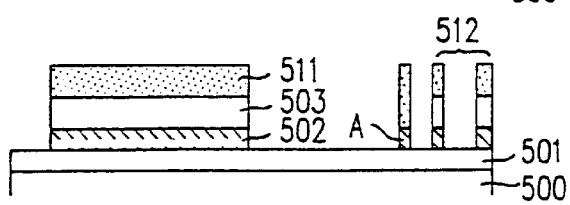

Then, as shown in FIG. 11H, the mask 503 and the silicon film 502 are etched with using the resist pattern 511. The resultant island-like silicon film 502 is formed in such a manner as to avoid the catalyst element introduced regions 506 and 507, the crystal growth ends 509 having a high concentration of the catalyst elements and non-crystallized regions. Furthermore, an alignment mark 512 to be used in a photolithograph step following the formation of a gate electrode is also formed in addition to an alignment mark A. By conducting mask alignment in the subsequent steps with using the alignment mark A or 512 formed in the silicon film 502, the mask 503 can be a first mask. Moreover, although in the present example, the alignment mark 512 is formed by using the resist pattern 511 formed for the islandization of the silicon film 502, it may be alternatively formed by using the pattern of the mask 503.

Figure 11I:
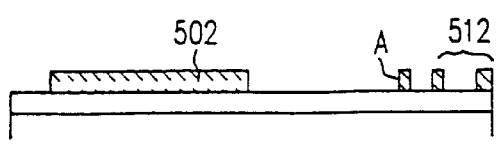
Figure 11J:
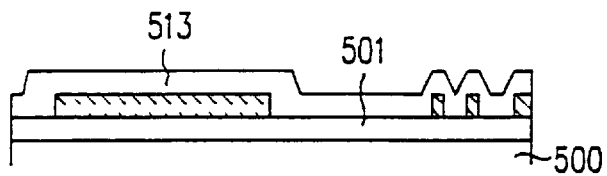
Figure 11K:
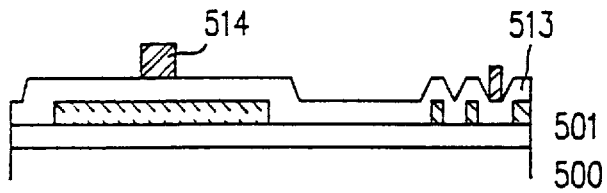
Figure 11L:
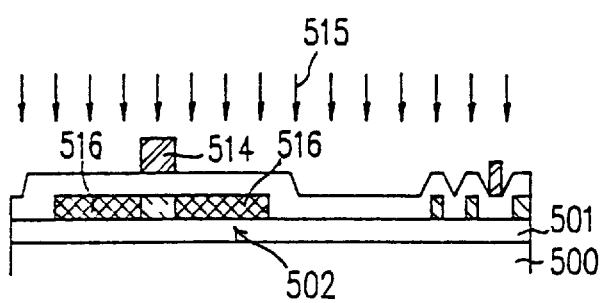

Next, as shown in FIG. 11I, the mask 503 and the resist pattern 511 are removed. After that, a film 513 is deposited to cover the entire top surface of the substrate 500, as shown in FIG. 11J. The film 513 is used as a gate insulating film. Further, as shown in FIG. 11K, a gate electrode 514 for a TFT is formed at a predetermined position on the film 513.

Next, impurity elements 515 are doped into the island-like silicon film 502 in such a self-aligning manner as using the gate electrode 515 as a mask. As the impurities elements 515, one selected from a V-group element such as phosphorus and a III-group element such as boron is used. By using the gate electrode 514 as a mask, the elements 515 are doped into regions 516 of the silicon film 502 which do not overlap the gate electrode 514. The regions 516 are given p-type or n-type conductivity by the doping of the impurity elements 515 and are to be source and drain regions of TFTs in the subsequent steps.

Figure 11M:
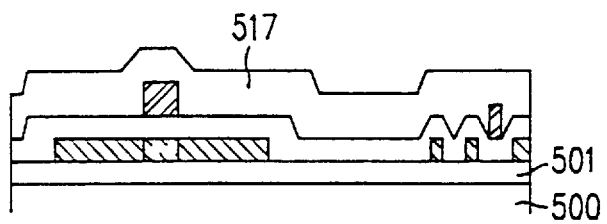
Figure 11N:
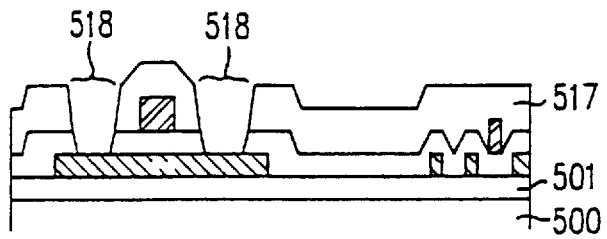
Figure 11O:
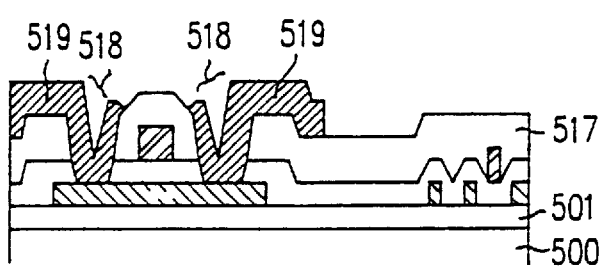

Next, an interlayer insulating film 517 is deposited to cover the entire top surface of the substrate 500, as shown in FIG. 11M. Further, through holes 518 are formed in the interlayer insulating film 517 over the source and drain regions of the TFTs as shown in FIG. 11N. Finally, as shown in FIG. 11O, source and drain electrodes 519 are formed over the interlayer insulating film 517, to complete the fabrication of the TFTs. The source and drain electrodes 519 are formed so that a part thereof fills the through hole 518.

Thus, according to the present example, the catalyst element introduced regions 506 and 507 are entirely etched away. Consequently, the active region of the TFTs fabricated using the silicon film 502 does not overlap the catalyst element introduced regions 506 and 507.

It is not necessary to entirely remove the catalyst element introduced regions 506 and 507. Alternatively, only a portion thereof may be etched away, as long as the active region of the TFTs does not overlap the catalyst element introduced regions 506 and 507. For example, it may be possible that a portion of the regions 506 and 507, which is located nearer to regions in which the TFTs are to be formed later, is etched away, while the other portions which are nearer to the alignment mark 512 remain unetched.

EXAMPLE 6

Figure 12A:
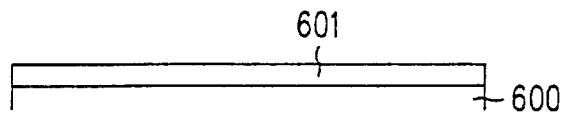
FIGS. 12A to 12T are schematic cross sections illustrating various steps of a method for fabricating a semiconductor device in accordance with a sixth example of the invention.

A sixth example of the invention will be described below with reference to FIGS. 12A to 12T. FIGS. 12A to 12T are schematic cross-sectional diagrams of a semiconductor device at various fabrication steps.

First, as shown in FIG. 12A, a silicon dioxide film as a base coat film 601 is deposited to a thickness of around 100 nm by using a sputtering apparatus onto a cleaned insulating substrate 600 such as glass. The required thickness of the base coat film 601 varies depending on a surface condition of the substrate 600. If the substrate 600 has a sufficiently high degree of surface flatness and a sufficiently low concentration of impurity ions (such as sodium ions) that adversely affect the semiconductor characteristics, the base coat film 601 can be reduced in thickness, or if conditions permitted, can be omitted altogether. On the other hand, in the case of the substrate 600 having a rough surface with scratches, etc., the base coat film 601 needs to be formed so as to have a thickness greater than the above-mentioned dimension.

Figure 12B:
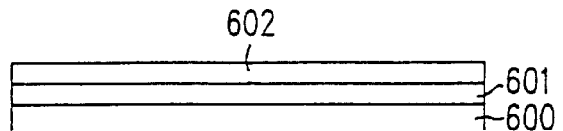

Next, as shown in FIG. 12B, an amorphous silicon film 602 is deposited to a thickness of around 100 nm on the base coat film 601 by using, for example, a chemical vapor deposition (CVD) method or a sputtering method.

Figure 12C:
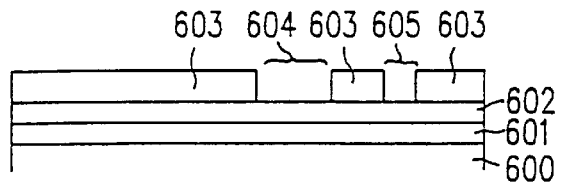
Figure 12D:
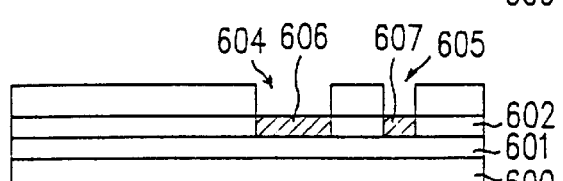
Figure 12E:
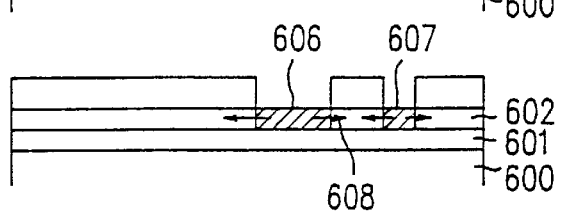
Figure 12F:
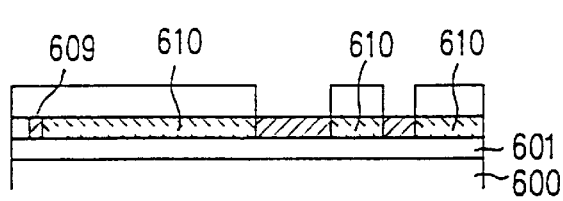

Then, as shown in FIG. 12C, a mask 603 made of silicon dioxide or the like is formed on top of the amorphous silicon film 602. The mask 603 has openings 604 and 605 formed therein which are used for selectively introducing catalyst elements to accelerate the crystallization of the amorphous silicon film 602 as well as for forming an alignment mark. Then, catalyst elements are introduced selectively into the amorphous silicon film 602 by using evaporation, sputtering, plasma processing, solution coating, or other techniques. Thus, catalyst element introduced regions 606 and 607 are formed in the portions of the amorphous silicon film 602 which correspond to the openings 604 and 605, as shown in FIG. 12D. Especially, the region 607 corresponding to the opening 605 to be used for forming an alignment mark typically has such a shape as shown in FIG. 12I.

Then, in this state, the whole substrate is subjected to heat treatment. Thus, polycrystallization of the amorphous silicon film 602 occurs first in the catalyst element introduced regions 606 and 607. When the heat treatment is further continued, the polycrystallization proceeds outwardly from the catalyst element introduced regions 606 and 607, that is, in directions substantially parallel to the surface of the substrate 600, as shown in FIG. 12E by arrows 608. When the heat treatment is sufficiently conducted, formed are polycrystallized region 610 in which the polycrystallization has proceeded in the directions substantially parallel to the surface of the substrate 600 as well as crystal growth ends 609 which exist in periphery of the polycrystallized region 610 and contain the introduced catalyst elements at higher concentrations than in the polycrystallized region 610. Typical concentrations of the catalyst elements in the respective regions are; in the range of $1 \times 10^{19}$ to $1 \times 10^{20}$ atoms/cm$^3$ at the crystal growth ends 609, and at around $1 \times 10^{18}$ atoms/cm$^3$ in the polycrystallized regions 610.

Figure 12G:
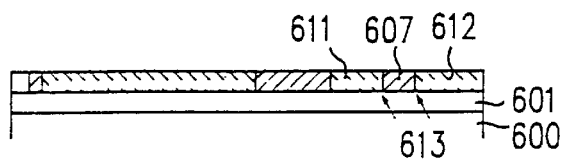
Figure 12H:
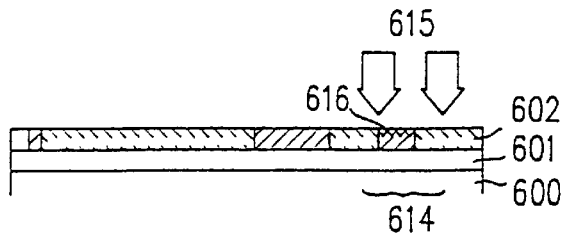
Figure 12I:
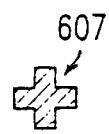
Figure 12J:
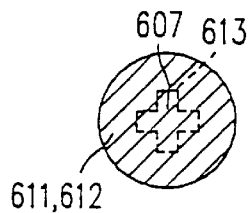
Figure 12K:
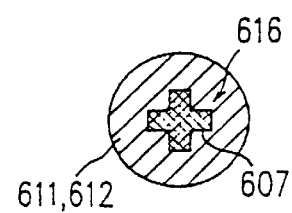

After the heat treatment, the mask 603 is removed, as shown in FIG. 12G. At this state, as shown in FIG. 12J, a boundary 613 between the region 607 in which the catalyst elements have been introduced and regions 611 and 612 in which no catalyst elements have been introduced is not significantly clear and has to be recognized by a subtle difference in shade between the regions. Thus, in order to make the boundary 613 clearer, a region 614 around the alignment mark is irradiated with an XeCl laser beam 615 having a wavelength of 308 nm, as shown in FIG. 12H. Alternatively, a KrF laser beam having a wavelength of 248 nm may be used. This produces a roughened surface 616 in the region 607 in which the catalyst elements have been introduced and thus has a high concentration thereof. As a result, the alignment mark comes to be easily recognized and the boundary 613 becomes clear.

The laser irradiation conditions for the above treatment depend on such parameters as the concentration of the catalyst elements or a thickness of a polycrystalline silicon film. Preferably, the energy density is set at around 200 to 400 mJ/cm$^2$. More specifically, the energy density is set at 250 to 300 mJ/cm$^2$ when the polycrystalline silicon film is 100 nm thick.

By conducting mask alignment in the subsequent steps with using the alignment mark 616 formed in the silicon film 602, the mask 603 can be a first mask.

Figure 12L:
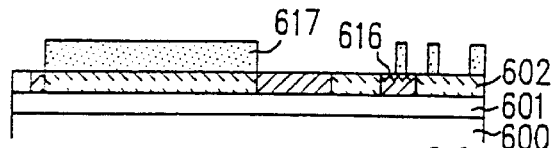

Then, as shown in FIG. 12L, a resist pattern 617 is formed by using the alignment mark 616. The resist pattern 617 is used for the island-like patterning of the silicon film 602 and the formation of an alignment mark to be used for a mask alignment in steps following a gate electrode formation.

Figure 12M:
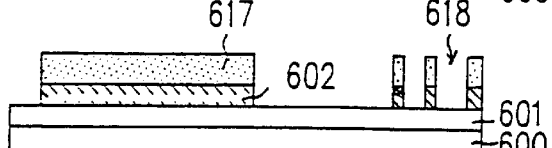

Then, as shown in FIG. 12M, the silicon film 602 is etched with using the resist pattern 617. The resultant island-like silicon film 602 is formed in such a manner as to avoid the catalyst element introduced regions 606 and 607, the crystal growth ends 609 having a high concentration of the catalyst elements and non-crystallized regions. Furthermore, a part of the alignment mark 616 as well as another alignment mark 618 to be used after a formation of a gate electrode are also formed simultaneously in the silicon film 602. Moreover, although in the present example, the alignment mark 618 is formed by using the resist pattern 617 formed for the islandization of the silicon film 602, it may be alternatively formed by using the pattern of the mask 603.

Figure 12N:
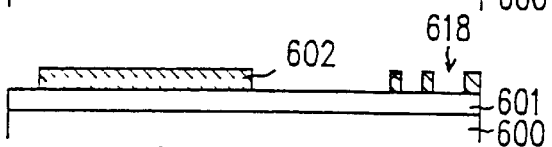
Figure 12O:
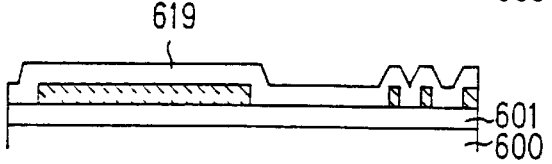
Figure 12P:
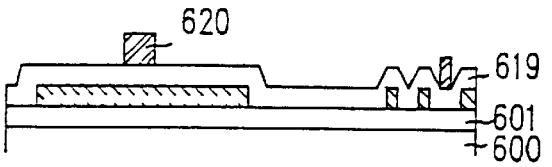
Figure 12Q:
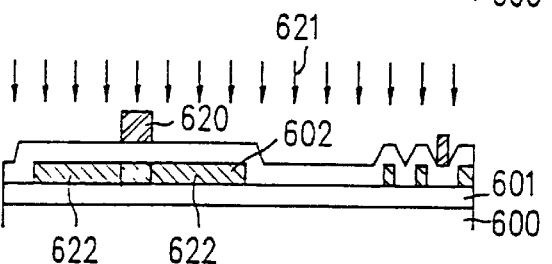

Next, as shown in FIG. 12N, the resist pattern 617 is removed. After that, a film 619 is deposited to cover the entire top surface of the substrate 600, as shown in FIG. 12O. The film 619 is used as a gate insulating film. Further, as shown in FIG. 12P, a gate electrode 620 for a TFT is formed at a predetermined position on the film 619.

Next, impurity elements 621 are doped into the island-like silicon film 602 in such a self-aligning manner as using the gate electrode 620 as a mask. As the impurities elements 621, one selected from a V-group element such as phosphorus and a III-group element such as boron is used. By using the gate electrode 620 as a mask, the elements 621 are doped into regions 622 of the silicon film 602 which do not overlap the gate electrode 620. The regions 622 are given p-type or n-type conductivity by the doping of the impurity elements 621 and are to be source and drain regions of TFTs in the subsequent steps.

Figure 12R:
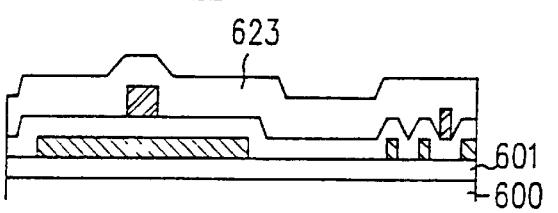
Figure 12S:
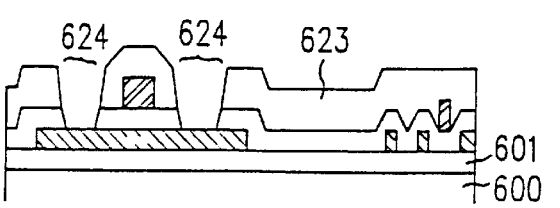
Figure 12T:
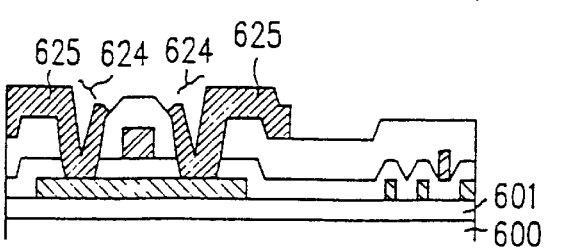

Next, an interlayer insulating film 623 is deposited to cover the entire top surface of the substrate 600, as shown in FIG. 12R. Further, through holes 624 are formed in the interlayer insulating film 623 over the source and drain regions of the TFTs as shown in FIG. 12S. Finally, as shown in FIG. 12T, source and drain electrodes 625 are formed over the interlayer insulating film 623, to complete the fabrication of the TFTs. The source and drain electrodes 625 are formed so that a part thereof fills the through hole 624.

Thus, according to the present example, the catalyst element introduced regions 606 and 607 are entirely etched away. Consequently, the active region of the TFTs fabricated using the silicon film 602 does not overlap the catalyst element introduced regions 606 and 607.

It is not necessary to entirely remove the catalyst element introduced regions 606 and 607. Alternatively, only a portion thereof may be etched away, as long as the active region of the TFTs does not overlap the catalyst element introduced regions 606 and 607. For example, it may be possible that a portion of the regions 606 and 607, which is located nearer to regions in which the TFTs are to be formed later, is etched away, while the other portions which are nearer to the alignment mark 616 remain unetched.

As described above, according to the fourth to sixth examples of the invention, a mask is formed which is provided with openings used for the formation of an alignment mark and also for selective introduction of the catalyst elements into the silicon film to accelerate the crystallization. The mask is used as the reference to form an alignment mark in the silicon film for mask alignment. This enables the lateral crystal growth region to be aligned precisely with the TFT device region (active region). Specifically, autoalignment between the lateral crystal growth region and the TFT device region (active region) can be achieved, which has previously been extremely difficult. This can open the way for mass production of large-scale semiconductor devices using crystalline semiconductor films.

The alignment mark can be formed using an opening in the mask. When the alignment mark is a recess formed in the silicon film on the substrate, it can be easily distinguished. On the other hand, if the alignment mark is coplanar with other portions of the silicon film and its boundary is not easily distinguishable, the boundary can be revealed by irradiation of light energy for an easy distinction. Furthermore, by forming a suitable shape on the silicon film, auto-alignment essential for mass production can be accomplished in the photolithograph step.

By selecting at least one element from Ni, Co, Pd, Pt, Fe, Cu, Ag, Au, In, Sn, P, As, and Sb as the catalyst element, the processing temperature can be reduced in the heat treatment for polycrystallizing the silicon film, allowing the use of glass substrates.

When the concentration of the catalyst elements introduced is set at a value between $1 \times 10^{18}$ atoms/cm$^3$ and $1 \times 10^{20}$ atoms/cm$^3$, a crystal growth range sufficient for the fabrication of TFTs using the lateral crystal growth regions can be obtained, and yet, degradation in the TFT characteristics caused by excessive introduction of the catalyst elements into the silicon film can be prevented.

Furthermore, since it is possible to control the crystal growth direction, TFTs of opposite conductivity types can be fabricated simultaneously on the same substrate. For example, when fabricating an active-matrix TFT-LCD, TFTs for use in peripheral driver circuitry, for which a high mobility is required, are formed so that a carrier moving direction during its operation coincides with the crystal growth direction in the crystalline silicon film, while TFTs for pixels, for which a leakage current needs to be reduced, are formed so that the carrier moving direction during its operation is perpendicular to the crystal growth direction in the crystalline silicon film. In this manner, TFTs having characteristics suitable for respective functions can be formed simultaneously on the same substrate.

As described above, mass production of large-scale semiconductor devices can be achieved at low production costs.

EXAMPLE 7

In this example, several examples of device region arrangements for the semiconductor device according to the present invention are described.

Figure 13:
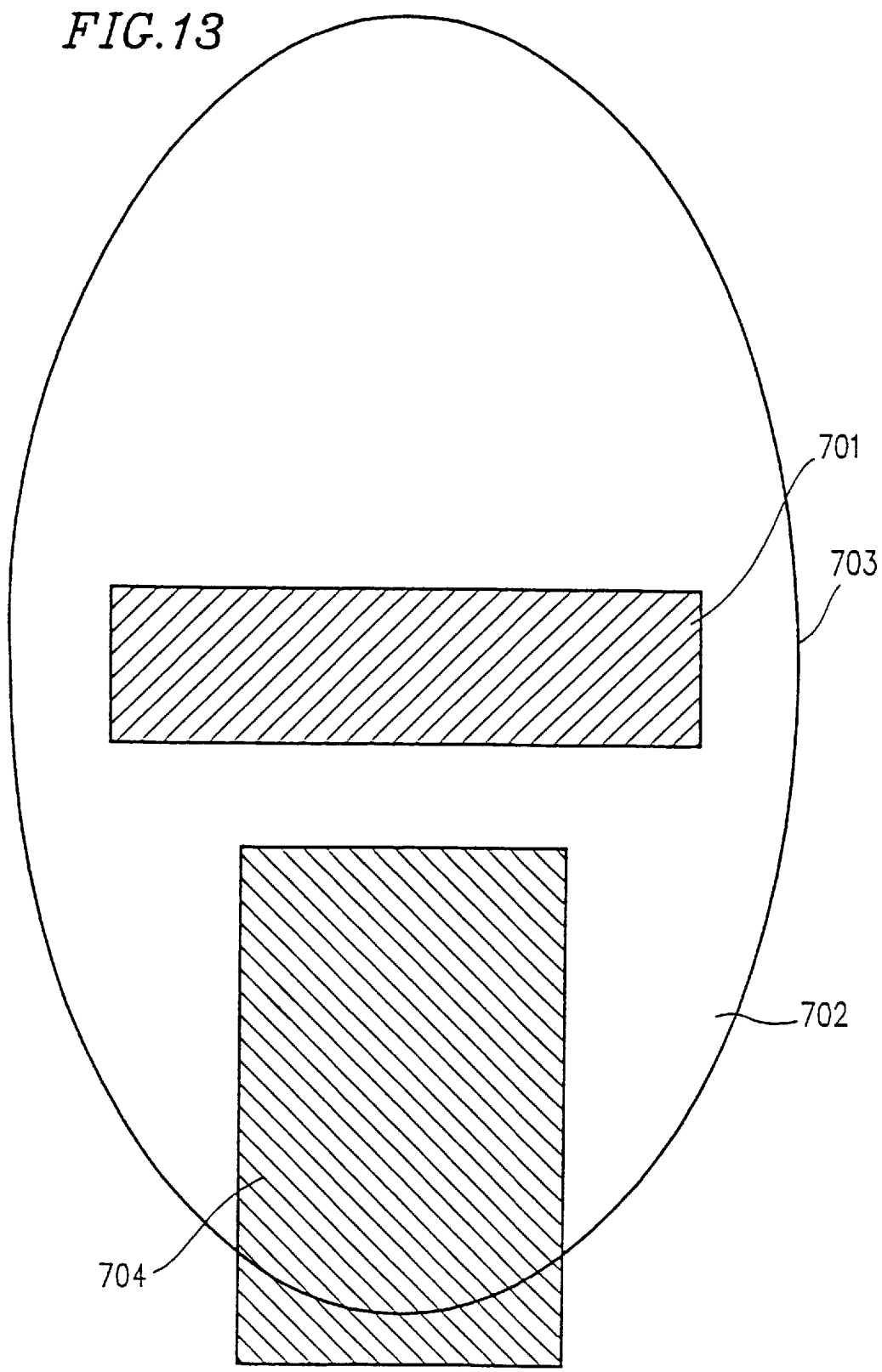
FIG. 13 is a plan view schematically illustrating a fabricating position, on a substrate, of a thin film transistor to be fabricated in accordance with the invention.

In the example shown in FIG. 13, a silicon film at least a portion of which is formed as a polycrystalline region 702 is formed on top of an insulating film (not shown) formed on the surface of a substrate not shown. The polycrystalline region 702 is formed by the lateral crystal growth of a region 701 which is narrower than the polycrystalline region 702 and in which catalyst elements have been introduced selectively. The end of the polycrystalline region 702 corresponds to the growth end 703 of the lateral crystal growth.

In the example of FIG. 13, a device region 704, where a TFT is formed, is arranged so as not to overlap the catalyst element introduced region 701 in the polycrystalline region 702. In this arrangement, though a portion of the growth end 703 crosses the device region 704, a TFT having a high mobility can be fabricated by appropriately positioning source and drain regions of the TFT.

Figure 14:
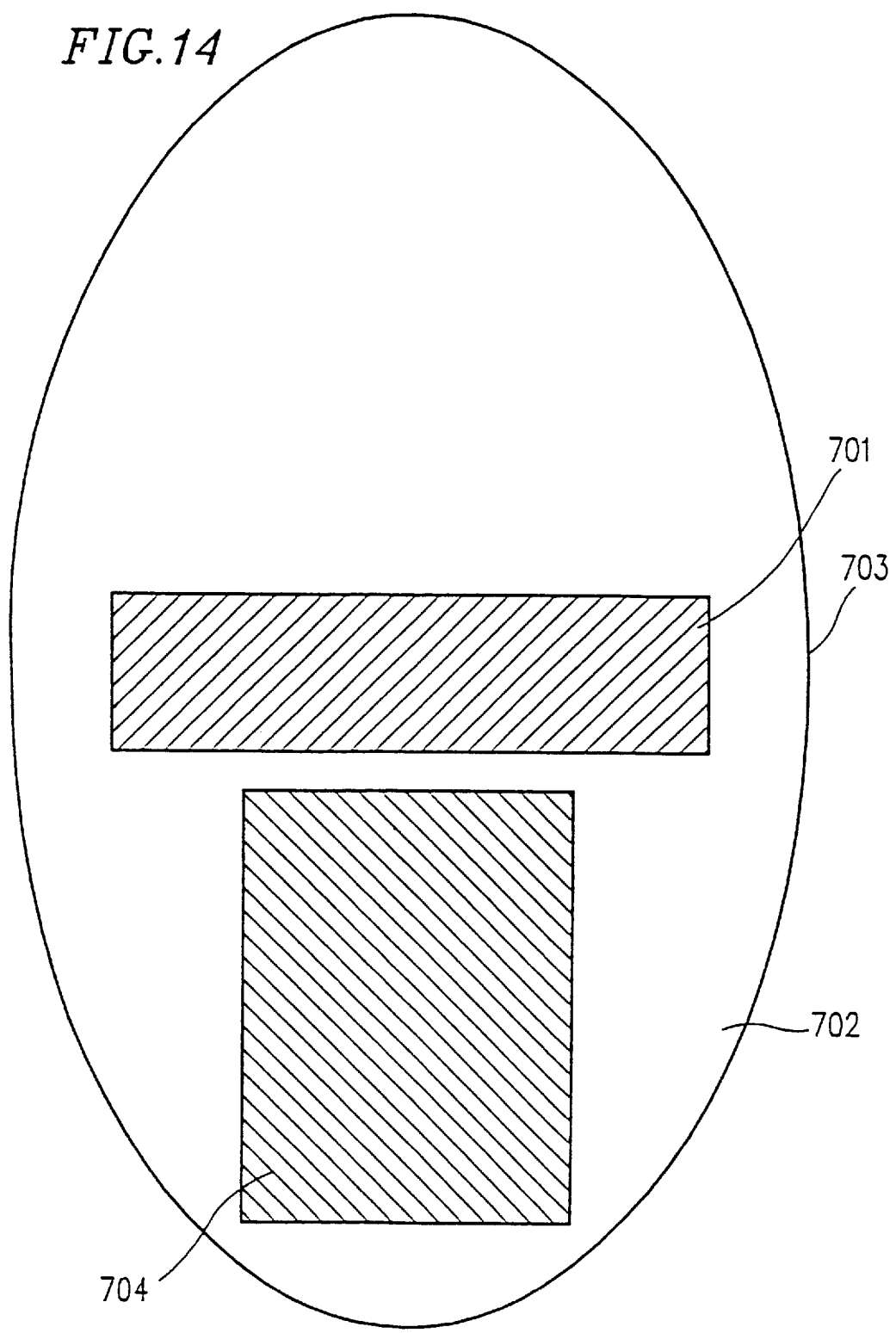
FIG. 14 is another plan view schematically illustrating a fabricating position on, a substrate, of a thin film transistor to be fabricated in accordance with the invention.

On the other hand, in the example shown in FIG. 14, the device region 704, where the TFT is formed, is located in a position that does not overlap the catalyst element introduced region 701 and that is inside the lateral growth end 703. In this arrangement, since the growth end 703 does not cross the device region 704, a TFT having a high mobility or a TFT having a large on-off ratio can be fabricated in accordance with needs, without giving special consideration to the fabrication position of the TFT.

Furthermore, in the arrangements shown in FIGS. 13 and 14, when the carrier moving direction in the channel region is made to coincide with the crystal growth direction, no crystal grain boundaries exist in the carrier moving direction, which contributes to further improvement of the mobility for the TFT. On the other hand, when the carrier moving direction in the TFT channel region is made to intersect at right angles to the crystal growth direction, no grain boundaries are formed in the edge portion of the drain region where the electric field is concentrated; this reduces the grain boundary trap density in the edge portion of the drain region that can cause degradation of the characteristics during TFT operation, and thus, a TFT having a large on-off ratio can be fabricated. In other words, a high-mobility TFT can be realized when the TFT is formed so that the conducting direction of the TFT is made substantially parallel to the growing direction of the crystal grains of the silicon film; on the other hand, when the TFT is formed so that the conducting direction of the TFT is made substantially perpendicular to the growing direction of the crystal grains of the silicon film, the grain boundary trap density in the edge portion of the drain region can be reduced.

Further, by arranging the device region of the TFT so as not to overlap the region where the catalyst element are to be introduced to accelerate the crystallization of the amorphous semiconductor film, as described above, degradation of the TFT characteristics in the catalyst element introduced region can be avoided. Furthermore, by arranging the device region of the TFT inside of the lateral crystal growth end, the grain boundary trap density in the edge portion of the drain region can be reduced, and contact failure can be prevented. These arrangements greatly contribute to increasing the fabrication yield which is particularly vital in the fabrication of large-scale semiconductor devices.

In the above, the silicon film is formed on top of the insulating film formed on the surface of the substrate, but the formation of the semiconductor film is not limited to the above illustrated arrangement. For example, the silicon film may be formed directly on an insulating substrate or on top of an insulating film formed thereon.

EXAMPLE 8

An eighth example of the invention will be described below with reference to FIGS. 15A, 15B and 16A to 16F. In the present example, it is explained in the case where the invention is applied to the fabrication of an n-type TFT on a glass substrate. The TFT of the present example may be used in a driver circuit or in a pixel portion of an active-matrix liquid-crystal display device, and further as a semiconductor element having a CPU formed on the same substrate. Furthermore, it will be appreciated that the application of the TFT obtained in accordance with the present invention is not limited to the liquid crystal device but also to the generally called thin-film integrated circuit.

Figure 15A:
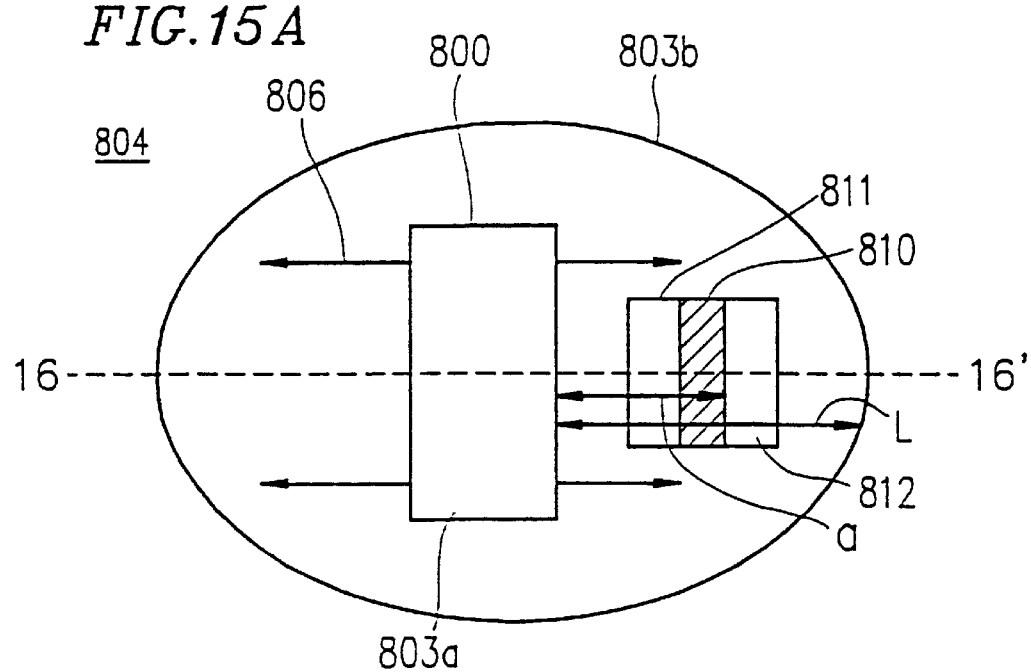
FIGS. 15A and 15B are top plan views illustrating an example of a configuration of a thin film transistor fabricated in accordance with an eighth example of the invention.
Figure 15B:
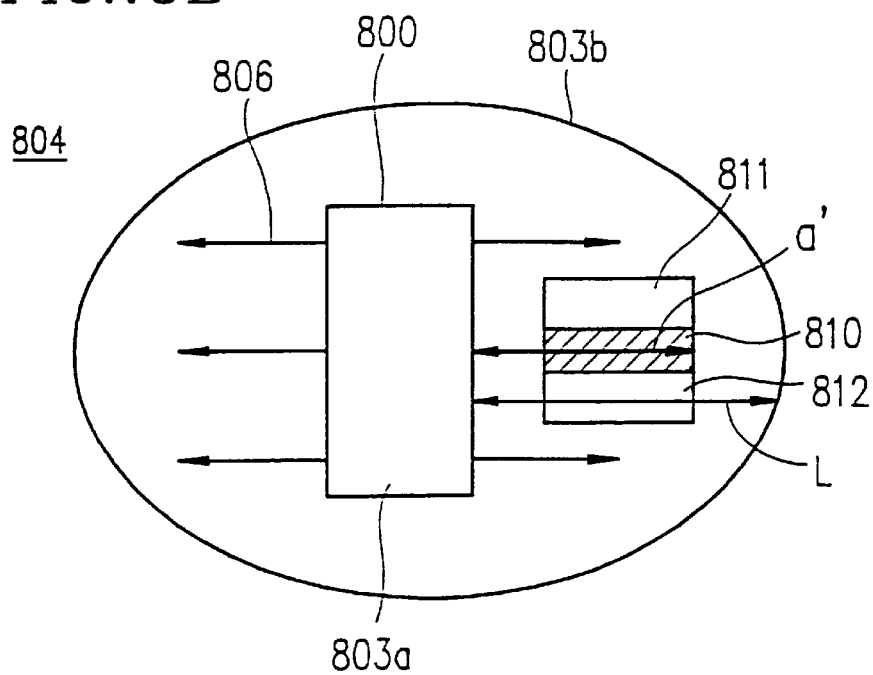

FIGS. 15A and 15B are plan views of a TFT fabricated using a lateral crystal growth region in accordance with the present example as viewed from top of the substrate. FIGS. 16A to 16F are cross-sectional views obtained along a line 16—16' in FIG. 15A, and the fabrication steps proceed as the figure numbers increase. Specifically, the cross sectional view obtained along the line 16—16' in FIG. 15A corresponds to FIGS. 16E or 16F.

In the present example described below, a TFT is fabricated in such a manner that a source region 811, a channel region 810 and a drain region 812 are arranged in this order along a direction perpendicular to a longer side of a region 800, as shown in FIG. 15A. Alternatively, the TFT may be similarly fabricated without any disadvantages in such a manner that the source region 811, the channel region 810 and the drain region 812 are arranged in this order along a direction parallel to a longer side of a region 800, as shown in FIG. 15B.

Figure 16A:
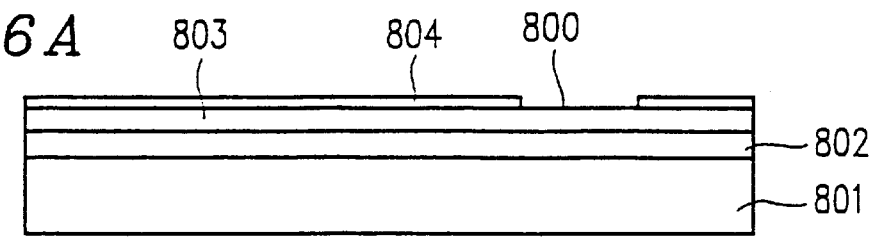
FIGS. 16A to 16F are schematic cross sections obtained along a line 16—16' in FIG. 15A, illustrating various steps of a method for fabricating a semiconductor device in accordance with the eighth example of the invention.

First, as shown in FIG. 16A, a base coat film 802 formed from silicon oxide of a thickness of about 200 nm is deposited by sputtering on a glass substrate 801. The base coat film 802 is formed for preventing diffusion of impurities from the glass substrate 801. Next, by low-pressure CVD or plasma CVD, an intrinsic (I-type) amorphous silicon film 803 is deposited to a thickness of 25 to 100 nm, for example, to 80 nm.

Then, a mask 804 made of a silicon oxide film or a silicon nitride film is formed on top of the amorphous silicon film 803. The mask 804 has an opening formed therein through which a portion of the amorphous silicon film is exposed in a slit-like manner. The top view of the state in FIG. 16A looks like FIGS. 15A and 15B in which a predetermined region 800 of the amorphous silicon film is exposed through the opening in a slit-like manner, while the other regions are covered by the mask 804.

Figure 16B:
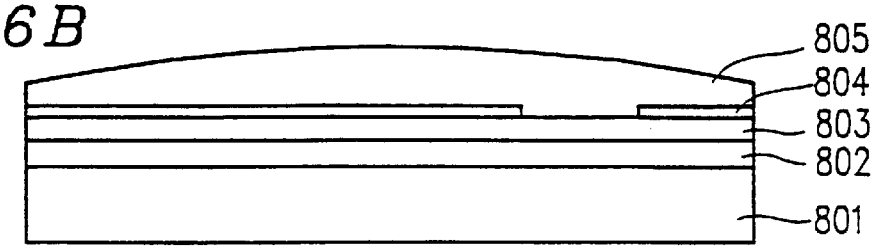
Figure 16C:
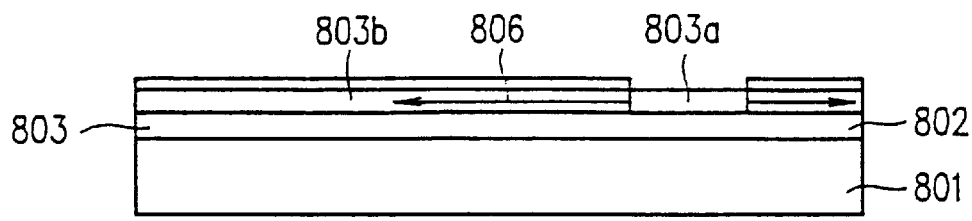

After providing the mask 804, as shown in FIG. 16B, an aqueous solution 805 of nickel salt such as nickel acetate or nickel nitrate is applied on the entire surface of the glass substrate 801. Then, a drying step is conducted after a film of the aqueous solution 805 applied with a spinner is made to have a uniform thickness. A nickel concentration in the aqueous solution 805 is set in the range from 50 to 200 ppm, preferably, at 100 ppm. In the region 800, precipitated nickel ions are in contact with the amorphous silicon film 803, whereby a small amount of nickel is introduced into the region 800 of the amorphous silicon film 803. Then, the entire substrate is subject to heat treatment in a hydrogen reducing atmosphere, preferably with a partial pressure of hydrogen of 0.1 to 1 atmosphere, or in an inert atmosphere, at temperatures 520° to 580° C. for several to tens of hours; for example, the heat treatment is conducted at 580° C. for 16 hours. Thus, the amorphous silicon film 803 is crystallized.

In the region 800 in which a small amount of nickel has been selectively introduced, the crystallization of the amorphous silicon film 803 occurs in a direction perpendicular to the glass substrate 801, thus forming a crystalline silicon film 803*a*. Around the region 800, the crystal growth proceeds in lateral directions (in direction parallel to the surface of the substrate 801) from the region 800, as indicated by arrows 806 in FIG. 16C, thus forming a crystalline silicon film 803*b* by the lateral crystal growth. The other portions of the amorphous silicon film 803 remain in an amorphous state without crystallization. Typically, a range L of the lateral crystal growth in the direction parallel to the substrate 801 as indicated by the arrows 806 is about 140 μm.

Figure 16D:
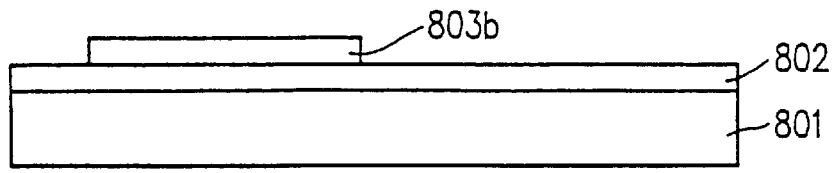

Next, the mask 804 and undesired portions of the crystalline silicon film 803*b* are removed to provide device isolation. As a result, a crystalline silicon film 803*b* patterned in an island manner as shown in FIG. 16D is obtained. The islandized crystalline silicon film 803*b* is used as an active region, i.e., a source region 811, a drain region 812 and a channel region 810, of a TFT in subsequent steps.

At this moment, the crystalline silicon film 803*b* is patterned in such a manner that the portion to be the channel region 810 of the TFT is arranged within a distance a=120 μm from the catalyst element (Ni in the present example) introduced region 800. In other words, the channel region 810 of the TFT is formed so that the distance a in FIG. 15A is equal to or less than 120 μm. The distance a is set to be preferably equal to or less than 60 μm, and more preferably, equal to or less than 30 μm for obtaining desirable advantages for the above reasons. Specifically in the present example, the crystalline silicon film 803*b* is patterned so that the distance a becomes 20 μm.

On the other hand, in the case where the TFT is fabricated in such a configuration as shown in FIG. 15B, the crystalline silicon film 803*b* is patterned so that the distance a', from a near side of the region 800 to the channel region 810 to a far side of the channel region 810 to the region 800, is equal to or less than 120 μm. Thus, similar advantages to those explained above are achieved.

After that, a silicon oxide film is deposited to a thickness of 20 to 150 nm, for example, to 100 nm, as a gate insulating film 807 over the crystalline silicon film 803*b* which is to be the active region of the TFT. TEOS is used as material for the deposition of the silicon oxide film; that is, TEOS and oxygen are decomposed and deposited in an RF plasma CVD process to form the film, while holding the substrate at temperatures of 150° to 600° C., preferably at 300° to 450° C. Alternatively, this film may be formed by decomposing and depositing TEOS and ozone gas in a low-pressure CVD or normal-pressure CVD process while holding the substrate at temperatures 350° to 600° C., preferably at 400° to 550° C.

After forming the gate insulating film 807, to improve bulk characteristics of the gate insulating film 807 itself as well as interface characteristics between the crystalline silicon film 803*b* and the gate insulating film 807, annealing is performed in an inert gas atmosphere at temperatures of 400° to 600° C. for 30 to 60 minutes. After that, an aluminum film is deposited by sputtering to a thickness of 400 to 800 nm, for example, to 600 nm. The aluminum film is then patterned to form a gate electrode 808.

Further, the gate electrode 808 is anodic-oxidized to form an oxide layer 809 on the surface of the gate electrode 808. The anodic oxidation is performed, for example, by immersing the substrate in an ethylene glycol solution containing 1 to 5% tartaric acid and raising an applied voltage to 220 V while keeping a current constant, and by holding the substrate in that condition for one hour. A thickness of the thus formed oxide layer 809 is typically 200 nm. This oxide layer 809 is used to form an offset gate region in an ion doping step performed later. A length of the offset gate region can therefore be determined by controlling the thickness of the oxide layer 809 by suitably setting parameters of the anodic oxidation step.

Next, using the gate electrode 808 and the oxide layer 809 on the surface thereof as a mask, impurity ions (phosphorus) are doped into the crystalline silicon film 803*b* by an ion doping method. More specifically, phosphine ($PH_3$) is used as a doping gas, and an acceleration voltage is set at 60 to 90 kV, for example, at 80 kV and a dose is set at $1 \times 10^{15}$ to $8 \times 10^{15}$ cm$^{-2}$, for example, at $2 \times 10^{15}$ cm$^{-2}$. Regions 811*a* and 812*a* doped with the impurities by the ion doping step are later used as the source and drain regions 811 and 812 of the TFTs, and a region 810*a*, masked by the gate electrode 808 and the oxide layer 809 so as not to be doped with the impurities, is later used as the channel region 810 of the TFTs.

Figure 16E:
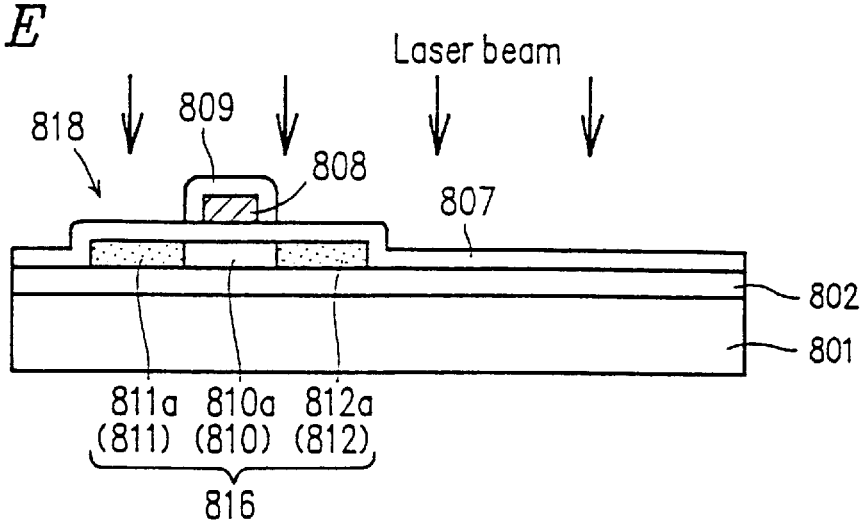

Next, as shown in FIG. 16E, a laser beam is applied for annealing in order to activate the thus doped impurities as well as to improve crystallinity of the crystalline silicon film degraded in the above laser doping step. An XeCl excimer laser (a wavelength of 308 nm and a pulse width of 40 ns), for example, may be used as the laser source. An energy density of the laser light is set at 150 to 400 mJ/cm$^2$, preferably, 200 to 250 mJ/cm$^2$ for the irradiation. A sheet resistance of the regions 811 and 812, in which the impurities have been thus doped, is typically 200 to 800 Ω/□.

Next, a silicon oxide film or silicon nitride film is deposited as an interlayer insulating film 813 to a thickness of about 600 nm. In the case of a silicon oxide film, it is deposited by plasma CVD using TEOS and oxygen, or by low-pressure CVD or normal-pressure CVD using TEOS and ozone. The interlayer insulating film 813 thus deposited provides excellent step coverage to sufficiently cover steps on the substrate surface. Alternatively, if the interlayer insulating film 813 is formed from a silicon nitride film deposited by plasma CVD using $SiH_4$ and $NH_3$ as material gases, hydrogen atoms can be fed into the interface between the active region 816, including a source region 811, a channel region 810 and a drain region 812, and the gate insulating film 807. This has an effect of reducing unpaired bonds that degrade the TFT characteristics.

Figure 16F:
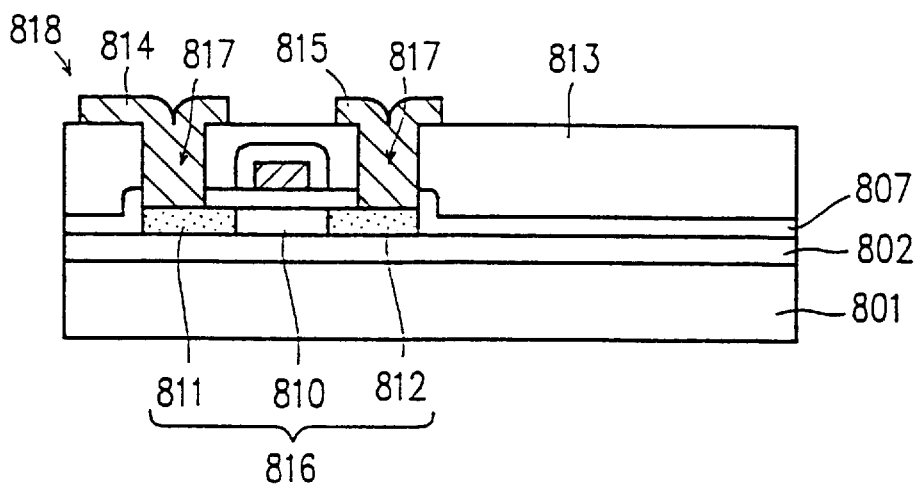

Next, contact holes 817 are opened in the interlayer insulating film 813, and a multilayered film of metal materials, for example, of titanium nitride and aluminum, is deposited to form electrodes and metal interconnections 814 and 815 of the TFTs. Finally, annealing is performed in a hydrogen atmosphere of 1 atmosphere at 350° C. for 30 minutes, to complete the fabrication of the TFT 818 as shown in FIG. 16F.

When using the thus fabricated TFT 818 of the present example as an element for switching a pixel electrode of an active-matrix liquid crystal device, one of the electrodes and its associated interconnection 814 or 815 are connected to the pixel electrode formed from a transparent conductive film such as ITO, and a signal for display is applied to the other electrode and its associated interconnection. On the other hand, when using the TFT 818 of the present example in thin-film integrated circuit applications, a contact hole is further opened reaching down to the gate electrode 808, and a necessary interconnection is formed to connect the gate electrode 808 via this contact hole.

The thus fabricated n-type TFT exhibits good characteristics, such as a field-effect mobility of 80 to 120 cm$^2$/V.s and a threshold voltage of 2 to 3 V.

EXAMPLE 9

A ninth example of the invention will be described below with reference to FIGS. 17A, 17B and 18A to 18F. In the present example, it is explained in the case where the invention is applied to the fabrication of a p-type TFT on a glass substrate.

FIGS. 17A and 17B are plan views of a TFT fabricated using a lateral crystal growth region in accordance with the present example as viewed from the top of the substrate. FIGS. 18A to 18F are cross-sectional views obtained along a line 18—18' in FIG. 17A, and the fabrication steps proceed as the figure numbers increase. Specifically, the cross sectional view obtained along the line 18—18' in FIG. 17A corresponds to FIG. 18E or 18F.

In the present example described below, a TFT is fabricated in such a manner that a source region 911, a channel region 910 and a drain region 912 are arranged in this order along a direction perpendicular to a longer side of a region 900, as shown in FIG. 17A. Alternatively, the TFT may be similarly fabricated without any disadvantages in such a manner that the source region 911, the channel region 910 and the drain region 912 are arranged in this order along a direction parallel to a longer side of a region 900, as shown in FIG. 17B.

Figure 18A:
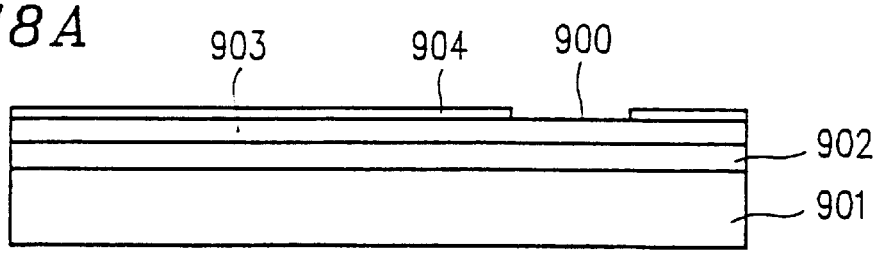
FIGS. 18A to 18F are schematic cross sections obtained along a line 18—18' in FIG. 17A, illustrating various steps of a method for fabricating a semiconductor device in accordance with the ninth example of the invention.

First, as shown in FIG. 18A, a base coat film 902 formed from silicon oxide of a thickness of about 200 nm is deposited by sputtering on a glass substrate 901. Next, by low-pressure CVD or plasma CVD, an intrinsic (I-type) amorphous silicon film 903 is deposited to a thickness of 25 to 100 nm, for example, to 80 nm.

Then, a mask 904 made of a silicon oxide film or a silicon nitride film is formed on top of the amorphous silicon film 903. The mask 904 has an opening formed therein through which a portion of the amorphous silicon film is exposed in a slit-like manner. The top view of the state in FIG. 18A looks like FIGS. 17A and 17B in which a predetermined region 900 of the amorphous silicon film is exposed through the opening in a slit-like manner, while the other regions are covered by the mask 904.

Figure 18B:
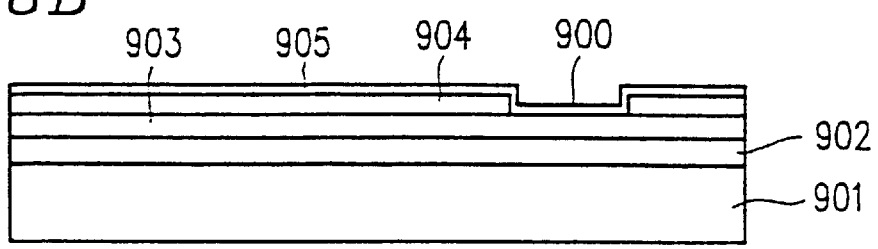
Figure 18C:
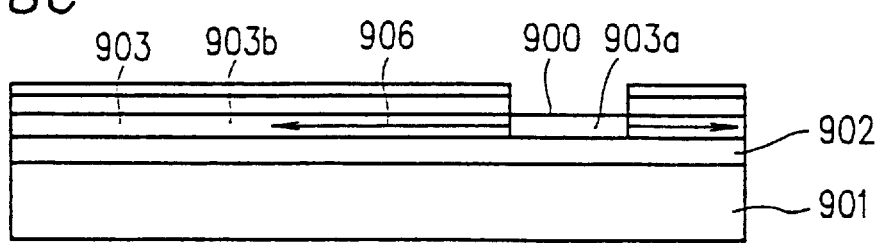

After forming the mask 904, as shown in FIG. 18B, a nickel silicide film 905 (NiSi$_x$, $0.4 \leq x \leq 2.5$, for example x=2.0) is deposited by sputtering to a thickness of 0.5 to 20 nm, for example, of 2 nm. The substrate after the deposition is subject to heat treatment in a hydrogen reducing atmosphere or in an inert atmosphere, at temperatures 520° to 580° C. for several to tens of hours; for example, the heat treatment is conducted at 550° C. for 16 hours. Thus, the amorphous silicon film 903 is crystallized.

In the region 900 in which a small amount of nickel has been selectively introduced, the crystallization of the amorphous silicon film 903 occurs in a direction perpendicular to the glass substrate 901, thus forming a crystalline silicon film 903a. Around the region 900, the crystal growth proceeds in lateral directions (in direction parallel to the surface of the substrate 901) from the region 900, as indicated by arrows 906 in FIG. 18C, thus forming a crystalline silicon film 903b by the lateral crystal growth. The other portions of the amorphous silicon film 903 remain in an amorphous state without crystallization. Typically, a range L of the lateral crystal growth in the direction parallel to the substrate 901 as indicated by the arrows 906 is about 80 μm.

Figure 18D:
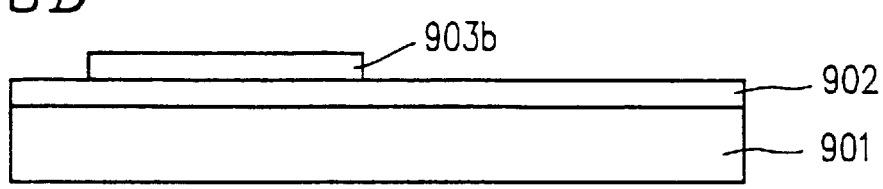

Next, the mask 904 and undesired portions of the crystalline silicon film 903b are removed to provide device isolation. As a result, a crystalline silicon film 903b patterned in an island manner as shown in FIG. 18D is obtained. The islandized crystalline silicon film 903b is used as an active region, i.e., a source region 911, a drain region 912 and a channel region 910, of a TFT in subsequent steps.

At this moment, the crystalline silicon film 903b is patterned in such a manner that a distance b as indicated in FIG. 17A, that is, a distance from one of the longer sides of the portion to be the channel region 910 of the TFT to one of the longer sides of the catalyst element (Ni in the present example) introduced region 900 is equal to or more than 30 μm. Specifically in the present example, the crystalline silicon film 903b is patterned so that the distance b becomes 30 μm.

On the other hand, in the case where the TFT is fabricated in such a configuration as shown in FIG. 17B, the crystalline silicon film 903b is patterned so that the distance b' which is defined similarly as the distance b is equal to or more than 30 μm. Thus, the similar advantages as explained above are achieved.

After that, a silicon oxide film is deposited to a thickness of 20 to 150 nm, for example, to 100 nm, as a gate insulating film 907 over the crystalline silicon film 903b which is to be the active region of the TFT. In the present example, sputtering is conducted for depositing the oxide silicon film in an oxygen atmosphere or a mixed gas atmosphere of oxygen and argon, using silicon oxide as a target material. During the sputtering, the substrate is held at 200° to 400° C., for example, at 350° C. Further, a ratio of argon to oxygen (argon/oxygen) in the sputtering atmosphere is set at 0.5 or less, typically at 0.1 or less.

Then, an aluminum film of a thickness of 400 nm is deposited by sputtering. The thus deposited aluminum film is then patterned to form a gate electrode 908. Next, using the gate electrode 908 as a mask, impurity ions (boron) are doped into the active region by an ion doping method. More specifically, diborane (B$_2$H$_6$) is used as a doping gas, and an acceleration voltage is set at 40 to 80 kV, for example, at 65 kV and a dose is set at $1 \times 10^{15}$ to $8 \times 10^{15}$ cm$^{-2}$, for example, at $5 \times 10^{15}$ cm$^{-2}$. Regions 911a and 912a doped with the impurities by the ion doping step are later used as the source and drain regions 911 and 912 of the TFTS, and a region 910a, masked by the gate electrode 908 so as not to be doped with the impurities, is later used as the channel region 910 of the TFTs.

Figure 18E:
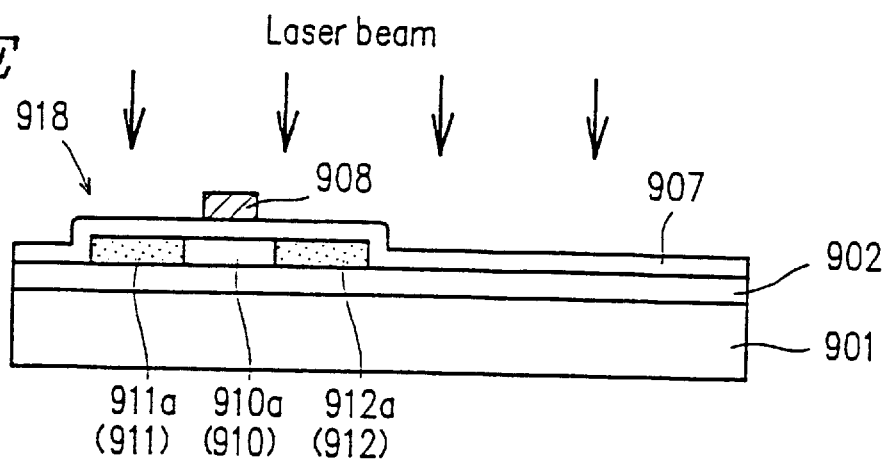

Next, as shown in FIG. 18E, a laser beam is applied for annealing in order to activate the thus doped impurities as well as to improve crystallinity of the crystalline silicon film degraded in the above laser doping step. A KrF excimer laser (a wavelength of 248 nm and a pulse width of 20 ns), for example, may be used as the laser source. An energy density of the laser light is set at 150 to 400 mJ/cm$^2$, preferably, 200 to 250 mJ/cm$^2$ for the irradiation. A sheet resistance of the regions 911 and 912, in which the p-type impurities (boron) have been thus doped, is typically 500 to 900 Ω/□.

Next, a silicon oxide film or silicon nitride film is deposited as an interlayer insulating film 913 to a thickness of about 600 nm. In the case of a silicon oxide film, it is deposited by plasma CVD using TEOS and oxygen, or by low-pressure CVD or normal-pressure CVD using TEOS and ozone. The interlayer insulating film 913 thus deposited provides excellent step coverage to sufficiently cover steps on the substrate surface.

Figure 18F:
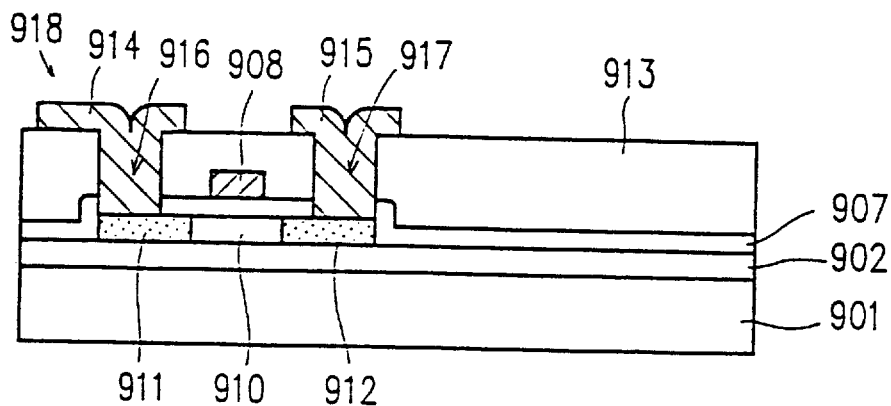

Next, contact holes 916 and 917 are opened in the interlayer insulating film 913, and a multilayered film of metal materials, for example, of titanium nitride and aluminum, is deposited to form electrodes and metal interconnections 914 and 915 of the TFTs. Finally, annealing is performed in a hydrogen atmosphere at 1 atmosphere at 350° C. for 30 minutes, to complete the fabrication of the TFT 918 as shown in FIG. 18F.

When using the thus fabricated TFT 918 of the present example as an element for switching a pixel electrode of an active-matrix liquid crystal device, one of the electrodes and its associated interconnection 914 or 915 are connected to the pixel electrode formed from a transparent conductive film such as ITO, and a signal for display is applied to the other electrode and its associated interconnection. On the other hand, when using the TFT 918 of the present example in thin-film integrated circuit applications, a contact hole is further opened reaching down to the gate electrode 908, and a necessary interconnection is formed to connect the gate electrode 908 via this contact hole.

The thus fabricated p-type TFT exhibits good characteristics, such as a field-effect mobility of 60 to 80 cm$^2$/V.s and a threshold voltage of −2 to −8 V.

EXAMPLE 10

A semiconductor device and a method thereof in accordance with a tenth example of the invention will be described below.

Figure 19:
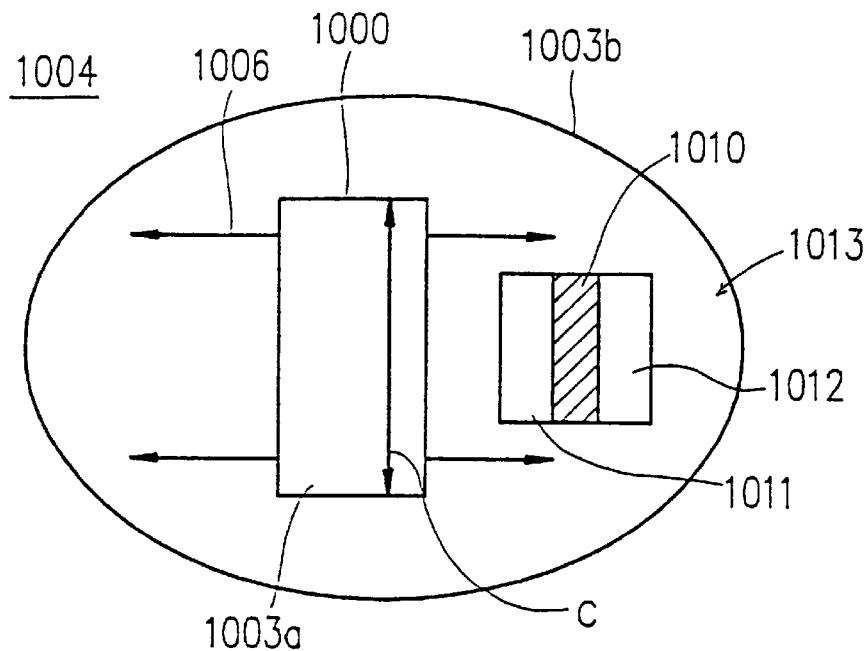
FIG. 19 is a top plan view illustrating an example of a configuration of a thin film transistor fabricated in accordance with a tenth example of the invention.

FIG. 19 is a plan view of a TFT fabricated using a lateral crystal growth region in accordance with the present example as viewed from top of the substrate. A positional relationship among a source region 1011, a drain region 1012 and a channel region 1010 of a TFT to be fabricated, a catalyst element introduction region 1000 and a lateral crystal growth region 1003b.

In the similar step as in the eighth and ninth examples, a base coat film and an amorphous silicon film (both not shown) are formed on a glass substrate. Next, as mask 1004 for introducing catalyst elements to accelerate the crystallization of the amorphous silicon film, a silicon oxide film is deposited having a thickness of 10 to 200 nm, for example, of 50 nm. By patterning this silicon oxide film to etch away a region 1000, a through hole is open for selectively introducing the catalyst elements in to a certain region 1000 of the amorphous silicon film. At this moment, the region 1000 is provided in such a manner that a length c of a longer side of a substantially rectangular region 1000 as shown in FIG. 19, that is, a length of a specific side opposing to an active region of a TFT to be fabricated later, is equal to or more than 120 μm.

Thereafter, catalyst elements such as nickel are introduced in to the region 1000 of the amorphous silicon film, which is exposed in a slit-like manner through the mask 1004, in a similar way as the previously explained eighth and ninth examples. Further, the amorphous silicon film is annealed in an inert atmosphere at 550° C. for about 16 hours to be crystallized. Thus, the region 1000 of the amorphous silicon film becomes a vertically grown crystalline silicon film 1003a in which the crystal growth occurs in a thickness direction, i.e., in a direction perpendicular to the surface of the glass substrate. On the other hand, around the region 1000, a crystalline silicon film 1003b is formed in which the crystal growth proceeds in lateral directions which are parallel to the surface of the substrate from the region 1000. Typically, a growth range L of the crystalline silicon film 1003b obtained by the lateral crystal growth in the direction indicated by arrows 1006 is about 80 μm. When a plurality of the catalyst element introduced regions 1000 exist on the substrate, a stable and uniform range L of the lateral crystal growth are obtained in each crystalline silicon film 1003b grown from any of the regions 1000.

Next, the mask 1004 and undesired portions of the crystalline silicon film 1003b are removed to provide device isolation.

In the above steps, the crystalline silicon film patterned in an island manner is formed, which is to be an active region of the TFT, including the source region 1011, the drain region 1012 and the channel region 1010. Then, the TFT 1013 is completed by similar steps to those of the eighth or ninth example.

EXAMPLE 11

A semiconductor device and a method thereof in accordance with an eleventh example of the invention will be described below.

Figure 20:
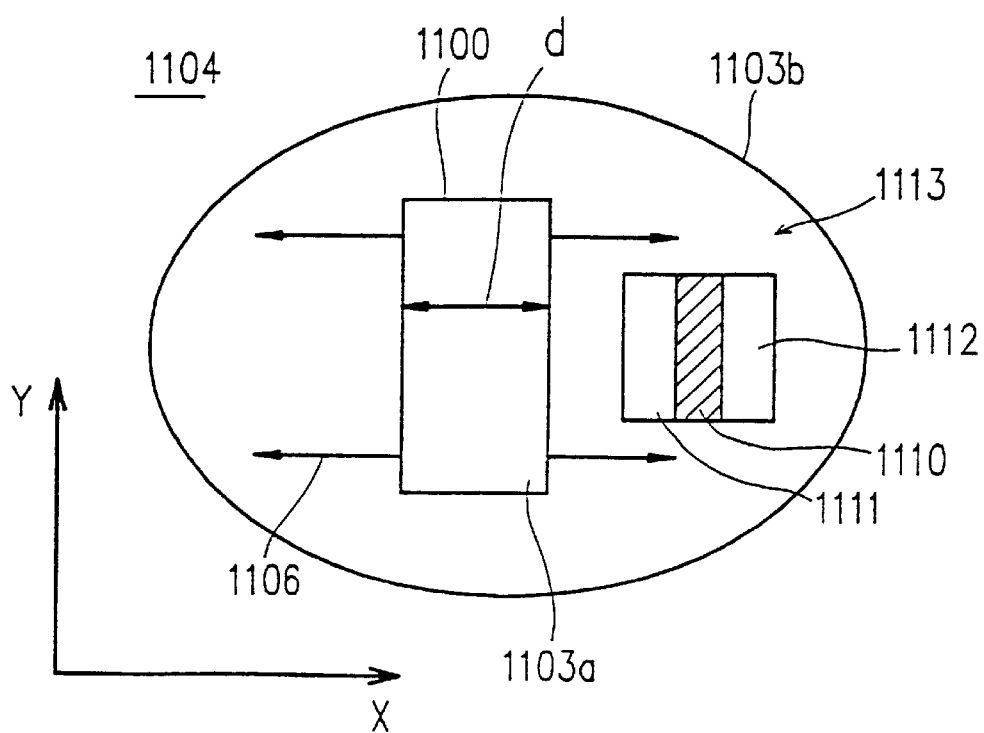
FIG. 20 is a top plan view illustrating an example of a configuration of a thin film transistor fabricated in accordance with an eleventh example of the invention.

FIG. 20 is a plan view of a TFT fabricated using a lateral crystal growth region in accordance with the present example as viewed from top of the substrate. FIG. 20 shows a perspective relationship among a source region 1111, a drain region 1112 and a channel region 1110 of a TFT to be fabricated, a catalyst element introduction region 1100 and a lateral crystal growth region 1103b.

In a similar step to that found in the eighth and ninth examples, a base coat film and an amorphous silicon film (both not shown) are formed on a glass substrate. Next, a mask 1104 for introducing catalyst elements to accelerate the crystallization of the amorphous silicon film, a silicon oxide film having a thickness of 10 to 200 nm, for example, of 20 nm. By patterning this silicon oxide film to etch away a region 1100, a through hole is open for selectively introducing the catalyst elements in to a certain region 1100 of the amorphous silicon film. At this moment, the region 1100 is provided in such a manner that a width d in x direction of a region 1100 as shown in FIG. 20 is equal to or more than 5 μm.

Thereafter, catalyst elements such as nickel are introduced in to the region 1100 of the amorphous silicon film, which is exposed in a slit-like manner through the mask 1104, in a similar way as the previously explained eighth and ninth examples. Further, the amorphous silicon film is annealed in an inert atmosphere at 550° C. for about 16 hours to be crystallized. Thus, the region 1100 of the amorphous silicon film becomes a vertically grown crystalline silicon film 1103a in which the crystal growth occurs in a thickness direction, i.e., in a direction perpendicular to the surface of the glass substrate. On the other hand, around the region 1100, a crystalline silicon film 1103b is formed in which the crystal growth proceeds in lateral directions which are parallel to the surface of the substrate from the region 1100. Typically, a growth range L of the crystalline silicon film 1103b obtained by the lateral crystal growth in the direction indicated by arrows 1106 is about 80 μm. When a plurality of the catalyst element introduced regions 1100 exist on the substrate, a stable and uniform range L of the lateral crystal growth are obtained in each crystalline silicon film 1103b grown from any of the regions 1100.

Next, the mask 1104 and undesired portions of the crystalline silicon film 1103b are removed to provide device isolation.

In the above steps, the crystalline silicon film patterned in an island manner is formed, which is to be an active region of the TFT, including a source region 1111, a drain region 1112 and a channel region 1110. Then, the TFT 1113 is completed by similar steps as those of the eighth or ninth example.

EXAMPLE 12

A twelfth example of the invention will be described below.

In the present example, it is explained in the case where the invention is applied to the fabrication of a plurality of TFTs on a glass substrate. The semiconductor device of the present invention may be used in a driver circuit or in a pixel portion of an active-matrix liquid crystal display device, or a thin film integrated circuit. Hereinafter, a specific case will be explained in which the invention is applied to the pixel switching TFTs in the active-matrix portion of the liquid crystal display device.

FIGS. 21A to 21E are plan views of a TFT fabricated using a lateral crystal growth region in accordance with the present example as viewed from the top of the substrate, illustrative of fabricating steps of the active-matrix display portion of the liquid crystal display device. In the present example, the fabrication steps proceed as the figure numbers increase. Although tens of thousands of TFTs are included in the actual active-matrix display portion of the liquid crystal display device, a 3×3 active-matrix display portion is explained in the present example for clarification.

First, a base coat film formed from silicon oxide is deposited on a glass substrate, and then, an amorphous silicon film is deposited to a thickness of about 50 nm. Then, a mask 1204 is formed to be used for selectively introducing catalyst elements to accelerating crystallization of the amorphous silicon film. Furthermore, by patterning the mask 1204 to etch away a predetermined region 1200, a through hole is provided through which the catalyst elements are selectively. introduced into a certain region 1200 of the amorphous silicon film.

After forming the through hole in the mask 1204, a nickel film having a thickness of 1 nm is deposited by evaporation. Then, the substrate is subject to heat treatment in an inert atmosphere and, for example, at 550° C. for 16 hours. Thus, the amorphous silicon film is crystallized.

Figure 21A:
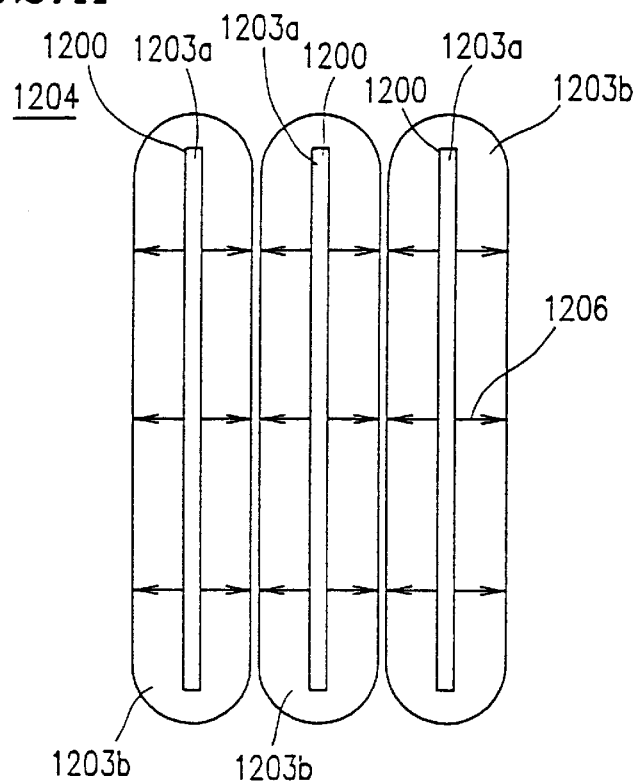
FIGS. 21A to 21E are top plan views illustrating various steps of a method for fabricating a semiconductor device in accordance with a twelfth example of the invention.

At this stage as shown in FIG. 21A, in the region 1200 in which a minute amount of nickel has been selectively introduced, the crystallization of the amorphous silicon film occurs in a direction perpendicular to the surface of the glass substrate, thus forming a crystalline silicon film 1203a. Around the region 1200, the crystal growth proceeds in lateral directions (i.e., in direction parallel to the substrate) from the region 1200, as indicated by arrows 1206, thus forming a crystalline silicon film 1203b by the lateral crystal growth. The other portions of the amorphous silicon film remain in an amorphous state.

Figure 21B:
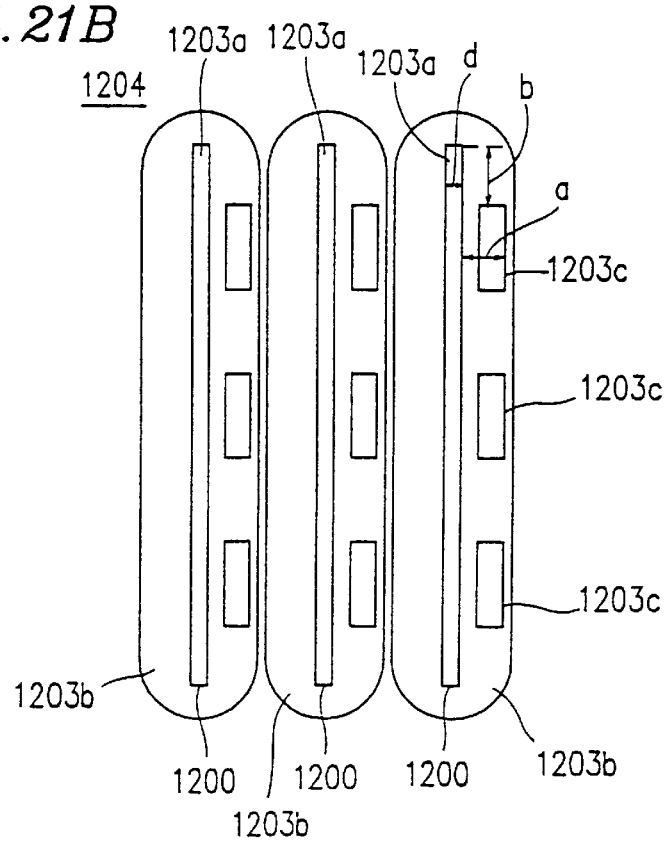

Next, the mask 1204 and undesired portions of the crystalline silicon film 1203b are removed to provide device isolation. As a result, as shown in FIG. 21B, a plurality of active regions 1203c of the TFTs (three in the present example) are formed in the crystalline silicon film 1203b obtained by the lateral crystal growth from one nickel-introduced region 1200. By forming the active region 1203c at such a position that the distance a is equal to or less than 120 μm, the distance b is equal to or more than 30 μm and the width d is equal to or more than 5 μm in FIG. 21B, further desirable advantages are achieved as previously explained. The active region 1203c is to be a source region, a drain region and a channel region of the TFT through the following steps.

Figure 21C:

FIG. 21B shows the situation after the formation of the resist pattern in a patterning step of the amorphous silicon film. Thereafter, undesired portions of the crystalline film 1203b are etched away to achieve the situation as shown in FIG. 21C.

Figure 21D:
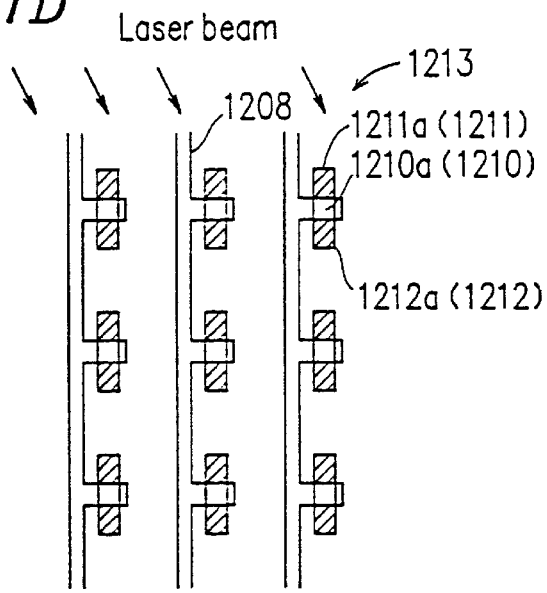

Then, a silicon oxide film is deposited to a thickness of about 120 nm as a gate insulating film so as to cover the active region 1203c in the above-described crystalline silicon film 1203b. Further, an aluminum film of a thickness of about 500 nm is deposited thereon. The thus deposited aluminum film is then patterned to form gate electrodes and interconnections 1208, as shown in FIG. 21D. Thereafter, by an ion doping method, with using the gate electrode 1208 as a mask, impurities (phosphorus or boron) are doped into the active region 1203c. Regions 1211a and 1212a doped with the impurities by this step are later used as the source region 1211 and the drain regions 1212 of the TFTs 1213, and a region 1210a, masked by the gate electrode 1208 so as not to be doped with the impurities, is later used as the channel region 1210 of the TFTs 1213.

Next, a laser beam is applied for annealing in order to activate the thus doped impurities as well as to improve crystallinity of the crystalline silicon film, which forms the active region 1203c, degraded in the above laser doping step.

Figure 21E:
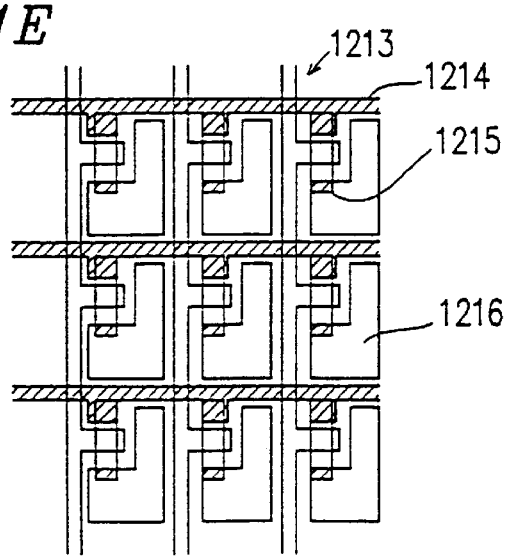

Next, a silicon oxide film is deposited as an interlayer insulating film to a thickness of about 600 nm. Further, contact holes are opened in the interlayer insulating film, and a multilayered film of metal materials, for example, of titanium nitride and aluminum, is deposited to form source electrode and their associated interconnections 1214, and drain electrodes 1215. Then, the electrodes 1215 are connected to pixel electrodes 1216 formed from a transparent conductive film such as ITO, and annealing is performed in a hydrogen atmosphere at 350° C. for 30 minutes, to complete the fabrication of the TFT 1213 as shown in FIG. 21E.

In the active-matrix substrate fabricated in accordance with the present example, three TFTs 1213 are formed respectively in the crystalline silicon film 1203b grown from one region 1200. These three TFTs 1213 have identical operational characteristics.

In the conventional technique, when a 3×3 (a total of nine) active-matrix substrate is fabricated using TFTs in which crystalline silicon films are used as their channel regions, there exist a certain deviation in operational characteristics among the nine TFTs because of differences in the crystallinity of the crystalline silicon films forming their respective TFTs. To the contrary, the present example can reduce possible deviation to such a extent that no deviation exists among three TFTs included in one group. Further, even if a certain deviation exists, a correction treatment can be easily conducted. Thus, in an actual active-matrix substrate having mxn TFTS as fabricated according to the present example, a deviation in operational characteristics among the mxn TFTs can be reduced to such an extent that the deviation can be handled as one among the TFT groups of m. As a result, the fabrication process of the active-matrix substrate can be simplified.

In the above explanation, only the right side of a width direction of the lateral crystal growth regions 1203b grown from the ,slit-shaped regions 1200 are used to fabricate the TFTs 1213. Alternatively, both sides of the width direction of the regions, 1200 may be used for fabricating the TFTs 1213, resulting in further reduction of deviation in the characteristics among the TFTs 1213 by 50%.

Thus, according to the present example, the respective regions 1200 are elongated, and a plurality of TFTs are fabricated from a lateral crystal growth silicon film grown from each of the regions 1200, whereby a semiconductor device having a plurality of TFTs on one substrate is obtained, while achieving highly uniform characteristics.

The characteristics of the TFT in which a crystalline silicon film is used as its channel region 1210 depend mainly on the crystallinity of the silicon film. Therefore, a slight difference in crystallinity appears as deviation in the device characteristics. However, when fabricating a plurality of TFTs in a crystalline silicon film obtained by the lateral crystal growth from one region 1200, channel -regions of such TFTs respectively have the same crystallinity. As a result, a semiconductor device showing uniform characteristics among a plurality of TFTs with little, deviation can be obtained.

The present example is especially effective for forming tens of thousands of elements on one substrate, such as an active-matrix substrate of the liquid crystal display device. The deviation in the TFT characteristics which conventionally exists at every point can be significantly reduced to the deviation among lines in a row direction or in a column direction.

Furthermore, more devices can be simultaneously fabricated in the lateral crystal growth silicon film by using both sides with respect to the elongated region 1200, which further reduces the deviation among the elements. Moreover, it is possible by utilizing both sides of the elongated region 1200 to fabricate a CMOS circuit having stable characteristics in which n-type TFTs are fabricated on one side, and p-type TFTs are formed on another side.

EXAMPLE 13

A thirteenth example of the invention will be described below. In the present example, it is explained in the case where the invention is applied to the fabrication of a CMOS circuit having an n-type TFT and a p-type TFT in complementary configuration on a glass substrate. Moreover, in the crystalline silicon film obtained from the lateral crystal growth from one catalyst element introduced region, the n-type TFT and a p-type TFT are formed in both sides in a width direction of the introduced region.

FIG. 22 is a plan view of a TFT fabricated using a lateral crystal growth region in accordance with the present example as viewed from top of the substrate. FIGS. 23A to 23E are cross-sectional views obtained along a line 23–23' in FIG. 22, and the fabrication steps proceed as the figure numbers increase.

First, a base coat film 1302 is formed from silicon oxide of a thickness of about 100 nm by sputtering on a glass substrate 1301. Next, by low-pressure CVD, an intrinsic (I-type) amorphous silicon film 1303 is deposited to a thickness of 25 to 100 nm, for example, to 50 nm.

Then, a mask 1304 made of a silicon oxide film or a silicon nitride film is formed on top of the amorphous silicon film 1303 to a thickness of about 50 nm. The mask 1304 is then selectively removed to provide an opening for introducing catalyst elements. The top view of FIG. 23A looks like FIG. 22 in which a predetermined region 1300 of the amorphous silicon film is exposed through the opening in a slit-like manner, while the other regions are covered by the mask 1304. The region 1300 is formed in such a manner that a length c is equal to or more than 120 μm and a width d is equal to or more than 5 μm, as shown in FIG. 22. Thus, sufficient lateral crystal growth range L is obtained in the following steps.

After providing the mask 1304, an aqueous solution of nickel salt such as nickel acetate or nickel nitrate is applied on the entire surface of the glass substrate 1301. Then, a drying step is conducted after a film of the aqueous solution applied with a spinner is made to have an uniform thickness. A nickel concentration in the aqueous solution is set in the range from 50 to 200 ppm, preferably, at 100 ppm. In the region 1300, precipitated nickel ions are in contact with the amorphous silicon film 1303, whereby a minute amount of nickel is introduced into the region 1300 of the amorphous silicon film 1303. Then, the entire substrate is subject to heat treatment in a hydrogen reducing atmosphere or in an inert atmosphere at 550° C. for 16 hours. Thus, the amorphous silicon film 1303 is crystallized.

In the region 1300 in which a minute amount of nickel has been selectively introduced, the crystallization of the amorphous silicon film 1303 occurs in a direction perpendicular to the glass substrate 1301, thus forming a crystalline silicon film 1303a. Around the region 1300, the crystal growth proceeds in lateral directions (i.e., in direction parallel to the surface of the substrate 1301) from the region 1300, as indicated by arrows 1306 in FIG. 23B, thus forming a crystalline silicon film 1303b by the lateral crystal growth. The other portions of the amorphous silicon film 1303 remain in an amorphous state without crystallization.

Next, the mask 1304 is removed and a laser beam is applied for annealing in order to improve crystallinity of the crystalline silicon film 1303b. An XeCl excimer laser (a wavelength of 308 nm and a pulse width of 40 ns), for example, may be used as the laser source. The substrate is heated to 200° to 450° C., for example 400° C., and an energy density of the laser light is set at 200 to 400 mJ/cm$^2$, for example, 300 mJ/cm$^2$ for the irradiation.

Figure 23A:
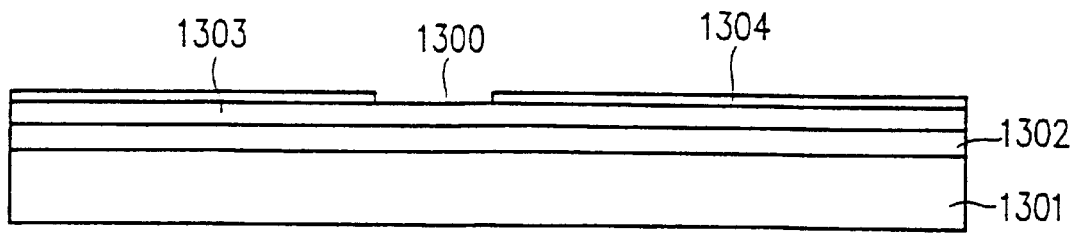
FIGS. 23A to 23E are schematic cross sections obtained along a line 23—23' in FIG. 22, illustrating various steps of a method for fabricating a semiconductor device in accordance with the thirteenth example of the invention.
Figure 23B:
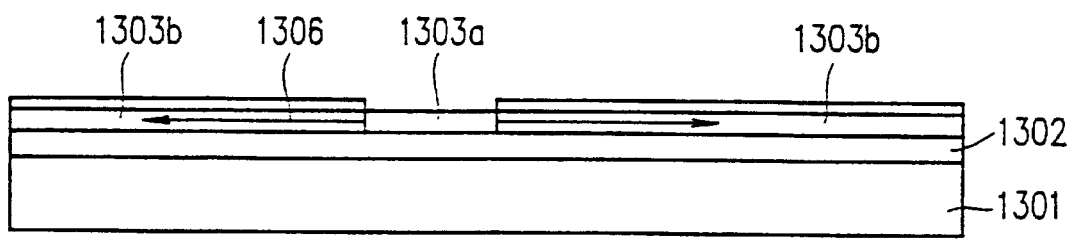
Figure 23C:
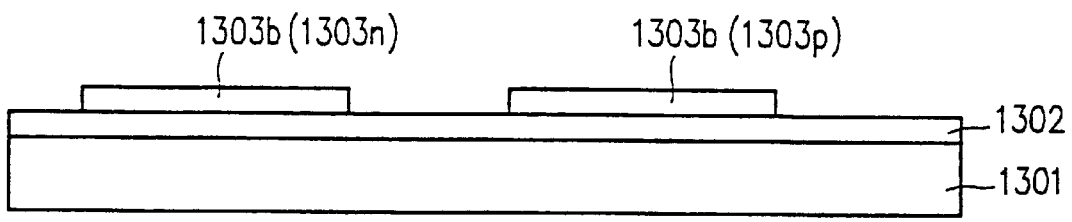

Then, undesired portions of the crystalline silicon film 1303b are removed to provide device isolation. As a result, a crystalline silicon film 1303b patterned in an island manner as shown in FIG. 23C is obtained. The islandized crystalline silicon film 1303b is used as an active regions 1303n and 1303p, i.e., a source region, a drain region and a channel region, of a TFT in subsequent steps.

By patterning the amorphous film 1303b in such a manner that the distance a is equal to or less than 120 μm and the distance b is equal to or more than 30 μm, a high-quality crystalline silicon film 1303b is obtained having the lateral crystal growth direction aligned in one-dimensional manner. The channel region of the TFT is formed using the crystalline silicon film.

After that, a silicon oxide film is deposited to a thickness of 100 nm, as a gate insulating film 1307 over the crystalline silicon film 1303b which is to be the active region 1303n and 1303p of the TFT. TEOS is used as material for the deposition of the silicon oxide film, that is, TEOS and oxygen are decomposed and deposited in an RF plasma CVD process to form the film, while holding the substrate at 350° C.

After that, an aluminum film (containing silicon of 0.1 to 2%) is deposited by sputtering to a thickness of 400 to 800 nm, for example, to 600 nm. The aluminum film is then patterned to form gate electrodes 1308 and 1309.

Next, using the gate electrodes 1308 and 1309 as a mask, impurity ions (phosphorus and boron) are doped into the crystalline silicon film 1303b by an ion doping method. More specifically, phosphine ($PH_3$) and diborane ($B_2H_6$) are used as a doping gas. When phosphine is used, an acceleration voltage is set at 60 to 90 kV, for example, at 80 kV, and when diborane is used, it is set at 40 to 80 kV, for example, at 65 kV. A dose is set at $1\times10^{15}$ to $8\times10^{15}$ $cm^{-2}$, typically at $2\times10^{15}$ $cm^{-2}$ for phosphorus and at $5\times10^{15}$ $cm^{-2}$ for boron. Regions masked by the gate electrodes 1308 and 1309 so as not to be doped with the impurities are to be channel regions 1310 and 1311 of the respective TFTs 1320 and 1321. Further, regions where no doping is needed is covered with a photo resist, and the respective impurity elements are selectively doped. As a result, n-type impurity regions 1312 and 1313 and p-type impurity regions 1314 and 1314 are formed, and n-channel type TFT (N-TFT) 1320 and a p-channel type TFT (p-TFT) 1321 are formed, as shown in FIG. 23D.

Figure 23D:
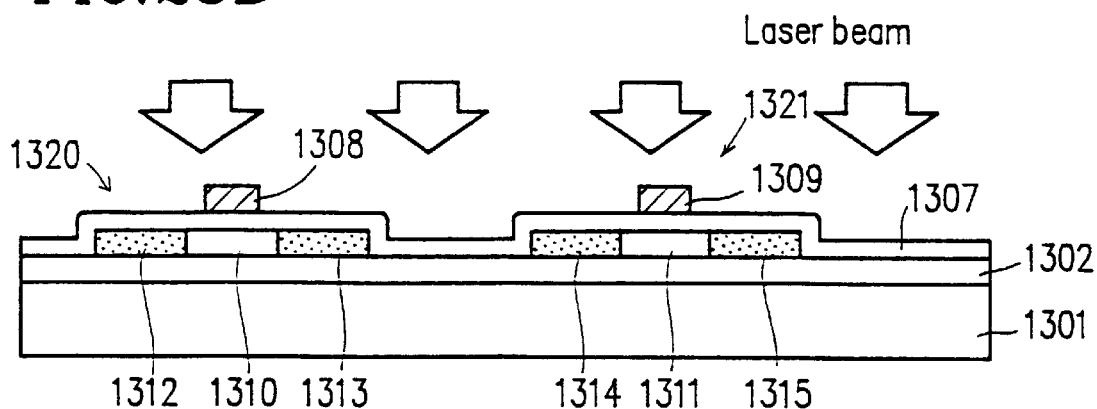

Next, as shown in FIG. 23D, a laser beam is applied for annealing in order to activate the thus doped impurities. A KrF excimer laser (a wavelength of 248 nm and a pulse width of 20 ns), for example, may be used as the laser source. An energy density of the laser light is set at 250 $mJ/cm^2$ and the irradiation is conducted using 2 shots per region.

Figure 23E:
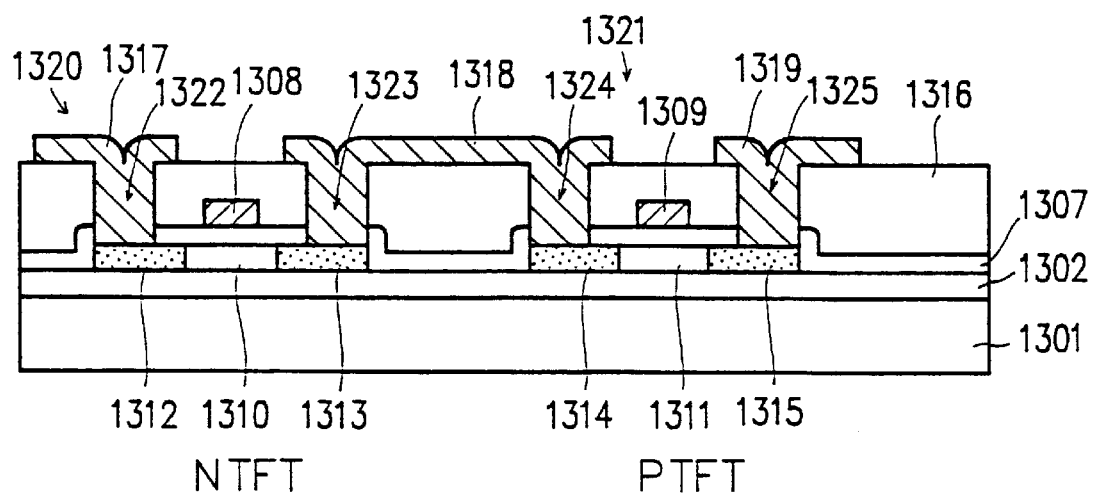

Next, a silicon oxide film is deposited by plasma CVD an interlayer insulating film 1316 to a thickness of about 600 nm. Next, contact holes 1322 to 1325 are opened in the interlayer insulating film 1316, and a multilayered film of metal materials, such as titanium nitride and aluminum, is deposited to form electrodes and metal interconnections 1317 to 1319 of the TFTs 1320 and 1321. Finally, annealing is performed in a hydrogen atmosphere of 1 atmosphere at 350° C. for 30 minutes, to complete the fabrication of the TFTs 1320. and 1321 as shown in FIG. 23E.

In the thus fabricated semiconductor circuit which includes CMOS structure of the present invention, a field-effect mobility of carriers is 140 to 170 $cm^2/V.s$ for the n-TFT 1320 and 100 to 130 $cm^2/V.s$ for the p-TFT 1321. A threshold voltage is 1.5 to 2 V for the n-TFT 1320 and −2 to −3 V for the p-TFT 1321. Thus, desirable characteristics are obtained.

EXAMPLE 14

Some features of a semiconductor device and a method for fabricating the same according to the present invention will now be described.

Figure 24:
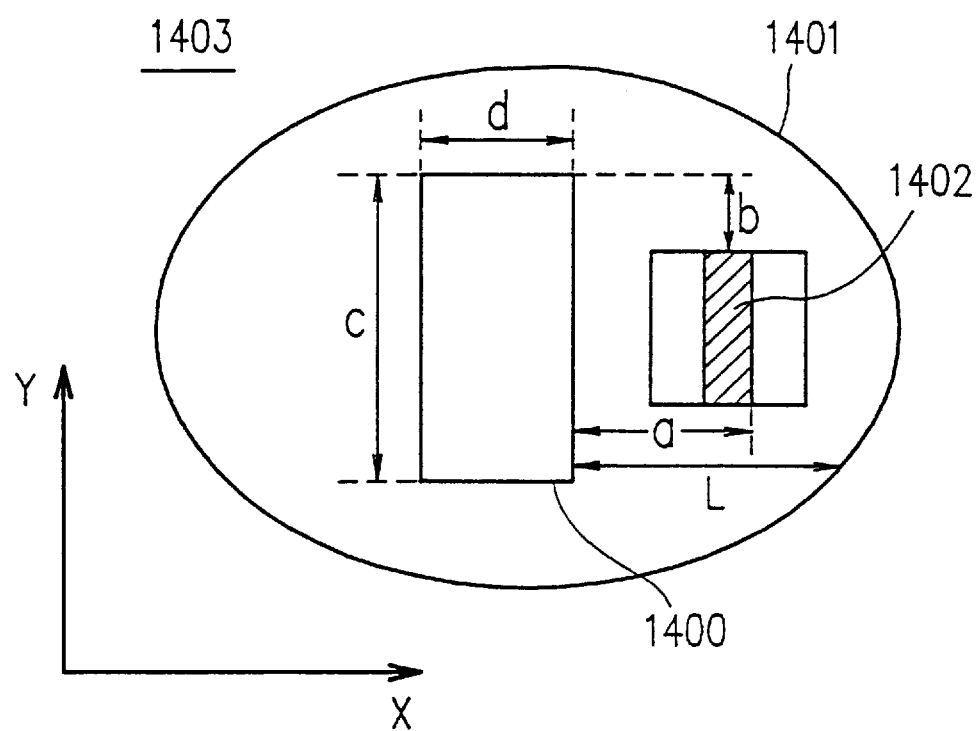
FIG. 24 is a top plan view illustrating an example of a configuration of a thin film transistor fabricated by using a crystalline silicon film obtained by a lateral crystal growth.

FIG. 24 is a plan view as viewed from above the substrate, showing a TFT fabricated using a lateral crystal growth region in accordance with the present invention. A mask 1403 made of a silicon dioxide film or the like is deposited on an amorphous silicon film formed over the entire surface of the substrate, and an opening for introduction of catalyst elements is opened in the mask 1403 to introduce the catalyst elements into an exposed region 1400 of the amorphous silicon film. In a subsequent step, the amorphous silicon film surrounding and including the region 1400 is crystallized, and the crystal growth proceeds in lateral directions from the region 1400, forming a lateral crystal growth region 1401. Using the thus formed lateral crystal growth region 1401, a channel region 1402 of the transistor is formed.

Next, variables shown in FIG. 24 and their effects on TFT characteristics will be described with reference to FIGS. 25 to 29.

Figure 25:
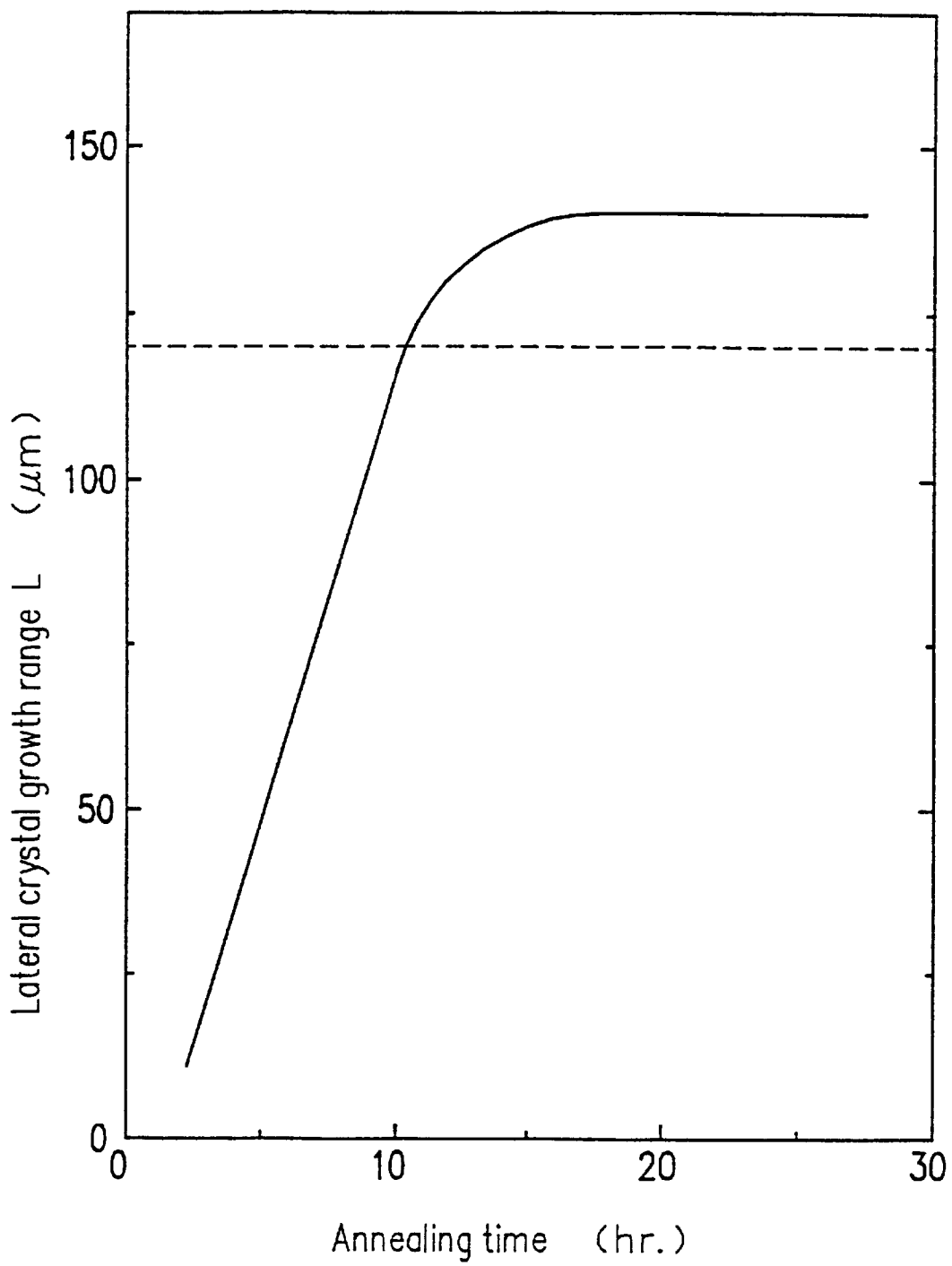
FIG. 25 is a graph showing a relationship between a lateral crystal growth range and an annealing time.

FIG. 25 is a graph showing the dependence of distance (lateral crystal growth range) L, from the region 1400 to the end of a lateral crystal growth region 1401, on an annealing time for an annealing temperature of 580° C. From FIG. 25, it can be seen that in the early stage of the growth the lateral crystal growth range L increases in proportion to the annealing time, but reaches saturation at L=140 μm beyond which no lateral growth occurs. This limit to the lateral crystal growth range L is due to crystal growth that takes place because of formation of spontaneous nuclei within the amorphous silicon region lying at the end of the lateral growth direction. That is, when the lateral crystal growth region collides with the ordinary crystal growth area occurring due to the spontaneous nuclei in the amorphous silicon region, the lateral crystal growth stops.

What matters here is the point on the graph at which the lateral crystal growth range L stops increasing in proportion to the annealing time. At this point, the crystal growth due to spontaneous nuclei starts in the amorphous silicon region, and the thus formed ordinary crystal growth region mixes into the lateral crystal growth region 1401. Therefore, as can be seen from FIG. 25, in the region where the lateral crystal growth range L exceeds 120 μm, needle-like or column-like crystals formed by the lateral crystal growth and twin crystals formed by the ordinary solid-phase growth are intermingled, significantly degrading crystallinity of the crystalline silicon film in that region. Accordingly, by forming the TFT's channel region 1402 using the crystalline silicon film in the region where the lateral crystal growth range L is within 120 μm, that is, in FIG. 24, the crystalline silicon film in the region where the distance a between the edge of the region 1400 nearer to the channel region 1402 and the edge of-the channel region 1402 farthest from the region 1400 is within 120 μm, a semiconductor device having good characteristics can be obtained.

Figure 26:
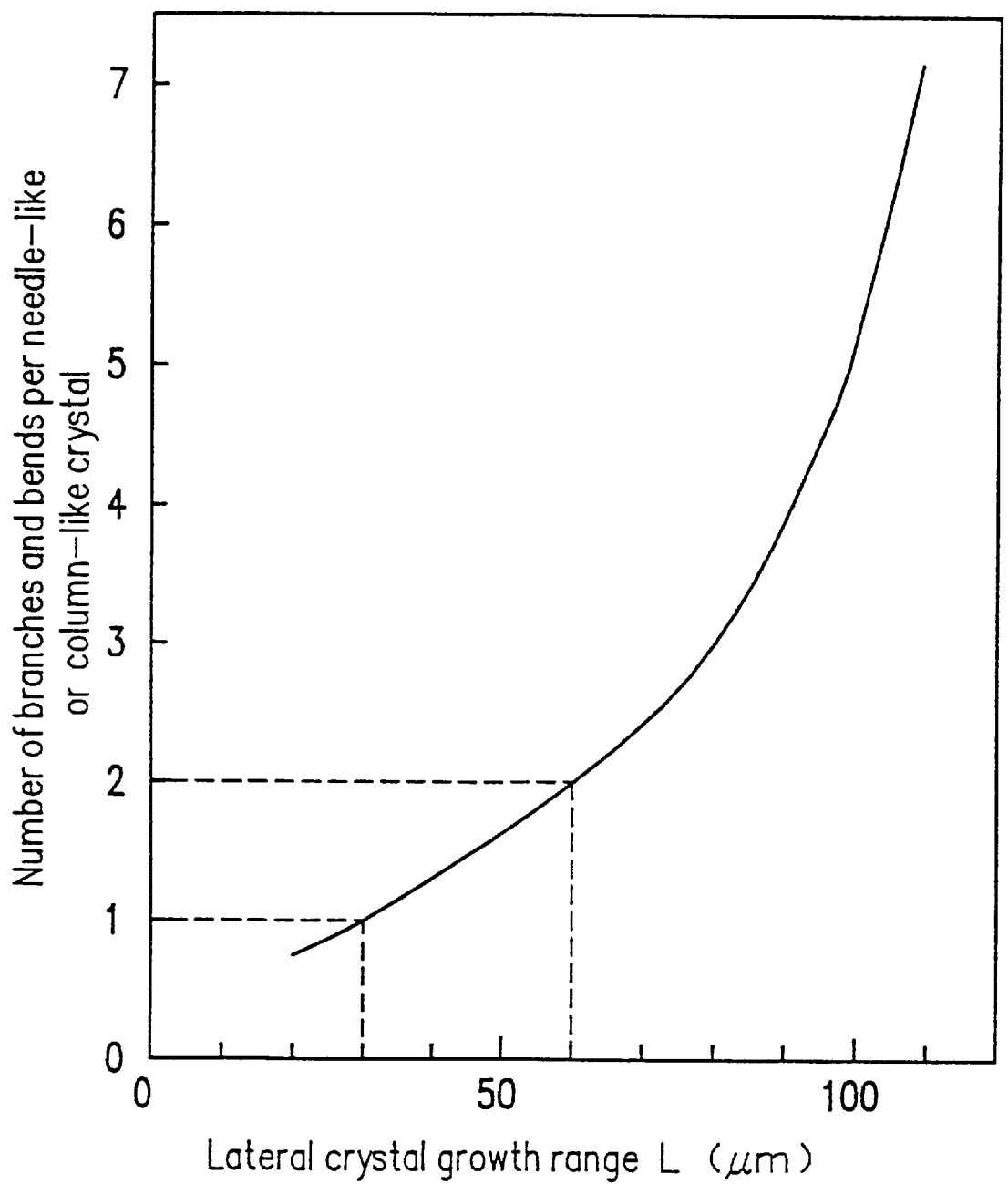
FIG. 26 is a graph showing a relationship between a number of branches/bends of a needle-like or column-like crystal constituting a lateral crystal growth region and a lateral crystal growth range.

FIG. 26 is a graph, plotting along the ordinate the number of branches and bends per needle-like or column-like crystal in the lateral crystal growth region, and along the abscissa the lateral crystal growth range L. The numbers plotted along the ordinate in FIG. 26 are obtained by measuring the number of branches and bends per needle-like or column-like crystal through observation under a transmission electron microscope (TEM), and by calculating the average of the thus measured values. As shown in FIG. 26, the number of branches and bends per needle-like or column-like crystal increases exponentially with increasing lateral crystal growth range L. This is because in addition to the branches and bends associated with the influence of impurities, the contribution of the nuclei spontaneously generating in the amorphous silicon region at the end of the growth direction increases with the increasing of the annealing time.

The region where the average number of branches and bends per needle-like or column-like crystal is 2 or less, specifically the region where the lateral crystal growth range L is within 60 μm as can be seen in FIG. 26, exhibits good crystallinity in which the lateral crystal growth direction is substantially aligned in a one dimensional manner. Further, in the region where the average number of branches and bends per needle-like or column-like crystal is 1 or less, specifically the region where the lateral crystal growth range L is within 30 μm as can be seen in FIG. 26, a nearly ideal lateral crystal growth silicon film is obtained.

Thus, by forming the channel region 1402 using the crystalline silicon film in which the average number of branches and bends is within the above range, a TFT having excellent characteristics, especially in a carrier mobility, can be obtained. Accordingly, the channel region 1402 of the TFT is formed in a position such that the distance a shown in FIG. 26 is within 60 μm, and preferably within 30 μm.

Figure 27:
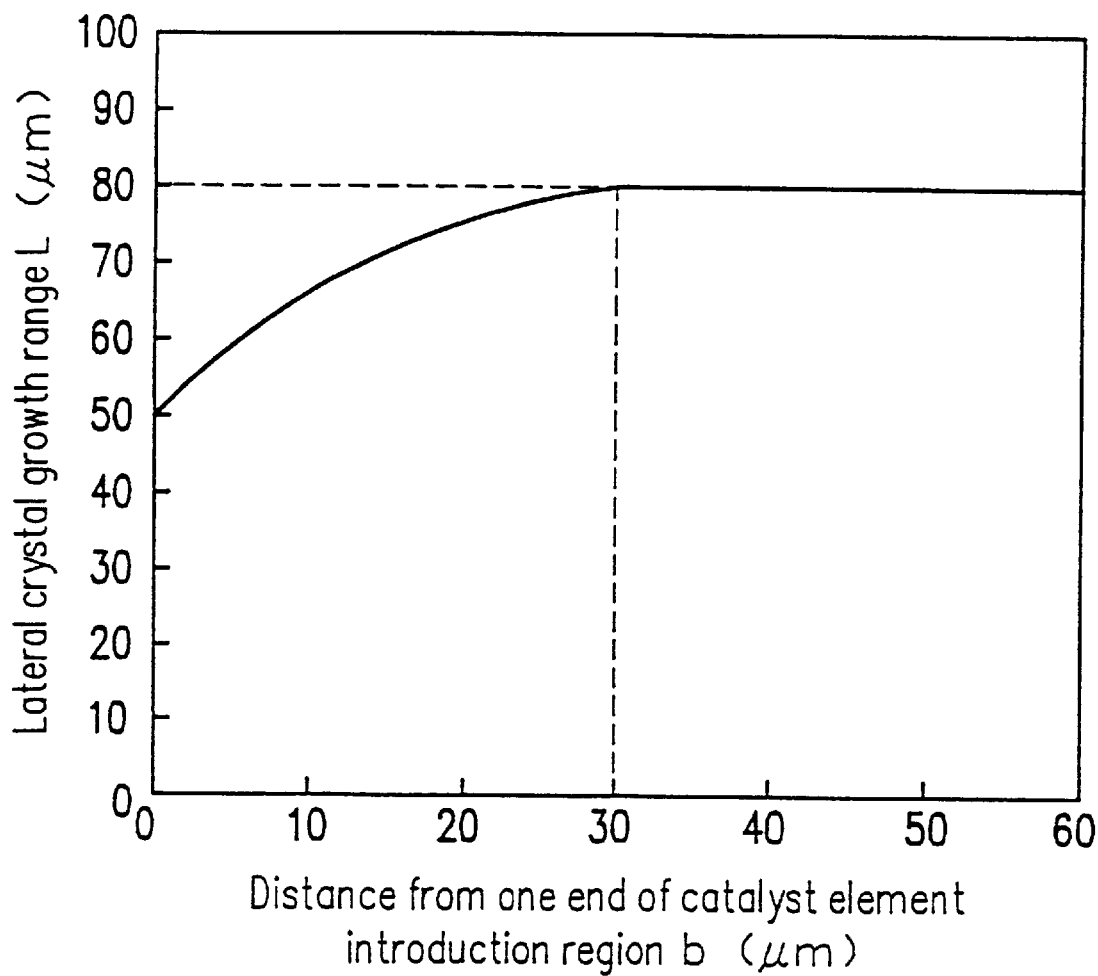
FIG. 27 is a graph showing a relationship between a parameter indicating a fabricating position of a thin film transistor fabricated in accordance with the invention and a lateral crystal growth range.

FIG. 27 is a graph showing the relationship between the distance b shown in FIG. 24, i.e. the distance from one longer side of the channel region 1402 to one longer side of the catalyst element introduced region 1400, and the lateral crystal growth range L in X direction. FIG. 27 shows specific data of measurements taken after annealing the amorphous silicon film at 550° C. for 16 hours. As can be seen from FIG. 27 in the region where the distance b is 30 μm or less, a decrease in the lateral crystal growth range L is observed. This is because the crystal growth direction spreads out around a corner of the region 1400 and the catalyst elements are consumed in large quantities in that portion, thus significantly reducing the lateral crystal growth range L near the corner. Thus, in the portion of the lateral crystal growth region 1401 where the distance b from the end of the region 1400 in FIG. 24 is within 30 μm, one-dimensional lateral crystal growth does not occur because of insufficient quantity of the catalyst elements and the disordered crystal growth direction around the corner of the region 1400.

Accordingly, by forming the channel region 1402 in a position such that the distance b in Y direction from the end of the region 1400 in FIG. 24 is larger than 30 μm, a semiconductor device having better performance and stability than previous devices can be obtained.

Figure 28:
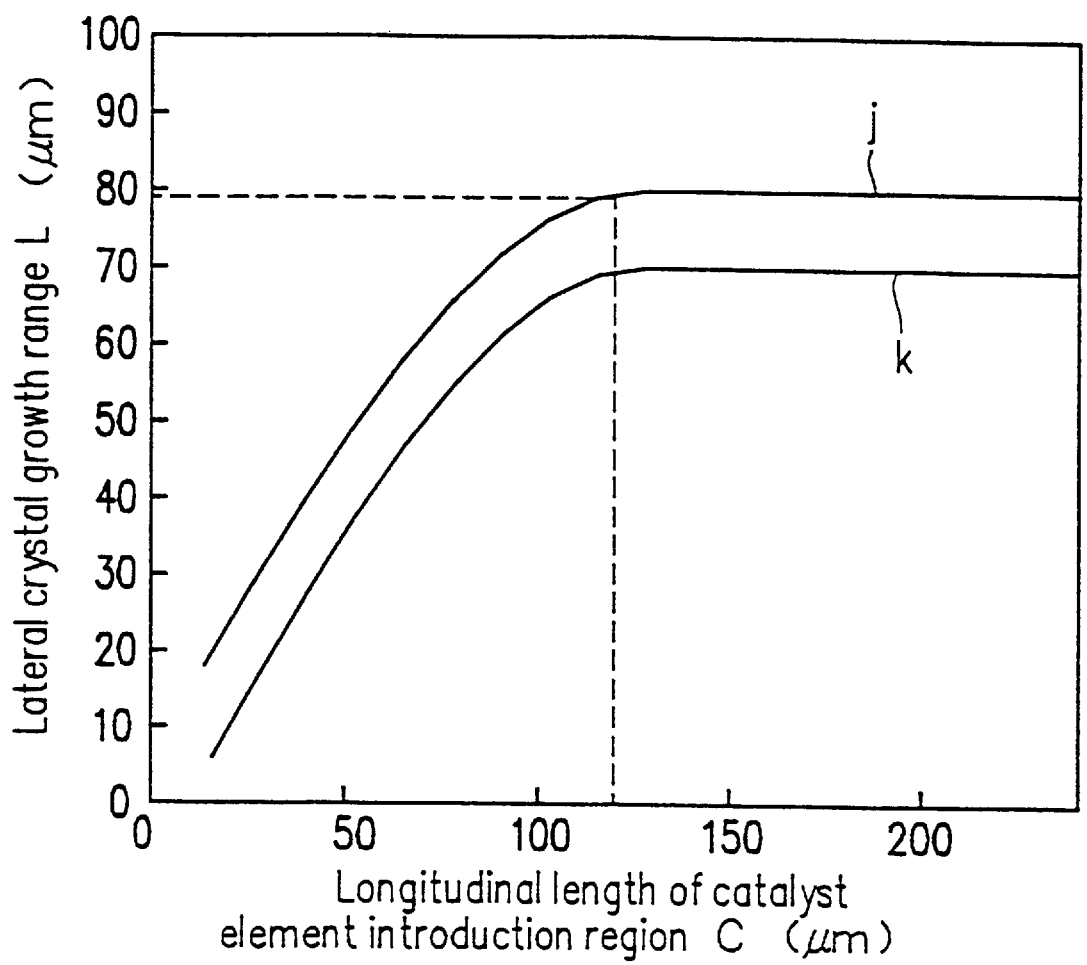
FIG. 28 is a graph showing a relationship between a size of the catalyst element introduction region and a lateral crystal growth range in accordance with the invention.

FIG. 28 is a graph showing the relationship between a length c of a longer side (along Y direction) of the region 1400 in FIG. 24 and the lateral crystal growth range L in X direction. The lateral crystal growth range L is measured from a point near the center of the longer side c of the region 1400 in FIG. 24, and a width d of the region 1400 along X direction is 40 μm. The graph of FIG. 28 shows data of measurements taken after annealing the amorphous silicon film at 550° C. for 16 hours.

As can be seen from FIG. 28, when the length c of the region 1400 is less than 120 μm, a decrease in the lateral crystal growth range L is observed. Even if the catalyst element dose is increased, the characteristic curve k representing the lateral crystal growth range L changes to the characteristic curve j, i.e., the whole graph only shifts in the increasing direction of the lateral crystal growth range L, and the dependence of the lateral crystal growth range L on the length c of the region 1400 remains unchanged. This is because, as described above, the crystal growth direction spreads out around the corner of the region 1400 and the catalyst elements are consumed in large quantities in that portion, thus significantly reducing the lateral crystal growth range L near the corner.

Thus, when the length c of the region 1400 in FIG. 24 is less than 120 μm, the resulting lateral crystal growth region 1401 does not have a sufficient crystal growth range. Additionally, since the quantity of the catalyst elements is insufficient, and the crystal growth direction is disordered at the end of the region 1400, a high-quality lateral crystal growth region 1401 with its crystal growth direction aligned in a one dimensional manner cannot be obtained.

Accordingly, by setting the length c of the region 1400 in FIG. 24 to be 120 μm or more, a constant lateral crystal growth range L can be consistently obtained. This not only facilitates the subsequent fabrication steps, but also enables a semiconductor device with good characteristics to be fabricated using the lateral crystal growth silicon film with its crystal growth direction aligned in a one dimensional manner.

Figure 29:
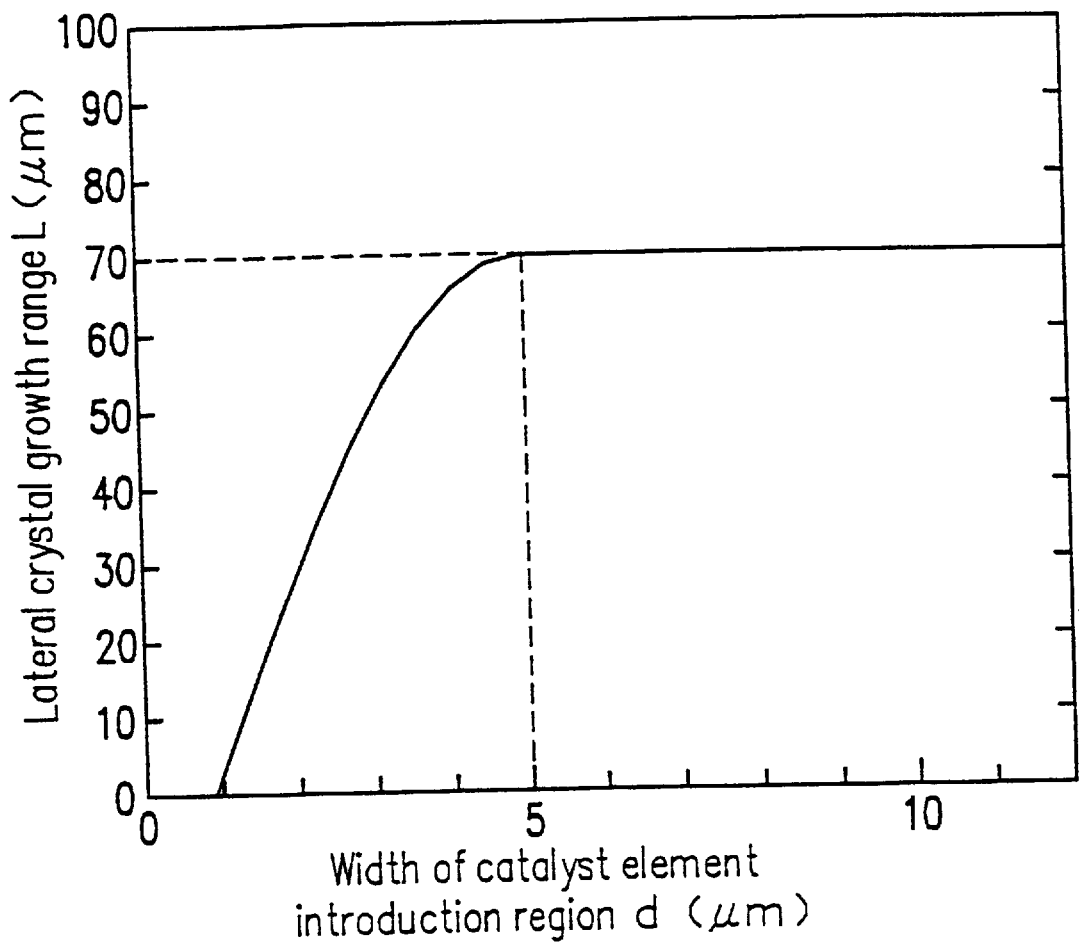
FIG. 29 is another graph showing a relationship between a size of the catalyst element introduction region and a lateral crystal growth range in accordance with the invention.

FIG. 29 is a graph showing the relationship between a width d in a shorter side direction (X direction) of the region 1400 in FIG. 24 and the lateral crystal growth range L in X direction. The lateral crystal growth range L is measured from a point near the center of the longer side c of the region 1400 in FIG. 24, and a length c in a longer side direction of the region 1400 is 200 μm. The graph of FIG. 29 shows data of measurements taken after annealing the amorphous silicon film at 550° C. for 16 hours.

As can be seen from FIG. 29, when the width d in the shorter side direction of the region 1400 is less than 5 μm, a decrease in the lateral crystal growth range L is observed. Furthermore, when the width d of the region 1400 is 1 μm or less, the lateral crystal growth does not occur. Thus, when the width d of the region 1400 in FIG. 24 is 5 μm or less, the resulting lateral crystal growth region 1401 does not have a sufficient crystal growth range. Additionally, the crystal growth range L deviates, which is not adequate for practical use.

Accordingly, by setting the width d of the region 1400 in FIG. 24 to be 5 μm or more, a constant lateral crystal growth range L can be consistently obtained. This not only facilitates the subsequent fabrication steps, but also enables a semiconductor device with good uniformity.

As described above, in the semiconductor devices and the methods for fabricating the same in the respective examples of the invention, by the irradiating the crystalline silicon film, obtained in the lateral crystal growth through the heat treatment, with the laser or other high intensity light, the grain boundaries of the crystalline silicon films are annealed in a concentrated manner. Thus, trap levels of carriers produced by the grain boundaries, which have brought disadvantages in the crystalline silicon film obtained by the solid-phase crystallization, are greatly reduced. Consequently, the crystallinity is further improved.

In the above explanation, for introducing nickels as the catalyst elements, an extremely thin nickel film is formed so as to be in contact with an upper or lower surface of the amorphous silicon film. From such a surface, the crystal growth is made to proceed. Alternatively, after formation of the amorphous silicon film, the amorphous silicon film may be selectively doped with nickel ions by an ion doping method. According to this ion doping method, a concentration of nickel elements to be introduced can be controlled by controlling the doping conditions.

As another alternative method, a liquid-state process may be used to introduce a minute amount of nickel, wherein an aqueous solution of nickel salt such as nickel acetate or nickel nitrate is applied on the surface of the amorphous silicon film. Further, instead of forming a thin nickel film, a plasma electrode constructed from a nickel electrode may be used to introduce a minute amount of nickels.

Furthermore, as the catalyst elements used to accelerate the crystallization, such elements as cobalt, palladium, platinum, copper, silver, gold, indium, tin, aluminum, phosphorus, arsenic, or antimony may be used instead of nickel and effects similar to those described above can be obtained. One or several of the elements selected from the above bring about acceleration of the crystallization with a minute amount (of about $10^{18}$ cm$^{-3}$). Therefore, no disadvantages for the semiconductor devices are brought by the introduction.

In the above description, the heat treatment is performed using an excimer laser, which is a pulsed laser, for improving crystallinity of the crystalline silicon film. Alternatively, the same process can be accomplished by using other lasers (for example, a continuous wave Ar laser). Furthermore, instead of using laser light, other techniques such as RTA (rapid thermal annealing) or RTP (rapid thermal processing) may be employed in which a workpiece is heated to high temperatures of 1000° to 1200° C. (silicon monitor temperatures) in a very short period of time using an infrared or flash lamp that provides strong light equivalent in intensity to lasers.

The above examples of the invention have been described assuming application of the invention to an active-matrix substrate for a liquid-crystal display. However, it will be appreciated that the semiconductor device described therein can be used in other applications as well, such as a close-contact type image sensor, a driver-monolithic thermal head, a driver-monolithic optical write device or display device using organic electroluminescent (EL) elements as light-emitting elements, and a three-dimensional IC. By utilizing the present invention for these applications, high-performance characteristics of the semiconductor devices such as a fast response, a high resolution, etc., can be achieved.

Furthermore, the invention can be applied to semiconductor processes in general, not only for MOS transistors described in the foregoing examples but also for other semiconductor devices including bipolar transistors and electrostatic induction transistors that use crystalline semiconductors.

According to the present invention, in the semiconductor device and the method for fabricating the same using the crystalline silicon film obtained by the crystal growth in parallel to the substrate, a semiconductor device constructed from high-quality TFTs having uniform and stable characteristics can be formed on a large substrate in a simple fabrication process. In particular, when the method of the present invention is applied to the fabrication of a liquid-crystal display device, uniformity in the characteristics of pixel switching TFTs required for an active-matrix substrate can be achieved, as well as the high performance characteristics required for TFTs constituting peripheral driver circuitry. As a result, a driver monolithic active-matrix substrate can be realized in which active matrix circuitry and peripheral driver circuitry are formed on the same substrate, leading to reduced module size, increased performance, and reduced cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:
   a substrate;
   an amorphous silicon film provided on the substrate;
   a slit-like introduction region formed in the amorphous silicon, the slit-like introduction region having therein a catalyst element for accelerating crystallization of at least a portion of the amorphous silicon film;
   the at least a portion of the amorphous silicon film to be crystallized including a thin film transistor region;
   the thin film transistor region not overlapping the slit-like introduction region, and
   at least one of a length in a longer side direction and a width in a shorter side direction of the slit-like introduction region is set larger than a value at which a crystal growth range of the crystalline silicon film saturates.

2. A semiconductor device according to claim 1, wherein a length in a longer side direction of the introduction region is set larger than a value at which a crystal growth range of the crystalline silicon film saturates.

3. A semiconductor device according to claim 1, wherein the length in the longer side direction of the introduction region is 120 μm or more.

4. A semiconductor device according to claim 1, wherein a width in a shorter side direction of the introduction region is set larger than a value at which a crystal growth range of the crystalline silicon film saturates.

5. A semiconductor device according to claim 1, wherein the width in the shorter side direction of the introduction region is 5 μm or more.

6. The apparatus of claim 1, wherein the thin film transistor region includes a channel region, and wherein the channel region is within 120 μm of the slit-like introduction region.

7. The apparatus of claim 6, wherein the channel region is within 60 μm of the slit-like introduction region.

8. The apparatus of claim 6, wherein the channel region is within 30 μm of the slit-like introduction region.

9. The apparatus of claim 6, wherein a width of a shorter side direction of the slit-like introduction region is 5 μm or more.

10. A semiconductor device comprising a thin film transistor formed using a crystalline region which is at least part of a silicon film formed on a substrate having an insulating surface,
    wherein the crystalline region is obtained by crystal growth of a selective introduction region into which a catalyst element is selectively introduced for accelerating crystallization of an amorphous silicon film, the selective introduction region being smaller than the crystalline region,
    the thin film transistor is positioned so as not to overlap the selective introduction region, and
    at least one of a length in a longer side direction and a width in a shorter side direction of the introduction region is set larger than a value at which a crystal growth range of the crystalline silicon film saturates.

11. A semiconductor device according to claim 10, wherein the thin film transistor is further positioned inside a crystal growth end of the crystalline region.

12. A semiconductor device according to claim 10, wherein the thin film transistor is positioned in such a manner that a conduction direction of the thin film transistor is substantially parallel to a crystal growth direction of the amorphous silicon film.

13. A semiconductor device according to claim 10, wherein the thin film transistor is positioned in such a manner that a conduction direction of the thin film transistor is substantially perpendicular to a crystal growth direction of the amorphous silicon film.

14. A semiconductor device according to claim 10, wherein the catalyst element is at least one element selected from a group consisting of Ni, Co, Pd, Pt, Cu, Ag, Au, In, Sn, Al, P, As and Sb.

15. A semiconductor device according to claim 10, wherein a dose of the catalyst element is in a range from $1\times10^{18}$ to $1\times10^{20}$ atoms/cm$^3$.

16. A semiconductor device according to claim 10, wherein a length in a longer side direction of the introduction region is set larger than a value at which a crystal growth range of the crystalline silicon film saturates.

17. A semiconductor device according to claim 10, wherein the length in the longer side direction of the introduction region is 120 µm or more.

18. A semiconductor device according to claim 10, wherein a width in a shorter side direction of the introduction region is set larger than a value at which a crystal growth range of the crystalline silicon film saturates.

19. A semiconductor device according to claim 10, wherein the width in the shorter side direction of the introduction region is 5 µm or more.

20. A semiconductor device according to claim 10, wherein a plurality of the thin film transistors are formed using the crystalline region.

21. A semiconductor device comprising a channel region, the device being formed on a substrate having an insulating surface using a silicon film having crystallinity, wherein the channel region is formed using a crystalline silicon film which is obtained by selectively introducing a catalyst element for accelerating crystallization of an amorphous silicon film into a predetermined slit-like introduction region thereof, heat-treating the amorphous silicon film at a predetermined annealing temperature to cause crystal growth of the amorphous silicon film in surrounding portions of the introduction region in parallel to the surface of the substrate, and a length in a longer side direction of the introduction region is set larger than a value at which a crystal growth range of the crystalline silicon film saturates.

22. A semiconductor device according to claim 21, wherein the length in the longer side direction of the introduction region is 120 µm or more.

23. A semiconductor device comprising a channel region, the device being formed on a substrate having an insulating surface using a silicon film having crystallinity, wherein the channel region is formed using a crystalline silicon film which is obtained by selectively introducing a catalyst element for accelerating crystallization of an amorphous silicon film into a predetermined slit-like introduction region thereof, heat-treating the amorphous silicon film at a predetermined annealing temperature to cause crystal growth of the amorphous silicon film in surrounding portions of the introduction region in parallel to the surface of the substrate, and a width in a shorter side direction of the introduction region is set larger than a value at which a crystal growth range of the crystalline silicon film saturates.

24. A semiconductor device according to claim 23, wherein the width in the shorter side direction of the introduction region is 5 µm or more.

25. A semiconductor device comprising an active region formed using a crystalline silicon film, wherein the active region is formed using a lateral crystal growth region of the crystalline silicon film which is obtained by a heat treatment of an island-shaped amorphous silicon film in which a catalyst element for accelerating crystallization is selectively introduced into a predetermined region, the predetermined region being removed, the concentration of the catalyst element in the active region being in a range from $1\times10^{14}$ to $1\times10^{18}$ atoms/cm$^3$, and at least one of a length in a longer side direction and a width in a shorter side direction of the predetermined region is set larger than a value at which a crystal growth range of the crystalline silicon film saturates.

26. A semiconductor device according to claim 25, wherein the catalyst element is at least one element selected from a group consisting of Ni, Co, Pd, Pt, Cu, Ag, Au, In, Sn, Al, P, As and Sb.

27. A semiconductor device according to claim 25, wherein a plurality of the active regions are formed in the lateral crystal growth region of the crystalline silicon film so as to form a plurality of thin film transistors.

28. A semiconductor device according to claim 25, wherein a length in a longer side direction of the introduction region is set larger than a value at which a crystal growth range of the crystalline silicon film saturates.

29. A semiconductor device according to claim 25, wherein the length in the longer side direction of the introduction region is 120 µm or more.

30. A semiconductor device according to claim 25, wherein a width in a shorter side direction of the introduction region is set larger than a value at which a crystal growth range of the crystalline silicon film saturates.

31. A semiconductor device according to claim 25, wherein the width in the shorter side direction of the introduction region is 5 µm or more.

32. A semiconductor device comprising a channel region, the device being formed on a substrate having an insulating surface using a silicon film having crystallinity, wherein the channel region is formed using a crystalline silicon film which is obtained by selectively introducing a catalyst element for accelerating crystallization of an amorphous silicon film into a predetermined slit-like introduction region thereof, heat-treating the amorphous silicon film at a predetermined annealing temperature to cause crystal growth in surrounding portions of the introduction region in parallel to the surface of the substrate, wherein the channel region is arranged within an area in which the crystal growth from the introduction region proceeds at the predetermined annealing temperature, wherein the channel region is arranged at a position within 120 µm from the introduction region, and wherein at least one of a length in a longer side direction and a width in a shorter side direction of the introduction region is set larger than a value at which a crystal growth range of the crystalline silicon film saturates.

33. A semiconductor device according to claim 32, wherein the crystalline silicon film which forms the channel region is exposed to laser or other light having a high intensity after the crystal growth.

34. A semiconductor device according to claim 32, wherein the catalyst element is at least one element selected from a group consisting of Ni, Co, Pd, Pt, Cu, Ag, Au, In, Sn, Al, P, As and Sb.

35. A semiconductor device according to claim 32, wherein a plurality of the channel regions are formed using the crystalline silicon film so as to form a plurality of thin film transistors.

36. A semiconductor device according to claim 32, wherein the channel region is arranged within an area in which the crystalline silicon film has a one-directional crystal growth direction and a number of branches and bends per column-like or needle-like crystal of the crystalline film from the one-dimensional crystal growth direction is 2 or less.

37. A semiconductor device according to claim 36, wherein the channel region is arranged within an area in which a number of branches and bends per column-like or needle-like crystal of the crystalline film from the one-dimensional crystal growth direction is 1 or less.

38. A semiconductor device according to claim 32, wherein a distance between the channel region and a side of the introduction region in a direction of a longer side of the introduction region is within an area in which the crystallization from the introduction region proceeds at the predetermined annealing temperature.

39. A semiconductor device according to claim 38, wherein the distance between the channel region and the side of the introduction region in the direction of the longer side of the introduction region is 30 $\mu$m or more.

40. A semiconductor device according to claim 32, wherein a length in a longer side direction of the introduction region is set larger than a value at which a crystal growth range of the crystalline silicon film saturates.

41. A semiconductor device according to claim 40, wherein the length in the longer side direction of the introduction region is 120 $\mu$m or more.

42. A semiconductor device according to claim 32, wherein a width in a shorter side direction of the introduction region is set larger than a value at which a crystal growth range of the crystalline silicon film saturates.

43. A semiconductor device according to claim 42, wherein the width in the shorter side direction of the introduction region is 5 $\mu$m or more.

44. A semiconductor device according to claim 32, comprising a plurality of channel regions, whereby forming a plurality of thin film transistors.

45. A semiconductor device according to claim 44, wherein the plurality of thin film transistors are arranged on both sides of the introduction region.

46. A semiconductor device comprising a channel region, the device being formed on a substrate having an insulating surface using a silicon film having crystallinity, wherein the channel region is formed using a crystalline silicon film which is obtained by selectively introducing a catalyst element for accelerating crystallization of an amorphous silicon film into a predetermined slit-like introduction region thereof, heat-treating the amorphous silicon film at a predetermined annealing temperature to cause crystal growth in surrounding portions of the introduction region in parallel to the surface of the substrate, and the channel region is arranged within an area in which the crystal growth from the introduction region proceeds at the predetermined annealing temperature, wherein the channel region is arranged within an area in which the crystalline silicon film has a one-directional crystal growth direction and a number of branches and bends per column-like or needle-like crystal of the crystalline film from the one-dimensional crystal growth direction is 2 or less, and the channel region is arranged at a position within 60 $\mu$m from the introduction region.

47. A semiconductor device according to claim 46, wherein a plurality of the channel regions are formed using the crystalline silicon film so as to form a plurality of thin film transistors.

48. A semiconductor device according to claim 46, wherein at least one of a length in a longer side direction and a width in a shorter side direction of the introduction region is set larger than a value at which a crystal growth range of the crystalline silicon film saturates.

49. A semiconductor device according to claim 46, wherein a length in a longer side direction of the introduction region is set larger than a value at which a crystal growth range of the crystalline silicon film saturates.

50. A semiconductor device according to claim 46, wherein the length in the longer side direction of the introduction region is 120 $\mu$m or more.

51. A semiconductor device according to claim 46, wherein a width in a shorter side direction of the introduction region is set larger than a value at which a crystal growth range of the crystalline silicon film saturates.

52. A semiconductor device according to claim 46, wherein the width in the shorter side direction of the introduction region is 5 $\mu$m or more.

53. A semiconductor device comprising a channel region, the device being formed on a substrate having an insulating surface using a silicon film having crystallinity, wherein the channel region is formed using a crystalline silicon film which is obtained by selectively introducing a catalyst element for accelerating crystallization of an amorphous silicon film into a predetermined slit-like introduction region thereof, heat-treating the amorphous silicon film at a predetermined annealing temperature to cause crystal growth in surrounding portions of the introduction region in parallel to the surface of the substrate, and the channel region is arranged within an area in which the crystal growth from the introduction region proceeds at the predetermined annealing temperature, wherein the channel region is arranged within an area in which the crystalline silicon film has a one-directional crystal growth direction and a number of branches and bends per column-like or needle-like crystal of the crystalline film from the one-dimensional crystal growth direction is 2 or less, and the channel region is arranged at a position within 30 $\mu$m from the introduction region.

54. A semiconductor device according to claim 53, wherein a plurality of the channel regions are formed using the crystalline silicon film so as to form a plurality of transistors.

55. A semiconductor device according to claim 53, wherein at least one of a length in a longer side direction and a width in a shorter side direction of the introduction region is set larger than a value at which a crystal growth range of the crystalline silicon film saturates.

56. A semiconductor device according to claim 53, wherein a length in a longer side direction of the introduction region is set larger than a value at which a crystal growth range of the crystalline silicon film saturates.

57. A semiconductor device according to claim 53, wherein the length in the longer side direction of the introduction region is 120 $\mu$m or more.

58. A semiconductor device according to claim 53, wherein a width in a shorter side direction of the introduction region is set larger than a value at which a crystal growth range of the crystalline silicon film saturates.

59. A semiconductor device according to claim 53, wherein the width in the shorter side direction of the introduction region is 5 $\mu$m or more.

* * * * *